(12) United States Patent
Arye et al.

(10) Patent No.: US 10,936,562 B2
(45) Date of Patent: Mar. 2, 2021

(54) TYPE-SPECIFIC COMPRESSION IN DATABASE SYSTEMS

(71) Applicant: Timescale, Inc., New York, NY (US)

(72) Inventors: Matvey Arye, New York, NY (US); Gayathri Priyalakshmi Ayyappan, Pittsburgh, PA (US); Michael J. Freedman, Princeton, NJ (US); Sven Klemm, Dresden (DE); David Kohn, New York, NY (US); Joshua Lockerman, New York, NY (US)

(73) Assignee: Timescale, Inc., New York, NY (US)

( * ) Notice: Subject to any disclaimer, the term of this patent is extended or adjusted under 35 U.S.C. 154(b) by 0 days.

(21) Appl. No.: 16/945,726

(22) Filed: Jul. 31, 2020

(65) Prior Publication Data
US 2021/0034587 A1     Feb. 4, 2021

Related U.S. Application Data

(60) Provisional application No. 62/928,298, filed on Oct. 30, 2019, provisional application No. 62/882,355, filed on Aug. 2, 2019.

(51) Int. Cl.
*G06F 16/215* (2019.01)
*G06F 16/22* (2019.01)
(Continued)

(52) U.S. Cl.
CPC .......... *G06F 16/215* (2019.01); *G06F 16/113* (2019.01); *G06F 16/2282* (2019.01); *G06F 16/2379* (2019.01)

(58) Field of Classification Search
CPC .............. G06F 16/215; G06F 16/2379; G06F 16/2282; G06F 16/113
See application file for complete search history.

(56) References Cited

U.S. PATENT DOCUMENTS

| | | | |
|---|---|---|---|
| 7,420,992 B1 * | 9/2008 | Fang ................... | H04L 12/4633 370/477 |
| 8,264,958 B1 * | 9/2012 | Pankajakshan ..... | H04W 72/048 370/230.1 |

(Continued)

OTHER PUBLICATIONS

Anwar, Z., "Exadata Hybrid Columnar Compression (HCC) What's it all About?," UKOUG Techfest19, Dec. 4, 2019, pp. 1-23.
(Continued)

*Primary Examiner* — James Trujillo
*Assistant Examiner* — Michal Bogacki
(74) *Attorney, Agent, or Firm* — Fenwick & West LLP

(57) ABSTRACT

A database system stores both compressed and uncompressed data in a row-based database system. The database system converts a representation of data involving a set of rows of a source database table, each row comprising multiple values, into a representation involving a single row stored in a target database table, each column of the row comprising arrays of values from the set. The database system may perform type-specific compression of data when storing in the target database table. Accordingly, the database system may apply different compression schemes for different columns or sets of values obtained from the source database table and may group or order selected rows or store additional summary information to improve query performance to the target database table. The database system allows users to query data stored in compressed form. The database system combines compressed and uncompressed data at query time for efficient database analytics.

30 Claims, 18 Drawing Sheets

(51) Int. Cl.
G06F 16/23 (2019.01)
G06F 16/11 (2019.01)

(56) References Cited

U.S. PATENT DOCUMENTS

| | | | |
|---|---|---|---|
| 8,341,287 B2* | 12/2012 | Khemani | H04L 41/50 |
| | | | 709/232 |
| 8,898,118 B2* | 11/2014 | Sainath | G06F 16/1744 |
| | | | 707/687 |
| 8,949,488 B2* | 2/2015 | Swift | G06F 16/27 |
| | | | 710/33 |
| 9,113,173 B2* | 8/2015 | Yuki | H04N 19/154 |
| 9,740,762 B2 | 8/2017 | Horowitz et al. | |
| 9,886,483 B1 | 2/2018 | Harrison et al. | |
| 9,952,771 B1* | 4/2018 | Bigman | G06F 3/0608 |
| 10,121,169 B2 | 11/2018 | Liu et al. | |
| 10,216,746 B1* | 2/2019 | Tummala | G06F 16/128 |
| 2007/0198591 A1 | 8/2007 | Teng et al. | |
| 2008/0091691 A1 | 4/2008 | Tsuji | |
| 2008/0162409 A1 | 7/2008 | Meijer et al. | |
| 2008/0195577 A1 | 8/2008 | Fan et al. | |
| 2010/0274795 A1 | 10/2010 | Rallapalli et al. | |
| 2010/0318587 A1 | 12/2010 | Seet et al. | |
| 2012/0173515 A1 | 7/2012 | Jeong et al. | |
| 2012/0254174 A1 | 10/2012 | Mitra et al. | |
| 2012/0254175 A1 | 10/2012 | Horowitz et al. | |
| 2013/0080393 A1 | 3/2013 | Bird et al. | |
| 2013/0103657 A1 | 4/2013 | Ikawa et al. | |
| 2013/0151502 A1 | 6/2013 | Yoon et al. | |
| 2014/0172866 A1 | 6/2014 | Lin et al. | |
| 2015/0134796 A1 | 5/2015 | Theimer et al. | |
| 2015/0149413 A1 | 5/2015 | Lee et al. | |
| 2015/0286668 A1* | 10/2015 | Legler | G06F 16/2379 |
| | | | 707/736 |
| 2015/0347555 A1 | 12/2015 | Vyas et al. | |
| 2016/0085839 A1 | 3/2016 | D'Halluin et al. | |
| 2016/0173535 A1* | 6/2016 | Barabash | H04L 41/0893 |
| | | | 726/1 |
| 2016/0179858 A1* | 6/2016 | Finlay | G06F 16/24561 |
| | | | 707/693 |
| 2016/0350392 A1 | 12/2016 | Rice et al. | |
| 2017/0046412 A1 | 2/2017 | Levy et al. | |
| 2017/0177646 A1 | 6/2017 | Chen et al. | |
| 2017/0322996 A1 | 11/2017 | Horowitz et al. | |
| 2017/0344441 A1 | 11/2017 | Horowitz et al. | |
| 2017/0371910 A1 | 12/2017 | Joo et al. | |
| 2018/0246934 A1* | 8/2018 | Arye | G06F 16/27 |
| 2019/0012574 A1 | 1/2019 | Anthony et al. | |
| 2019/0121902 A1 | 4/2019 | Ryan et al. | |
| 2019/0179832 A1 | 6/2019 | Nam et al. | |
| 2019/0220533 A1 | 7/2019 | Guisado | |
| 2019/0339911 A1* | 11/2019 | Bassov | G06F 3/065 |
| 2020/0097571 A1* | 3/2020 | Mathur | G06F 16/221 |

OTHER PUBLICATIONS

PCT International Search Report and Written Opinion, PCT Application No. PCT/US2018/019990, Jun. 11, 2018, 28 pages.
PCT Invitation to Pay Additional Fees, PCT Application No. PCT/US2018/019990, Apr. 3, 2018, 2 pages.
United States First Action Interview Pre Interview Communication, U.S. Appl. No. 16/945,720, dated Oct. 2, 2020, four pages.
United States Office Action, U.S. Appl. No. 16/945,710, dated Oct. 6, 2020, 21 pages.

* cited by examiner

| time | device_id | location | temperature | error_code |
| --- | --- | --- | --- | --- |
| 2019-01-01 00:00:00.00-05 | DbAq75B | 14 | 72 | NULL |
| 2019-01-01 00:00:00.00-05 | AB7d89bz | 12 | 68 | NULL |
| 2019-01-01 00:01:00.00-05 | DbAq75B | 14 | 72 | NULL |
| 2019-01-01 00:01:00.00-05 | AB7d89bz | 12 | 68 | 01 |
| 2019-01-01 00:02:00.00-05 | AB7d89bz | 13 | 67 | NULL |
| 2019-01-01 00:02:00.00-05 | DbAq75B | 14 | 73 | 00 |
| 2019-01-01 00:03:00.00-05 | AB7d89bz | 13 | 67 | NULL |
| 2019-01-01 00:03:00.00-05 | DbAq75B | 14 | 74 | 01 |

FIG. 14A

| times | device_ids | locations | temperatures | error_codes |
|---|---|---|---|---|
| compressed([<br>2019-01-01 00:00:00.00-05,<br>2019-01-01 00:00:00.00-05,<br>2019-01-01 00:01:00.00-05,<br>2019-01-01 00:01:00.00-05<br>]) | compressed([<br>DbAq75B,<br>AB7d89bz,<br>DbAq75B,<br>AB7d89bz<br>]) | compressed([<br>14,<br>12,<br>14,<br>12<br>]) | compressed([<br>72,<br>68,<br>72,<br>68<br>]) | compressed(<br>[<br>NULL,<br>NULL,<br>01,<br>NULL<br>]) |
| compressed([<br>2019-01-01 00:02:00.00-05,<br>2019-01-01 00:02:00.00-05,<br>2019-01-01 00:03:00.00-05,<br>2019-01-01 00:03:00.00-05<br>]) | compressed([<br>AB7d89bz,<br>DbAq75B,<br>AB7d89bz,<br>DbAq75B<br>]) | compressed([<br>13,<br>14,<br>13,<br>14<br>]) | compressed([<br>67,<br>73,<br>67,<br>74<br>]) | compressed([<br>NULL,<br>00,<br>NULL,<br>01<br>]) |

FIG. 14B

| device_id | times | locations | temperatures | error_codes |
|---|---|---|---|---|
| AB7d89bz | compressed([<br>2019-01-01 00:00:00.00-05,<br>2019-01-01 00:01:00.00-05,<br>2019-01-01 00:02:00.00-05,<br>2019-01-01 00:03:00.00-05<br>]) | compressed([<br>12,<br>12,<br>13,<br>13<br>]) | compressed([<br>68,<br>68,<br>67,<br>67<br>]) | compressed([<br>NULL,<br>NULL,<br>01,<br>NULL,<br>NULL<br>]) |
| DbAq75B | compressed([<br>2019-01-01 00:00:00.00-05,<br>2019-01-01 00:01:00.00-05,<br>2019-01-01 00:02:00.00-05,<br>2019-01-01 00:03:00.00-05<br>]) | compressed([<br>14,<br>14,<br>14,<br>14<br>]) | compressed([<br>72,<br>72,<br>73,<br>74<br>]) | compressed([<br>NULL,<br>NULL,<br>00,<br>01<br>]) |

FIG. 14C

| min time | max time | min temperature | max temperature | mean temperature | histogram temperatures | bloom filter locations | distinct error codes | device ids | times | locations | temperatures | error_codes |
|---|---|---|---|---|---|---|---|---|---|---|---|---|
| 2019-01-01 00:00:00.00 -05 | 2019-01-01 00:03:00.00 -05 | 67 | 68 | 67.5 | {67, 67, 68, 68} | {...} | {01} | AB7d89bz | compressed([ 2019-01-01 00:00:00.00-05, 2019-01-01 00:01:00.00-05, 2019-01-01 00:02:00.00-05, 2019-01-01 00:03:00.00-05 ]) | compressed([ 12, 12, 13, 13 ]) | compressed([ 68, 68, 67, 67 ]) | compressed([ NULL, 01, NULL, NULL ]) |
| 2019-01-01 00:00:00.00 -05 | 2019-01-01 00:03:00.00 -05 | 72 | 74 | 72.75 | {72, 73, 73, 74} | {...} | {00, 01} | DbAq75B | compressed([ 2019-01-01 00:00:00.00-05, 2019-01-01 00:01:00.00-05, 2019-01-01 00:02:00.00-05, 2019-01-01 00:03:00.00-05 ]) | compressed([ 14, 14, 14, 14 ]) | compressed([ 72, 72, 73, 74 ]) | compressed([ NULL, NULL, 00, 01 ]) |

FIG. 14D

TYPE-SPECIFIC COMPRESSION IN DATABASE SYSTEMS

CROSS-REFERENCE TO RELATED APPLICATION

This application claims the benefit of U.S. Provisional Application No. 62/882,355, filed on Aug. 2, 2019 and U.S. Provisional Application No. 62/928,298, filed on Oct. 30, 2019, each of which is incorporated by reference in its entirety.

BACKGROUND

This disclosure relates generally to efficiently storing, processing, and maintaining compressed data in a row-based database system, and in particular to storing, processing, and maintaining such compression on time series data in a partitioned database system.

Time-series data is generated and processed in several contexts: monitoring and developer operations (DevOps), sensor data and the Internet of Things (IoT), computer and hardware monitoring, fitness and health monitoring, environmental and fanning data, manufacturing and industrial control system data, application usage data, and so on. Often this data is high in volume, for example, individual data sources may generate high rates of data, or many different sources may contribute data. Furthermore, this data is complex in nature, for example, a source may provide multiple measurements and labels associated with a single time. The volume of this stored data often increases over time as data is continually collected. Analytical systems typically query this data to analyze the past, present, and future behavior of entities associated with the data. This analysis may be performed for varied reasons, including examining historical trends, monitoring current performance, identifying the root cause of current problems, and anticipating future problems such as for predictive maintenance. As a result, operators are not inclined to delete this potentially valuable data.

Conventional systems fail to support the high write rates that are typical of many of these applications, which span across industries. For example, in Internet of Things (IoT) settings including industrial, agricultural, consumer, urban, or facilities, high write rates result from large numbers of devices coupled with modest to high write rates per device. In logistics settings, both planning data and actuals comprise time series that can be associated with each tracked object. Monitoring applications, such as in development and operations, may track many metrics per system component. All these applications require a database that can scale to a high ingest rate.

Further, these applications often query their data in complex and arbitrary ways. Such query patterns may involve fetching or aggregating a single or few metrics across a particular time periods, or involve employing predicates (e.g., complex conjunctions in a WHERE clause), aggregations, statistical functions, windowed operations, JOINs against relational data, subqueries, common table expressions (CTEs), and so forth. Yet these queries need to be executed efficiently.

Therefore, storing time-series data demands both scale and efficient queries. As the volume of data stored in these time-series database systems, or database systems in general, increases, the data consumes ever greater amounts of disk and memory storage. Various techniques have been developed for increasing the storage capacity of the database system, including using larger individual disks, multiple disks on a single physical server, remote storage arrays and storage systems that are connected to the database system over the network, and multiple physical servers (each with various storage and disk configurations) that working together comprise the database system. Many of these techniques may increase the scale of the storage, however the total cost of such storage or servers can still grow quite expensive.

One alternative technique to reducing the cost of storage is to compress the stored data, so that the database system requires less storage capacity to store the same amount of data. Various prior approaches have existed to compress storage, including performing such compression at the filesystem level by compressing individual pages in the file system (such as in the ZFS file system).

Other database systems, such as column stores, compress data natively in the database system. As rows of data (also referred to as records) get written into such column-store databases, rather than storing all the data belonging to each row contiguously to each other, such column-store databases separate the individual fields of a row and then store each field contiguously with fields from other rows that belong to the same column. That is, if each row contains a set of values, for example, "timestamp", "device_id", "metric1", "metric2", "metric3", then a row-store will store the data row-by-row (where each row contains all five fields), while a column store will store the data such that all metric1's are contiguous, all metric2's are contiguous, and all metric3's are contiguous. Therefore, if a user subsequently queries just for metric3, such column-store database systems will need to fetch less data from disk, as it may read disk pages that have only metric3 values (rather than all metrics interleaved). Such column stores can also compress these contiguous sets of like metrics. And because fields in a given column are typically of like types (e.g., metric1 may be a 4-byte integer, metric2 may be an 8-byte integer, and metric3 may be a float value) and may be drawn from a small or regular domain (e.g., if metric1 is a temperature reading, it typically varies over a small range of values), they typically can compress when using either standard or specialized compression techniques. Such column stores can therefore achieve good compression rates compared to traditional row-based database or storage systems.

On the other hand, insert rates in such column stores can be slower (due to the additional overhead of splitting up a row during insertion), and their performance can also suffer on queries that typically fetch or involve all the columns of a smaller number of rows. This is especially problematic in scenarios where the user regularly fetches many of the rows of the most recent data, while less frequently doing large scans of individual columns. Such workloads often exist in time-series database systems, which often experience high ingest rate to recent timestamps or time intervals, frequent requests for recent data, and occasional scans over large amounts of data or long periods of time. Time-series data can be particularly challenging to such column stores, where columns may be optimized to be scanned according to some ordering key like a device_id or uuid, yet writes are being made in time order.

SUMMARY

A database system implements a plurality of compression policies. The database system creates a table T1 that stores a set of records, each record storing values of a first plurality of attributes. The first plurality of attributes includes an attribute A1 and an attribute A2. The database system creates a table T2 associated with table T1. The table T2 stores a set of records, each record having values of a second plurality of attributes.

The database system performs iterations, each iteration comprising the following steps. The database system selects a set S1 of records from table T1. The database system selects a first set SV1 of values comprising the value of attribute A1 from each record of the set S1 of records. The database system selects a second set SV2 of values comprising the value of the attribute A2 from each record of the set S1 of records. The database system selects a compression policy P1 from the plurality of compression policies to apply to the set SV1 of values. The database system selects a compression policy P2 from the plurality of compression policies to apply to the set SV2 of values. The database system computes a first derived value V1 by compressing the set SV1 of values according to the compression policy P1, and computes a derived value V2 by compressing the set SV2 of values according to the compression policy P2. The database system computes a derived record having values of the second plurality of attributes, the values including the derived value V1 and the derived value V2. The database stores the derived record in the table T2 and removes the set S1 of records from table T1.

In an embodiment, the tables T1 and T2 are both child tables of a parent table in the database system. In an embodiment, the parent table is a hypertable and the tables T1 and T2 are both chunks of the hypertable. The first and second plurality of attributes include a time attribute, such that, for each record stored in a chunk of the hypertable, the value of the time attribute of the record maps to the set of values of that time attribute as specified by the chunk.

In an embodiment, tables T1 and T2 are hypertables in the database system. Each record in the hypertables has a plurality of attributes including a set of dimension attributes. The set of dimension attributes include a first time attribute. The hypertable is partitioned into a plurality of chunks along the set of dimension attributes. Each chunk is associated with a set of values corresponding to each dimension attribute. For each record stored in the chunk and for each dimension attribute of the record, the value of the dimension attribute of the record maps to the set of values for that dimension attribute as specified by the chunk.

The database system may execute multiple iterations concurrently or in parallel.

In an embodiment, both tables T1 and T2 are stored in row-based form in the database system.

In an embodiment, the compression policies specify a compression scheme to apply to the set of values. The plurality of compression policies correspond to a plurality of compression schemes.

According to various embodiments, the plurality of compression schemes comprises one or more of LZ, DEFLATE, LZW, PPM, Huffman, Sequitur, Burrows-Wheeler, gzip, bzip, Snappy, Simple-8b, Gorilla, FastPFOR, run-length encoding, delta run-length encoding, or delta of deltas encoding, or a combination of the aforementioned.

In an embodiment, the compression policies include the settings of a particular compression scheme to apply to the set of values.

In an embodiment, the database system selects the compression policies P1 and P2 from the plurality of compression policies at least partially based on factors comprising one or more of: (1) the set of values to be compressed, (2) the data type of the values of the set of values, (3) the attribute of the set of values, (4) the derived value computed from the set of values, (5) the data type of the derived value, or (6) the attribute of the derived value. The data type of the values of the set of values may be a timestamp, date, integer, float, double, bigint, numeric, string, text, binary, boolean, geo-spatial, xml, blob, json, or binary json data.

Embodiments of a computer readable storage medium store instructions for performing the steps of the above method. Embodiments of a computer system comprise one or more computer processors and a computer readable storage medium storing instructions for performing the steps of the above method.

The features and advantages described in this summary and the following detailed description are not all-inclusive. Many additional features and advantages will be apparent to one of ordinary skill in the art in view of the drawings, specification, and claims hereof.

BRIEF DESCRIPTION OF THE DRAWINGS

The teachings of the embodiments can be readily understood by considering the following detailed description in conjunction with the accompanying drawings.

FIG. 14A illustrates the layout of data in a table in the first representation, according to an embodiment.

FIG. 14B illustrates the layout of data in a table the second representation, according to an embodiment.

FIG. 14C illustrates the layout of data in a table using the second representation, where data is additionally grouped by an additional attribute such as device_id as shown in the figure, according to an embodiment.

FIG. 14D illustrates the layout of data in a table using the second representation, where the data store additionally stores metadata or statistical information that it associates with data stored in the second representation, according to an embodiment.

DETAILED DESCRIPTION

Figure 1:
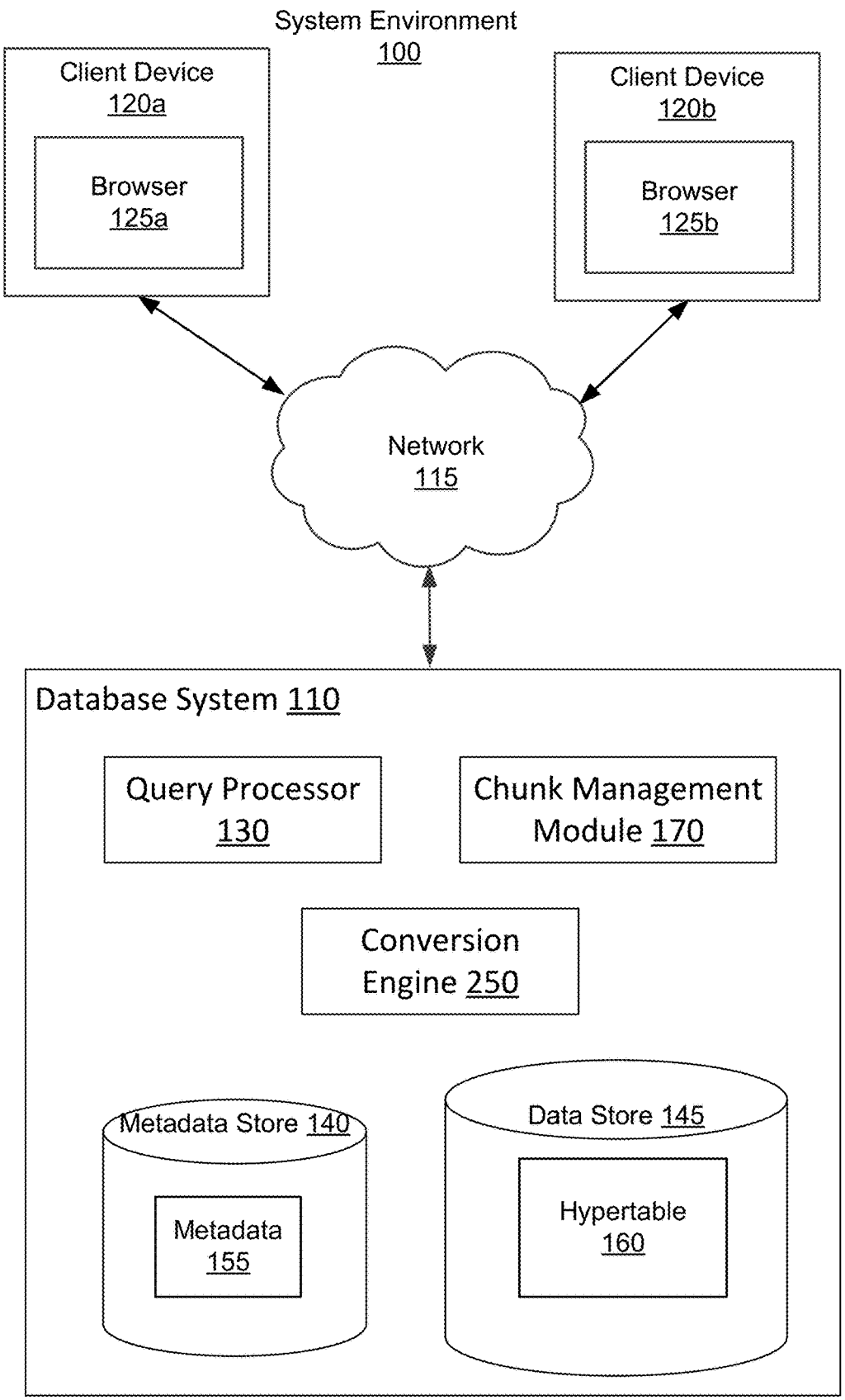
FIG. 1 is a block diagram of a system environment in which the database system operates, in accordance with an embodiment.

It is desirable for a database system that incorporates both row-based and column-style storage, so that some data is stored in standard row-based form, while other data has like fields of each row stored contiguously in order to take advantage of greater compressibility and access patterns when the database seeks to access many rows' values belonging to the same column. It is also desirable to be able to reuse the storage engine of a row-based database when storing such compressible columns, in order to avoid the complexity and difficulty of reimplementing a full column-based storage or database system to enable this use case. Conventional methods fail to support a database system that supports columnar-style compressibility and access in a more traditional row-based database system.

Embodiments of the invention include a database system that supports a standard query language like SQL and exposes an interface based on a database table or table view. In some embodiments, this table is a hypertable that partitions the underlying data across servers and/or storage devices, while the database system allows users to interact with data as if it were stored in a conventional database table, hiding the complexity of any data partitioning and query optimization from the user. Embodiments of the database system make a query language like SQL scalable for time-series data. The database system combines the best features of both RDBMS and NoSQL databases: a clustered scale-up and scale-out architecture and rich support for complex queries. Scaling up corresponds to running on larger individual servers, for example, machines with high numbers of CPUs or cores, or servers with greater RAM and disk capacity. Scaling up also includes increasing storage capacity of an existing database system by adding additional storage devices. Scaling out comprises increasing storage capacity of the database system by adding additional servers, for example, by sharding the dataset over multiple servers, as well as supporting parallel and/or concurrent requests across the multiple servers.

Time-series database systems based on partitioned tables for scaling to support high write rates and efficiently handle queries, including through the SQL query language, are described in U.S. Pat. No. 10,073,903 titled, "Scalable Database System for Querying Time-Series Data" and U.S. Pat. No. 10,073,888, titled, "Adjusting partitioning policies of a database system in view of storage reconfiguration", each of which is fully incorporated by reference herein. Time-series database systems that automatically maintain views on top of this data through continuous aggregations, in order to execute queries on this data much more efficiently, are described in U.S. Provisional Patent Application, Ser. No. 62/836,397, filed on Apr. 19, 2019, titled, "Maintaining Up-to-date Materialized Views for Time-Series Database Analytics", which is fully incorporated by reference herein.

According to various embodiments, a computer-implemented method, computer system, and computer readable storage medium creates and maintains compressed data in a row-based database system, where compressed data is typically maintained in mini-sets stored in columnar form, particularly in order to utilize less storage capacity when storing large data sets and to enable faster analytics over such data sets.

Embodiments of the method comprise converting a first representation of data involving a set of rows of a database table, whereby each row from this first set comprises multiple values (which we also refer to as attributes, fields, or columns), into a second representation of data involving a single row. The values of this single row in the second representation include the compressed sets of values from this first set of rows. For example, if the set from the first representation includes 100 individual rows, each row containing three attributes metric1, metric2, and metric3 as in the example above, then this single row from the second representation includes a compressed array of 100 metric1 values, a compressed array of 100 metric2 values, and a compressed array of 100 metric3 values. Each of these compressed arrays may also include fewer than 100 metrics, e.g., if some of the values were missing or NULL. This single row may also include additional values that are present in some or all of the first set of rows, or additional values that describe or represent information about the values (including those in the compressed arrays) stored in the row. This example of compressing three columns is just meant to be an example, as the database system may have a single column or thousands of columns in the first representation that are stored in array form in the second representation of data. (One of ordinary skill would understand that the second representation is not limited to arrays, but could also uses lists or any type of ordered collection.) In some embodiments, the database system stores only a subset of its columns from the first representation in the single row in the second representation. In some embodiments, the data is transformed when converted from the first to second representation, such as changing data types, changing granularity or degrees of precision, using downsampling, using approximation algorithms or structures, and so forth. In some embodiments, this single row in the second representation is stored in the same database table as the set of rows in the first representation, while in other embodiments this single row is stored in a second database table. In other embodiments, either this first database table, this second database table, or both, are stored as a partitioned database table, including as those described in U.S. Pat. Nos. 10,073,903 and 10,073,888.

In some embodiments, even though a set of rows from the first representation is converted to a single row in the second representation with arrays of values comprising the values of columns from the set, these arrays are not compressed. Such embodiments can still save some storage capacity, e.g., in many database systems, each individual table row adds some storage overhead given various metadata about it. Such embodiments also can still improve some query performance given that all the column values can be stored more contiguously or on a smaller number of disk pages.

In some embodiments, the array of values comprising a column in the second representation can be stored partially or fully out-of-line from other columns and not contiguously with the rows. This out-of-line storage is used for one, some, or all of the columns, particularly if they are large in size. In some database systems, such out-of-line storage helps ensure that such large objects are stored on their own disk or memory pages, which serves to reduce disk fetches for these objects to when they are actually requested as part of a query. One such example of out-of-line storage is TOAST storage in the PostgreSQL database system and Antelope and Barracuda storage in the InnoDB database storage engine for the MySQL database system.

Embodiments of the method will also involve identifying many such sets of rows, each of which are converted to a single row as described above. For example, if each set includes 1000 rows, then a database table of one million rows in the first representation can be converted to 1000 rows in the second representation. Some embodiments perform this conversion continuously, so that such sets are selected on an ongoing basis and converted to the second representation. This selection includes basing the decision on which sets of rows to convert based on their age or the timestamps that are included in the rows of data. In some embodiments, the database system maintains a task that continually performs this selection and conversion, such as either a synchronous task or an asynchronous background task. In some embodiments, data may be stored in both the first representation and second representation, while in others the data is stored in either one representation or the other.

The database engine enables users to query data stored in compressed form (i.e., in the second representation). To support such queries, the database engine determines which row or rows in the second representation match a query, identifies which columns are being requested, uncompresses those columns specified in the query, and returns this uncompressed data. (We use the terms uncompress and decompress, or uncompressed and decompressed, interchangeably.) In some embodiments, the database can also return the compressed data directly or queries thereon; in others, the database engine fetches or uncompresses additional columns than solely those specified by a query; in still other embodiments, the database engine returns some transformation of the compressed data.

As in many embodiments converting data between its compressed and uncompressed forms does not change the data's semantics, embodiments may choose to hide this transformation. In other words, other systems or users can query the data as if it is still stored in its original row format, regardless of whether the database is storing each column of many rows in a compressed array form or not. Embodiments may also choose to compress or decompress data based off usage patterns, load, cost, resource availability or capacity, compression ratios, or other statistics. For example, to facilitate accessing data that is stored in compressed form, embodiments of this method also build a view on this compressed data so it appears in the same form as the first representation. The term view here refers to any method for the user to interact with the data and query it without knowledge of its compressed state. Users may direct their queries to a database view, a function, or a table. Any of these options may allow queries to be written as if the user were querying the uncompressed data normally. In some embodiments, DML queries (e.g., that insert, update, or delete data) may be treated differently from read-only queries.

To enable querying data regardless of whether it is compressed, upon receiving a query, the database engine determines which rows in this second representation possibly match the query. Similarly, to enable such a view over this compressed data, upon receiving a query, the database engine determines which rows in this second representation possibly match the query to the view. It then identifies which compressed columns are being requested and uncompresses those columns specified in the query. But instead of returning all this uncompressed data, it determines which subset of the values stored in the array also match any conditions or predicates specified in the query. The database engine then synthesizes data in the format specified by the view, and returns the values in such a format as specified by the query. In some embodiments, the uncompressed data is maintained in addition to the compressed data (e.g., in memory) and then deleted at some later time after the query or queries are completed. In other embodiments, the data in uncompressed in place, and then recompressed at some later time.

In some embodiments, the second representation also stores metadata about the values inside the compressed arrays. This metadata can be used for various query optimizations. For example, at query time, the metadata can be used to exclude all the data in the entire compressed row based on the predicates specified in the query if the metadata indicates that no value matches the predicate, which would enable the query engine to avoid decompressing the data in order to determine there is no match.

As the database system stores data in both the first and second representations, there is related data that is stored in a different form, and a single query may correspond to data that is stored in both representations. For example, in a database system that is storing time-series data, in which each data record includes a timestamp, some of this data can be stored in the first representation (such as any records with timestamps that are newer than a certain threshold timestamp), while other portions of this data can be stored in the second representation (such as any records with timestamps that are older than the threshold). A query to the database may specify a timerange that includes timestamps from both before and after this threshold timestamp. In such a case, embodiments of the method include a query planner that requests data from both the first representation and the second representation, and returns a resulting set of records to the query that involve the union of results from the first representation and results from the second representation.

While many of the inventive methods described herein are described in terms of a single table for the first representation and a single table for the second representation, or a single table for both representations, one of ordinary skill will recognize that a single database can contain many tables and many views. Further, one of ordinary skill will recognize that a database can be organized in many ways, and the described methods herein can be employed in many such configurations, such as a single or multiple database components, a single or multiple processes running on a single physical machine, or multiple physical machines that coordinate together to provide the database system. Different tables or views may be located on different disks or storage media, different physical machines, or views or tables may themselves be spread over multiple physical disks or machines.

Further, the view or table described herein can itself be formed by a partitioned table, such that each partition of the view or table corresponds to a certain range or region of the view or table's data. Examples of such partitioned tables are described in the aforementioned U.S. Pat. Nos. 10,073,903 and 10,073,888, both fully incorporated by reference herein. Adopting such language from those patents, we interchangeably refer to such partitioned tables as hypertables. A hypertable is partitioned into a plurality of tables, also called chunks, based on the dimension attributes. A chunk is specified using a set of values for each dimension attribute. For each record stored in the chunk, the value of each dimension attribute maps to a value from the set of values for that dimension attribute. A determination is made whether an input record should be stored in a new chunk or an existing chunk. For each new chunk being created, sets of values corresponding to each dimension attribute are determined and the new chunk is created for storing the input record. The hypertable is updated by storing the input record in the new chunk. The data stored in the updated hypertable is processed in response to subsequent queries that identify the hypertable.

One of ordinary skill will also recognize while the invention described herein often refers to changes or queries to data, such changes can constitute any data manipulation language (DML) operations (including inserts, updates, upserts, deletes, or any other data modifications), while such queries can include any data query language (DQL) operations (including SELECT-type queries, query parsing, transformation/rewriting, optimization and execution, etc.). Finally, the database system also involves data definition language (DDL) operations, including creating or altering tables, creating or altering indexes, defining views and materializations, as well as other administrative tasks.

System Environment

FIG. 1 is a block diagram of a system environment in which the database system operates, in accordance with an embodiment. The system environment comprises a database system 110, one or more client devices 120, and a network 115.

Figure 2:
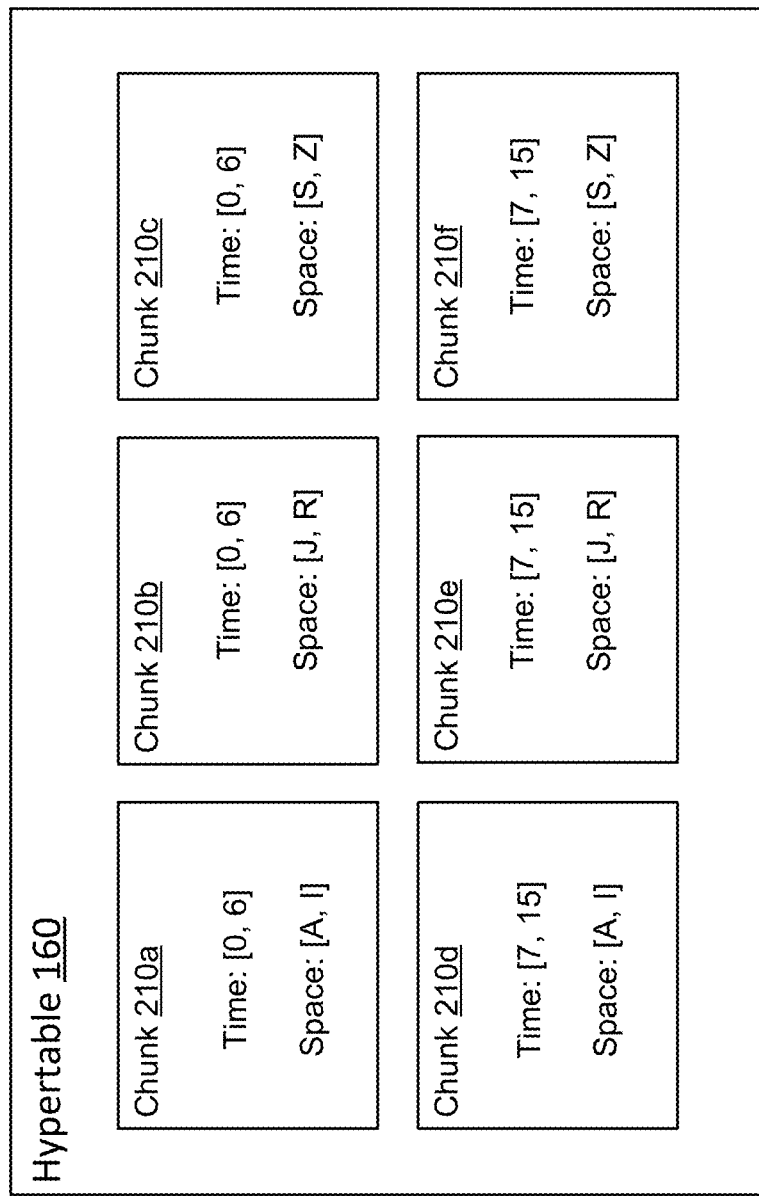
FIG. 2 illustrates partitioning of data of a database table, in accordance with an embodiment.

The database system 110 comprises a query processor 130, a conversion engine 250, a metadata store 140, and a data store 145. The database system 110 may include other components, for example, as illustrated in FIG. 2. The database system 110 receives database queries, for example, queries specified using SQL and processes them. The database system 110 may support standard SQL features as well as new user-defined functions, SQL extensions, or even non-SQL query languages such as declarative programming languages, a REST interface (e.g., through HTTP), or others.

The data store 145 stores data as tuples (also referred to as records) that may be stored as rows of data, with each row comprising a set of attributes. These attributes typically have a name associated with them (e.g., "time", "device_id", "location", "temperature", "error_code") and a type (e.g., string, integer, float, boolean, array, json, jsonb (binary json), blob, geo-spatial, etc.), although this is not necessary in all cases. Attributes may also be referred to herein using the terms "fields", "columns" or "keys".

The data store 145 may store records in a standard database table that stores data in one or more files using conventional techniques used by relational database systems. The data store 145 may also store data in a partitioned database table referred to as a hypertable. A hypertable is a partitioned database table that provides an interface of a single continuous table represented by a virtual view—such that a requestor can query it via a database query language such as SQL. This hypertable may also be known as a parent table, partitioned table, or the like. A hypertable may be defined with a standard schema with attributes (or fields or column) names and types, with at least a time attribute specifying a time value. The hypertable is partitioned along a set of dimension attributes including the time attributes and zero or more other dimension attributes (sometimes referred to as the hypertable's "space" attributes). These dimension attributes on which the hypertable is partitioned are also referred to as "partitioning key(s)", "partition key (s)", or "partitioning fields." A hypertable may be created using a standard SQL command for creating a database table. Furthermore, queries to the hypertable may be made using database queries, for example, SQL queries.

The database system splits the hypertable into chunks. Each chunk stores a subset of records of the hypertable. A chunk may also be referred to herein and elsewhere as a data chunk or a partition, a shard, a child table, or just a table. The database system 110 may distribute chunks of a hypertable across a set of one or more locations. A location may represent a storage medium for storing data or a system that comprises a storage medium for storing data, for example, a server. The storage medium may be a storage device, for example, a disk. The database system 110 may store data on multiple storage devices attached to the same server or on multiple servers, each server attached with one or more storage devices for storing chunks. A storage device may be attached to a remote server, for example, in a cloud-based system and a server of the database system provided access to the remote storage device for storing chunks.

The database system can store multiple tables or hypertables, each with different schemas. Chunks within the same hypertable often have the same schema, but may also have different schemas. The database system may also include standard database tables, i.e., traditional non-partitioned tables stored in the same database. Operations are performed against any of these tables, including multiple tables in a single query. For example, this can involve a SELECT that JOINS data between a hypertable and a standard non-partitioned table, or between two hypertables, or any more complex combination thereof. Or, it may involve inserting data into a hypertable and a standard non-partitioned table, or between two hypertables, or more complex combinations, as a single transaction.

In some embodiments, the database system 110 is comprised of one or more database system nodes (also referred to as database servers or just servers) that are connected over a network. Each node may include the same or similar components from FIG. 1, such as a query processor 130, metadata store 140, and data store 145. The details of a database system node are described in FIG. 2. The metadata store 140 stores metadata describing the data stored in the data store 145 including descriptions of various hypertables and standard non-partitioned tables. The description includes various attributes of each table, the description of various chunks of a hypertable, and so on. The query processor 130 receives and processes queries as further described herein.

The database system 110 may be connected to requesters issuing database queries to the database system 110. A requestor may be any source of the database queries, for example, a client device 120, a webserver, application server, user workstation, or a server or machine that is sending the query on behalf on another origin (e.g., an intermediate server or middleware layer acting as a queue, buffer, or router such as for INSERTS, or an application acting on behalf of another system or user).

This connection from the requester often occurs over the network 115, although it can also be on the same server executing the database system. For example, the network 115 enables communications between the client device 120 or any other requestor and the database system 110. In one embodiment, the network uses standard communications technologies and/or protocols. The data exchanged over the network can be represented using technologies and/or formats including the open database connectivity (ODBC) format, the Java database connectivity (JDBC) format, the PostgreSQL foreign data wrapper (FDW) format, the PostgreSQL dblink format, the external data representation (XDR) format, the Google Protocol Buffer (protobuf) format, the Apache Avro format, the hypertext markup language (HTML), the extensible markup language (XML), Javascript object notation (JSON), etc.

The client device 120 can be a personal computer (PC), a desktop computer, a laptop computer, a notebook, a tablet PC executing an operating system. In another embodiment, the client device 120 can be any device having computer functionality, such as a personal digital assistant (PDA), mobile telephone, smartphone, wearable device, etc. The client device can also be a server or workstation, including running in a backoffice environment, within an enterprise datacenter, or within a virtualized cloud datacenter. The client device executes a client application for interacting with the database system 110, for example, a browser 125, a database shell, a web service application (such as .NET, Djagno, Ruby-on-Rails, Hibernate), a message broker (such as Apache Kafka or RabbitMQ), a visualization application, and so forth.

FIG. 1 and the other figures use like reference numerals to identify like elements. A letter after a reference numeral, such as "120A," indicates that the text refers specifically to the element having that particular reference numeral. A reference numeral in the text without a following letter, such as "120," refers to any or all of the elements in the figures bearing that reference numeral (e.g. "120" in the text refers to reference numerals "120A" and/or "120N" in the figures).

FIG. 2 illustrates partitioning of data as chunks for a hypertable, in accordance with an embodiment. Each of these chunks correspond to a portion of the entire dataset organized according to some partitioning function involving one or more of a record's attributes. The attributes of the record that are used for partitioning the hypertable as chunks are referred to as dimension attributes. Accordingly, a chunk corresponds to an "n-dimensional" split of the hypertable (for n≥1).

The database system 110 may implement a chunk as a file. In one embodiment, each chunk is implemented using a standard database table that is automatically placed on one of the locations (e.g., storage devices) of one of the database nodes (or replicated between multiple locations or nodes), although this detail may not be observable to users. In other embodiments, the placement of chunks on locations and/or database nodes is specified by commands or policies given by database administrators or users.

One of the dimension attributes is a time attribute that stores time-related values. The time attribute can be any data that can be comparable (i.e., has a > and ≥ operator), such that data can be ordered according to this comparison function. Further, new records are typically associated with a higher time attribute, such that this value is commonly increasing for new records. Note that this value can be specified in the data record, and need not (and often does not) correspond to when data is inserted into the database. The following values may be used as a time attribute: datetime timestamps (including with or without timezone information), UNIX timestamps (in seconds, microseconds, nanoseconds, etc.), sequence numbers, and so on, or it may be sets or arrays of such values (e.g., an array of datetime timestamps, an array of UNIX timestamps, an array of sequence numbers). In an embodiment, the hypertable is also split along a dimension attribute that represents a distinct identifier for objects or entities described in the database table (e.g., a device id that identifies devices, a server id that identifies servers, the ticker symbol of a financial security, etc.).

A chunk is associated with a set of values corresponding to each dimension attribute. For example, a hypertable may have two dimension attributes d1 and d2. For a given chunk C1, the dimension attribute d1 is associated with a set of values S and the dimension attribute d2 is associated with a set of values S2. Accordingly, each record stored in the chunk C1 has a dimension attribute value that maps to a value in the set of values corresponding to the dimension attribute. For example, assume that a hypertable includes attributes time, device, and temperature. Also assume that time is a dimension attribute and a chunk is associated with a range of time [0:00:00-11:59:59.999]. If an input record has values {time: "1:00:00", device: "A", temperature: 65}, the chunk may store the input record since the value of the time dimension "1:00:00" falls within the range associated with the chunk, i.e., [0:00:00-11:59:59.999].

A set of values corresponding to a dimension attribute may represent a range of values but is not limited to ranges. For example, the set of values may represent a plurality of ranges that are not contiguous. Alternatively, the set of values may be specified by enumerating one or more values. For example, a dimension attribute c may represent colors (e.g., "red", "blue", "green", "yellow"), and a chunk may store records that have the value of dimension attribute c1 from the set {"red", "blue" } and another chunk may store records that have the value of dimension attribute c1 from the set {"green", "yellow" }.

A given value of a dimension attribute may map to a value in the set of values corresponding to that dimension if the given value is identical to a value in the set of values. Alternatively, a given value v1 of a dimension attribute may map to a value v2 in the set of values corresponding to that dimension if the value v2 is obtained by applying a transformation (for example, a function) to the given value v. For example, database system 110 may use a hash partitioning strategy where the set of values corresponding to a dimension is specified as a range/set of values obtained by applying a hash function to the dimension attribute values. Accordingly, if a dimension attribute value is represented as vx, and H represents a hash function, a chunk Cx may be associated with a range R=[x1, x2] (or set) of values for H(vx). Accordingly, the chunk may store a record with dimension attribute value v1 if H(v1) lies in the range [x1, x2].

In an embodiment, the set of values may correspond to a plurality of dimension attributes. For example, the hash function specified in the above example may receive two or more inputs, each corresponding to a distinct dimension attribute, i.e., H(v1, v2, . . . ). Accordingly, a dimension of a chunk may be defined as a composite attribute comprising a plurality of dimension attributes of the hypertable.

FIG. 2 shows a hypertable 160 split into a plurality of chunks 210 along two dimension attributes, a time attribute and another dimension attribute referred to as the space attribute. In this example, each chunk is associated with a time range comprising a start time and an end time, and a space range comprising a contiguous range of alphabetical characters. For example, chunk 210*a* stores a set of records that have the value of time attribute within the range [0, 6] and the value of space attribute within the range [A, I]. Similarly, chunk 210*b* stores a set of records that have the value of time attribute within the range [0, 6] and the value of space attribute within the range [J, R], and so on.

Different types of queries can be made to a hypertable, including those that only read from the hypertable (e.g., database SELECT statements), as well as those that modify the hypertable (e.g., database INSERT, UPDATE, UPSERT, and DELETE statements). Writes are typically sent to the chunks comprised of the latest time interval (but do not need to be), while queries may slice across multiple dimension attributes, for example, both time and space.

Although hypertables and chunks are referred to herein as tables, this term is not meant to be limiting, and a chunk could refer to a number of storage representations, including a traditional relational database table, a virtual database view, a materialized database view, a set of structured markup language (e.g., XML), a set of serialized structured data (e.g., JSON, Google Protocol Buffers, Apache Avro, Apache Parquet), or flat files (e.g., with comma- or tab-separated values).

Converting Data Between Representations

In addition to storing a record of data as an individual row of data (which we refer to as the first representation of the data), the data store 145 also stores records of data in a second representation in which multiple rows of data from the first representation are converted by the conversion engine 250 into a form that comprises one row in the second representation. The values of this single row in the second representation include the compressed sets of values from this first set of rows. In certain embodiments, data in the first representation and second representation are stored in different tables or hypertables by the data store 145. In other embodiments, they are stored in the same table or hypertable.

Records of data may be present in either or both representations. In some embodiments, data is converted from the first representation to the second representation in manner so that it does not appear in both representations (e.g., as part of a transaction). This avoids the risk of a query on the database does not double count records stored in both. In other embodiments, the same data may be present in both representations, but only as a transient state. Still in other embodiments, the same data may be present in both representations for a more persistent basis. In such embodiments, the query engine is able to determine which regions or records of data are replicated in both representations, so that a query does not double count records stored in both. In such embodiments, the query engine typically queries the first or second representations for that data based on which one is expected to execute a query more efficiently or cheaply.

The first representation involves storing or representing the fields of individual data records together in the database. In a wide-data format in a database system according to an embodiment, for example, these fields are collocated or stored contiguously or near to each other in the storage format, e.g., if the fields correspond to 8-byte timestamp, a 16-byte character field (such as a device identifier), and three 8-byte integer fields (such as different metrics like location and temperature), the database may store a row using 8+16+(3×8)=48 bytes of data. Often, the database will store additional metadata or information around the record, so the actual storage required to store these fields is more than 48 bytes, e.g., the PostgreSQL database typically uses at least 27 additional bytes of metadata associated with each row of storage. Some of these fields may be missing, empty, or NULL in some records; some database systems have more space efficient ways or storing such values than utilizing their entire bit-length. This set of fields belonging to a record are typically stored near to each other, according to a schema specified on a database table, are often referred to as a "row". In various database systems, such as those that offer multi-version concurrency control (MVCC) semantics, multiple copies of each row may be present in the database with different version numbers, timestamps, or identifies. In some database systems in an embodiment, not all records that are logically part of the same row are stored near to one another; for example, certain fields, especially ones that are very large, may be stored using disk storage or on disk pages that are distinct from other fields in the row. One such example are TOAST fields in the PostgreSQL database or the Antelope and Barracuda file formats in the InnoDB storage engine for the MySQL database.

The second representation involves storing or representing like fields of multiple different records together in the database system. Rather than having the fields of the same record collocated or stored contiguously or near to each other in the database system (e.g., timestamp, device id, metrics), the database system collocates or stores near to each other the same field across multiple records (e.g., multiple timestamps together, multiple device ids together, multiple locations together, multiple temperatures together, etc.). In such environments, the values associated with the fields corresponding to the same record may actually be more distant from each other or have values from other records that are interspersed with them. In this second representation, like types are often collocated or stored contiguous or near to each other—e.g., a set of timestamps are stored contiguous, a set of text values for device identifiers are contiguous, a set of integer values for temperature are contiguous, etc.—but in a manner that the association of fields belonging to the same record is not lost. For example, if the twentieth timestamp of the set of timestamps corresponds to the twentieth device identifier and twentieth temperature, then the database system has not lost this association, or if the database system maintains additional information or uses some type of known function or mapping that associates the twentieth timestamp with the eighth device identifier and thirtieth temperature. These set of values for like types can also be stored more distantly or on disk pages that are distinct from the other set of values. For example, the database system may collocate or store contiguously or near by a set of timestamps with a set of device identifiers and set of temperatures, but store distantly a set of metrics or another field that takes more space (e.g., a larger text field, binary object, or JSON blob).

In certain embodiments, once a set of values of like types are brought together according to this second representation, the conversion engine typically compresses them according to various compression algorithms or settings, described herein.

For example, using the example in FIG. 14A, the records stored in the data store 145 in the first representation each have the attributes (or columns) of ["time", "device_id", "location", "temperature", "error_code"], with data from one record stored as an individual row in a table or hypertable in the data store 145. Data stored in the data store 145 in the second representation, however, looks different. In preferred embodiment, each row stored in the second representation has the format of [compressed(array of multiple times), compressed(array of device ids), compressed(array of multiple locations), compressed(array of multiple temperatures), compressed(array of multiple error_codes)], as shown in FIG. 14B. Data in the second representation is creating by the conversion engine 250 converting multiple rows of data from the first representation to this one row in the second representation. The "compressed" terminology in this description of the second representation describes an algorithm, function, or process that takes input comprising of data to be compressed, such that "compressed(array of multiple times)" is meant to signify a blob of compressed data, whereby this compressed data is generated by applying a compression algorithm, function, or process against an array of data items, where each item is a "time" value.) For better clarity purposes, FIG. 14B doesn't illustrate what the data after compression will look like—given that compressed data often appears to a human reader like random binary data—but rather continues to use the nomenclature "compressed([value1, value2, . . . ]") to represent a compressed array of values.

In some embodiments, data may also be stored in this second representation so that each row in the second representation corresponds to some like form of data attributes. For example, the conversion engine 250 can group together like device ids, so that each row in the second representation only corresponds to data related to a single device id. In such a case, as shown in FIG. 14C, each row in the second representation has the format of ["device_id", compressed (array of multiple times), compressed(array of multiple locations), compressed(array of multiple temperatures), compressed(array of multiple error_codes)].

In other embodiments, additional attributes are stored in this second representation to improve query performance. For example, the conversion engine 250 can include a separate column that includes a "time" value related to the array of times stored in the row (e.g., the earliest (smallest), latest (larger) time value, or some time value selected from within the array), or the conversion engine 250 can alternatively store the range of time values stored within the row (e.g., as an interval or range data type or represented by two separate columns of time values for "start" and "end").

In certain embodiments, the conversion engine 250 stores data in the second representation so that the data in this second representation is disjoint and/or sorted by timestamp. In such embodiments, the set of time values stored in one row of the second representation cover a disjoint range from those in other rows (e.g., the first row of the data includes an array of time values ranging from "2019-01-0100:00:00.00-05" to "2019-01-01 00:03:30.99-05", the second row of the data includes an array of time values ranging from "2019-01-0100:03:31.00-05" to "2019-01-0100:05:09.50-05", and so forth). In certain embodiments, the conversion engine 250 also sorts the array of time values in order by their time values, and then maintains this same sort order in the arrays corresponding to other columns of data (e.g., locations, temperatures, error codes). In such embodiments, the time value that is in the $i^{th}$ ordinal position in its array (e.g., the fifth) is associated with the location, temperature, and error code also in the $i^{th}$ ordinal positions of their respective arrays. In some embodiments, the conversion engine 250 sorts the data by columns other than time or by multiple columns.

In certain embodiments, the conversion engine 250 also stores additional metadata or statistical information about the data stored in a row along with the row (either as separate columns, a dedicated column(s) for all metadata, or in additional storage associated with the row). This additional metadata may include information about one or more arrays in the row, such as the array's minimum value, maximum values, mean or median value, number of values or non-null values, histogram or statistical distributions of values, list of distinct values, bloom filter of values, correlations between compressed columns, and so forth. In such a case, as shown in FIG. 14D, each row in the second representation has the format of ["min time", "max time", "min temperature", "max temperature", "mean temperature", "histogram temperatures", "bloom filter locations", "array of distinct error codes", "device_id", compressed(array of multiple times), compressed(array of multiple locations), compressed(array of multiple temperatures), compressed(array of multiple error_codes)]. The additional metadata may be stored separately for arrays that are part of the set of columns that have been ordered by during transformation to the second format to enable quicker searches along those dimensions.

In certain embodiments, the conversion engine stores aggregates (or the aggregate's partials) of the values in the row so that they can be used to answer queries for those aggregates without decompressing the values themselves. This embodiment simply co-locates the materialized aggregates from U.S. Provisional Patent Application, Ser. No. 62/836,397, filed on Apr. 19, 2019, titled, "Maintaining Up-to-date Materialized Views for Time-Series Database Analytics" with the compressed rows of the raw data inside of the second representation. The U.S. Provisional Patent Application, Ser. No. 62/836,397, filed on Apr. 19, 2019, is incorporated by reference herein. The techniques in that provisional application apply here as well.

One of ordinary skill would recognize that there are many combinations of groupings, sortings, and statistical information about the values stored in such a format, and the database store 145 can store rows in the second representations with arrays in compressed or uncompressed form.

In embodiments of this method, the conversion engine 250 converts data from this first representation to the second representation when a function, procedure, command, or component is executed on the database system. The execution of such a function, procedure, command, or component can be done via external input (e.g., from a user, operator, or remote service) or via internal processes or decision-making procedures (e.g., based on logic, code, or policy within the database system). In certain embodiments, the conversion engine 250 operates as an asynchronous or background task in the database system. In other embodiments, it executes synchronously with insert or update operations.

In certain embodiments, this conversion process is implemented within the core of the database system and implemented in a low-level systems programming language (such as C, C++, Java, Go, and so forth). In other embodiments, it is implemented as a separate component and may use a higher-level language, such as the following example using SQL:

INSERT INTO cpu_compressed
SELECT device_id, segment,
tstzrange(min(time), max(time)),
compress(time), compress(location::BIGINT),
compress(temperature::BIGINT), compress(error_code:: BIGINT)
FROM (SELECT*, rank( ) OVER
(PARTITION BY device_id ORDER BY time)/1000 as segment
FROM raw ORDER BY device_id, time) as j
GROUP BY device_id, segment;

In other embodiments, the conversion engine 250 converts data from this first representation to the second representation based on some conversion policy specified within the database system. This conversion policy can be specified at build/compile time, at execution time, or during the operation of the database system. The policy can be specified by the database system developer, operator, administrator, user, or remote computer or database service.

The conversion engine 250 converts multiple rows of data from the first representation to one row in the second representation. This number of rows can be fixed per conversion operation (e.g., such as 100, 1,000, or 20,000 rows from the first representation per row in the second representation). In other embodiments, the number of rows per conversion operation can change between each conversion (so that distinct rows in the second representation are the result of converting different numbers of rows from the first representation, e.g., one row in the second representation may represent 1,000 rows in the first, another row in the second may represent 4,320 rows in the first, and still another row in the second may represent a single row in the first).

The conversion engine 250 chooses how many rows to convert from the first representation to a single row in the second representation based on the conversion policy. The conversion policy can specify a fixed number of rows, or can also specify a dynamic policy, by which the conversion engine uses an algorithm, function, heuristic, or component to select different numbers of rows from the first representation to convert into one row in the second representation. The conversion engine's dynamic policies can be based on the type or schema of data in the first representation, the size of the data in the first or second representations, the compression factors achieved when data form the first representation is converted into the second, potential cost savings, potential query performance or other performance characteristics, the age of the data, the amount of time that has passed since the last conversion occurred, the amount of time since the data was last accessed, the corpus of queries that has been run, the size or configuration of the database system (including the number of servers, disks or storage volumes, CPU, memory, and the like), the load on the database system (including, but not limited to, CPU and memory being used) user- or administrator-defined criteria, historical compression ratios of similar data, machine learning or other algorithms based on typical data patterns, statistics derived from the raw data that are otherwise used for query planning, historical data access patterns, the query history, statistical properties of the data or queries, the way the data is distributed among nodes of the database cluster, the number of times the data is replicated, archiving policies, and so forth. One of ordinary skill would recognize that there are multiple other criteria by which the dynamic policy can be specified or based.

The conversion policy additionally specifies which compression algorithms or settings to use for each column of data from the first representation when converted to the second representation. This policy specification can be specified at build/compile time, at execution time, or during the operation of the database system, and can be specified by the database system developer, operator, administrator, or user. The policy specification can allow the conversion engine to infer the compression algorithm to use based on the column's type, size, or format (e.g., use one algorithm for text fields, a different algorithm for floating-point types, and a different algorithm or settings for integer types). This inference may also be based on statistical properties of the column (e.g., use one algorithm or setting if the numerical values of a column are drawn from a wide range and a different algorithm or setting if the values are drawn from a narrow range; use one algorithm or setting if the values appear randomized or have high entropy, use a different algorithm or setting if the values appear to be drawn from a known distribution or have low entropy; etc.). This inference may also be based on the concrete performance of the algorithms, for instance by running multiple compression algorithms on the dataset (included in an automated fashion for automated performance testing), and using the one produces the smallest data. The specification, including the choice of compression algorithm (including on a per-column basis for a specific hypertable or as general policy of which algorithm to use for different data types), may also be expressly defined by the operator, administrator, user, or remote service. The choice of algorithm may also be based on how the data is distributed in the cluster, how many times it is replicated and the algorithm chosen on other replicas, the query patterns, and so forth.

In some embodiments, the database system or conversion engine also performs automated testing, such that it compresses data with different compression algorithms or settings to evaluate the compression ratios, latency, cpu load, or other cost metric that the various algorithms or settings achieve, and then recommends (to a user or administrator) or utilizes automatically a particular algorithm or settings based on these results.

In certain embodiments, the database system allows users, components, or systems either external or internal to the database system to insert data directly into the database system in the second representation, as opposed to being converted into that second representation from the first representation by the conversion engine.

In certain embodiments, rather than having every field or column of a record stored separately in the second representation, multiple fields have the same type may also be stored contiguously or near to each other in a set. For example, in a database table having a "timestamp", "device_id", "temperature", and "humidity", if temperature and humidity are of like type (or according to other or additional considerations such as they fall into a similar numeric range or have similar rates of change), then the database system may store temperatures and humidities together in the second representation: e.g., with a row of data in the second representation having a set of (compressed) timestamps, a set of (compressed) device identifies, and a set of (compressed) temperature and humidity pairs. The choice of which fields to store together can be specified externally (e.g., by a user, operator, or remote service) or determined through automated means (e.g., heuristics, cost-based analysis, machine-learning analysis, etc.).

In some embodiments, the database system can convert data stored in a "narrow format" in the first representation to either a "narrow" or "wide" format in the second representation. One popular "narrow" format in a database system is the "entity-attribute-value" (EAV) format. In this EAV format, each row of the database corresponds to one value describing an attribute of an entity; for example, in the above example where the character field is a "device_id", and the three integer fields are various metrics (e.g., location, temperature, error_code), then each EAV row can store a timestamp, device_id, metric name, and metric value.

When converting such schemas into the second representation, according to an embodiment, the conversion engine reads some number of EAV rows, then converts them into a wide row in which like fields are accumulated into a set, such that multiple sets of attributes are stored in each row in the second representation. For example, if the database system includes sixteen EAV rows are as follows (the first representation):

["2019-01-01 00:00:00.00-05"; "DbAq75B", "temperature", 72]

["2019-01-01 00:00:00.00-05"; "DbAq75B", "location", 14]

["2019-01-01 00:00:00.00-05"; "AB7d89bz", "temperature", 68]

["2019-01-01 00:00:00.00-05"; "AB7d89bz", "location", 12]

["2019-01-01 00:01:00.00-05"; "DbAq75B", "temperature", 72

["2019-01-01 00:01:00.00-05"; "AB7d89bz", "temperature", 68]

["2019-01-0100:01:00.00-05"; "DbAq75B", "location", 14]
["2019-01-0100:01:00.00-05"; "AB7d89bz", "location", 12]
["2019-01-0100:02:00.00-05"; "AB7d89bz", "location", 13]
["2019-01-0100:02:00.00-05"; "AB7d89bz", "temperature", 67]
["2019-01-0100:02:00.00-05"; "DbAq75B", "temperature", 73]
["2019-01-0100:02:00.00-05"; "DbAq75B", "location", 14]
["2019-01-0100:03:00.00-05"; "DbAq75B", "temperature", 74]
["2019-01-0100:03:00.00-05"; "AB7d89bz", "location", 13]
["2019-01-0100:03:00.00-05"; "AB7d89bz", "temperature", 67]
["2019-01-0100:03:00.00-05"; "DbAq75B", "location", 14]

Then, in an embodiment, the conversion engine converts this data to a second representation that is stored or represented with the following two rows. The following examples do not show the compression on the sets of like fields or attributes for presentation clarity, but such compression is typically present in data stored in the second representation, as described herein and in preferred embodiment.

[["2019-01-0100:00:00.00-05", "2019-01-0100:00:00.00-05", "2019-01-01 00:01:00.00-05", "2019-01-0100:01:00.00-05"],
 ["AB7d89bz", "DbAq75B", "AB7d89bz" "DbAq75B"],
 [68, 72, 68, 72],
 [12, 14, 12, 14]]
[["2019-01-0100:02:00.00-05", "2019-01-0100:02:00.00-05", "2019-01-01 00:03:00.00-05", "2019-01-0100:03:00.00-05"],
 ["AB7d89bz", "DbAq75B", "AB7d89bz" "DbAq75B"],
 [67, 73, 67, 74],
 [13, 14, 13, 14]]

In an embodiment whereby the conversion engine also groups together data for each distinct device identifier, as described above, then the conversion engine alternatively converts the data from the first representation into a second representation in a manner that can result in the following two rows:

["AB7d89bz",
 ["2019-01-0100:00:00.00-05", "2019-01-0100:01:00.00-05", "2019-01-01 00:02:00.00-05", "2019-01-0100:03:00.00-05"],
 [168, 68, 67, 67],
 [12, 12, 13, 13]]
["DbAq75B",
 ["2019-01-0100:00:00.00-05", "2019-01-0100:01:00.00-05", "2019-01-01 00:02:00.00-05", "2019-01-0100:03:00.00-05"],
 [172, 72, 73, 74],
 [14, 14, 14, 14]]

In another embodiment, when converting such EAV schemas from the first representation into the second representation, the conversion engine reads some number of EAV rows, then converts them into a narrow row in which like fields are accumulated into a set, such that only one attribute is stored in each row in the second representation. Using the same example of EAV data in the first representation as above, the second representation is stored or represented with the following two rows in an embodiment (although this example does not illustrate any compression of these rows):

["temperature",
 ["2019-01-0100:00:00.00-05", "2019-01-0100:00:00.00-05", "2019-01-01 00:01:00.00-05", "2019-01-0100:01:00.00-05"],
 ["AB7d89bz", "DbAq75B", "AB7d89bz" "DbAq75B"],
 [68, 72, 68, 72] ]
["location",
 ["2019-01-0100:00:00.00-05", "2019-01-0100:00:00.00-05", "2019-01-01 00:01:00.00-05", "2019-01-0100:01:00.00-05"],
 ["AB7d89bz", "DbAq75B", "AB7d89bz" "DbAq75B"],
 [12, 14, 12, 14]]
["temperature",
 ["2019-01-0100:02:00.00-05", "2019-01-0100:02:00.00-05", "2019-01-01 00:03:00.00-05", "2019-01-0100:03:00.00-05"],
 ["AB7d89bz", "DbAq75B", "AB7d89bz" "DbAq75B"],
 [67, 73, 67, 74] ]
["location",
 ["2019-01-0100:02:00.00-05", "2019-01-0100:02:00.00-05", "2019-01-01 00:03:00.00-05", "2019-01-0100:03:00.00-05"],
 ["AB7d89bz", "DbAq75B", "AB7d89bz" "DbAq75B"],
 [13, 14, 13, 14]]

In an embodiment whereby the conversion engine also groups together data for each distinct device identifier, as described above, then the conversion engine alternatively converts the EAV data from the first representation into a second representation in a narrow format in a manner that can result in the following four rows:

["AB7d89bz", "temperature",
 ["2019-01-0100:00:00.00-05", "2019-01-0100:01:00.00-05", "2019-01-01 00:02:00.00-05", "2019-01-0100:03:00.00-05"],
 [68, 68, 67, 67]]
["AB7d89bz", "location",
 ["2019-01-0100:00:00.00-05", "2019-01-0100:01:00.00-05", "2019-01-01 00:02:00.00-05", "2019-01-0100:03:00.00-05"],
 [112, 12, 13, 13]]
["DbAq75B", "temperature",
 ["2019-01-0100:00:00.00-05", "2019-01-0100:01:00.00-05", "2019-01-01 00:02:00.00-05", "2019-01-0100:03:00.00-05"],
 [72, 72, 73, 74] ]
["DbAq75B", "location",
 ["2019-01-0100:00:00.00-05", "2019-01-0100:01:00.00-05", "2019-01-01 00:02:00.00-05", "2019-01-0100:03:00.00-05"],
 [114, 14, 14, 14] ]

As described herein, in certain embodiments, each row stored in the second representation can include additional fields, metadata, or statistical information not given in these examples.

In some embodiments, the database system can convert data stored in a "wide format" in the first representation to either a "narrow" or "wide" format in the second representation. Beyond the standard wide approach of each database row comprising multiple rows each which a specific type (as described at length herein), one alternative "wide" format in a database system is the "JSON" format. In this JSON format, each row of the database corresponds to multiple attributes on potentially multiple entities; for example, in the above example where the character field is a "device_id", and the three integer fields are various metrics (e.g., location, temperature, error_code), then each row can store a multiple timestamp, and multiple device_ids, and metrics. Data stored in "JSON" format may also be nested according to a structure specified by the JSON data; in certain embodiments, the database system in such scenarios can convert the data to the second representation in a manner that reflects or captures the nesting.

When converting such schemas into the second representation, according to an embodiment, the conversion engine reads some number of JSON rows, then converts them into a wide row in which like fields are accumulated into a set, such that multiple sets of attributes are stored in each row in the second representation. For example, if the database system includes five JSON rows as follows (the first representation):

[{"timestamp": "2019-01-0100:00:00.00-05", "metrics":
    ["{device_id": "DbAq75B", "temperature":72, "location":14},
    {"device_id": "AB7d89bz", "temperature": 68, "location":12}]}]
[{"timestamp": "2019-01-0100:01:00.00-05", "metrics":
    [{"device_id": "AB7d89bz", "temperature": 68, "location":12},
    {"device_id": "DbAq75B", "temperature":72, "location":14}]}]
[{"timestamp": "2019-01-0100:02:00.00-05", "metrics":
    [{"device_id": "DbAq75B", "temperature":73, "location":14♥,
    {"device_id": "AB7d89bz", "temperature": 67, "location":13}]}]
[{"timestamp": "2019-01-0100:03:00.00-05", "metrics":
    [{"device_id": "AB7d89bz", "temperature": 67, "location":13},
    {"device_id": "DbAq75B", "temperature":74, "location":14}]}]

Then, in an embodiment, the conversion engine converts this data to a second representation that is stored or represented with the following two rows. The following examples do not show the compression on the sets of like fields or attributes for presentation clarity, but such compression is typically present in data stored in the second representation, as described herein and in preferred embodiment.

[["2019-01-0100:00:00.00-05", "2019-01-0100:00:00.00-05", "2019-01-01 00:01:00.00-05", "2019-01-0100:01:00.00-05"],
    ["AB7d89bz", "DbAq75B", "AB7d89bz" "DbAq75B"],
    [68, 72, 68, 72],
    [12, 14, 12, 14]]
[["2019-01-0100:02:00.00-05", "2019-01-0100:02:00.00-05", "2019-01-01 00:03:00.00-05", "2019-01-0100:03:00.00-05"],
    ["AB7d89bz", "DbAq75B", "AB7d89bz" "DbAq75B"],
    [67, 73, 67, 74],
    [13, 14, 13, 14]]

In an embodiment whereby the conversion engine also groups together data for each distinct device identifier, as described above, then the conversion engine alternatively converts the data from the first representation into a second representation in a manner that can result in the following two rows:

["AB7d89bz",
    ["2019-01-0100:00:00.00-05", "2019-01-0100:01:00.00-05", "2019-01-01 00:02:00.00-05", "2019-01-0100:03:00.00-05"],
    [68, 68, 67, 67],
    [12, 12, 13, 13]]
["DbAq75B",
    ["2019-01-0100:00:00.00-05", "2019-01-0100:01:00.00-05", "2019-01-01 00:02:00.00-05", "2019-01-0100:03:00.00-05"],
    [72, 72, 73, 74],
    [14, 14, 14, 14]]

In another embodiment, when converting such JSON schemas from the first representation into the second representation, the conversion engine reads some number of JSON rows, then converts them into a narrow row in which like fields are accumulated into a set, such that only one attribute is stored in each row in the second representation. Using the same example of JSON data in the first representation as above, the second representation is stored or represented with the following two rows in an embodiment (although this example does not illustrate any compression of these rows):

["temperature",
    ["2019-01-0100:00:00.00-05", "2019-01-0100:00:00.00-05", "2019-01-01 00:01:00.00-05", "2019-01-0100:01:00.00-05"],
    ["AB7d89bz", "DbAq75B", "AB7d89bz" "DbAq75B"],
    [68, 72, 68, 72] ]
["location",
    ["2019-01-0100:00:00.00-05", "2019-01-0100:00:00.00-05", "2019-01-01 00:01:00.00-05", "2019-01-0100:01:00.00-05"],
    ["AB7d89bz", "DbAq75B", "AB7d89bz" "DbAq75B"],
    [12, 14, 12, 14]]
["temperature",
    ["2019-01-0100:02:00.00-05", "2019-01-0100:02:00.00-05", "2019-01-01 00:03:00.00-05", "2019-01-0100:03:00.00-05"],
    ["AB7d89bz", "DbAq75B", "AB7d89bz" "DbAq75B"],
    [67, 73, 67, 74] ]
["location",
    ["2019-01-0100:02:00.00-05", "2019-01-0100:02:00.00-05", "2019-01-01 00:03:00.00-05", "2019-01-0100:03:00.00-05"],
    ["AB7d89bz", "DbAq75B", "AB7d89bz" "DbAq75B"],
    [13, 14, 13, 14]]

In an embodiment whereby the conversion engine also groups together data for each distinct device identifier, as described above, then the conversion engine alternatively converts the JSON data from the first representation into a second representation in a narrow format in a manner that can result in the following four rows:

["AB7d89bz", "temperature",
    ["2019-01-0100:00:00.00-05", "2019-01-0100:01:00.00-05", "2019-01-01 00:02:00.00-05", "2019-01-0100:03:00.00-05"],
    [168, 68, 67, 67]]
["AB7d89bz", "location",
    ["2019-01-0100:00:00.00-05", "2019-01-0100:01:00.00-05", "2019-01-01 00:02:00.00-05", "2019-01-0100:03:00.00-05"],
    [12, 12, 13, 13]]

["DbAq75B", "temperature",
  ["2019-01-0100:00:00.00-05", "2019-01-0100:01:00.00-05", "2019-01-01 00:02:00.00-05", "2019-01-0100:03:00.00-05"],
  [72, 72, 73, 74] ]
["DbAq75B", "location",
  ["2019-01-0100:00:00.00-05", "2019-01-0100:01:00.00-05", "2019-01-01 00:02:00.00-05", "2019-01-0100:03:00.00-05"],
  [114, 14, 14, 14] ]

One of ordinary skill would understand that the above are just some examples of conversions in structure that can be performed by the conversion engine. In general, the conversion engine can modify the table structure in arbitrary ways between the first and second representations. The goal of this conversion is to create a new structure that combines values together into an array stored within a row. The resulting structure can be optimized for storage efficiency or cost, query performance or cost, insert performance or cost, distribution, semantic meanings, or other needs.

Compression Algorithms

The database system employs one or more compression algorithms to store data in the second representation. In various embodiments these algorithms are lossless or lossy, such as LZ, DEFLATE, LZW, PPM, Huffman, Sequitur, Burrows-Wheeler, gzip, bzip, Snappy, Simple-8b, Gorilla, FastPFOR, run-length encoding, delta run-length encoding, delta of deltas encodings, and so forth. One of ordinary skill would understand that there are many algorithms which may be applicable. The conversion engine 250 also offers that these algorithms are employed with various settings, such as their block size, run length, compression dictionary, and more. The compression algorithm can also be specified as "none", such that the conversion engine performs all its normal operations without actually executing any compression on the data. In this case other subsystems, such as the database store 145 or the filesystem or storage system on which the database system stores its data, may still apply their own compression, including but not limited to object-level, disk-page-level, or file-level compression. The inclusion or enablement of compression by such systems are still part of the inventive methods described herein, as the conversion of data from the first representation to the second representation typically enables more efficient compression by such systems.

In this following description, we describe in more detail some of the compression algorithms and settings employed by the database system in preferred embodiments of the method, although one of ordinary skill would understand that the conversion engine can utilize any number of compression algorithms or settings, and the database system is not limited to the specific compression algorithms expressly named herein. Embodiments of the database system also combine various methods. One of ordinary skill would also understand that new or custom compression algorithms could be developed, including based on the specific data or workloads that are stored in the database system, and employed as part of the invention. In some embodiments, to compress numeric data that are integers (small integers, large integers, bigint integers, timestamps etc.), the database system employs a combination of delta encoding and integer compression. In delta encoding, numbers are stored as the difference between the actual value, and some other value, often the value immediately prior in the dataset. Some embodiments may choose to run multiple rounds of delta-encoding, so that instead of the storing the delta between values, it instead stores the delta of the deltas, and so forth.

Integer compression schemes (such as Simple-8b, FastPFOR, etc.) store lists of integers in more compact forms. Compression scheme may also be referred to herein as a compression technique. This is often achieved by choosing a number of bits per-integer such that only those bits need to be stored to recover the original value. Often repeated values are run-length encoded, where a sequence of repeating values (such as [3, 3, 3, 3, 3]) are replaced with a pair containing the value, and the number of times it repeats (such as (3, 5)). Some embodiments also run zig-zag encoding in conjunction with the other algorithms to optimize the storage of negative and positive integers near 0.

In some embodiments, to compress numeric data that are floats or doubles (e.g., including a decimal point) or are integers, the database system employs the Gorilla compression scheme. In the Gorilla compression scheme, individual floating point values are stored as the exclusive-or between that value and the prior value in the dataset. The database system may also convert data from float/double to integer form before storing it in compressed form (either automatically or manually).

In some embodiments, to compress textual or character data, or data for which a more specialized compression scheme is not appropriate due to reasons such as non-applicability or poor compression performance, the database system employs dictionary encoding. In dictionary encoding, a dictionary containing the unique values in the dataset is created and stored, and for each row in the dataset and index into this dictionary is stored. This dictionary and index may then be further compressed. For example, if the database system includes five text rows as follows (the first representation):
  ["aaaa"]
  ["xxxx"]
  ["xxxx"]
  ["aaaa"]
  ["xxxx"]

Then in an embodiment a dictionary encoding is created such as
  [["aaaa", "xxxx"], [0, 1, 1, 0, 1]]

In some embodiments, to compress textual or character data, or data for which a more specialized compression scheme is not appropriate due to reasons such as non-applicability or poor compression performance, the database system employs a general-purpose compression scheme. A general purpose compression, such as LZ, DEFLATE, LZW, PPM, Huffman, Sequitur, Burrows-Wheeler, gzip, bzip, Snappy, etc., is a compression scheme that compressed arbitrary sequences of bytes. Such a scheme can also be used to further compress data that has already been compressed by some other scheme.

Querying Data

The database system 110 enables data to be queried from this second representation. Because data in the second representation is stored in a compressed form, then the queries that access this data can often execute with lower latency. In particular, if the data being queried is stored on disk, then the number of disk I/O operations to fetch compressed data is typically many fewer than the number of disk I/O operations required to fetch the same data stored in uncompressed form, thus reducing latency. Additionally, because fewer disk I/O operations are required to satisfy a given query, the database system can often execute a larger number of queries in a given time period, thus increasing query throughput. Furthermore, when data is stored in a compressed form, then more such data can fit in a like amount of system memory; thus, the database system can more frequently answer a query using compressed data stored in memory, rather than needing to fetch the data from disk or some alternative storage media (either local or remote), and hence reducing query throughput.

When querying data stored in this second representation, when a query specifies a one or more columns, the query engine decompresses the compressed arrays for each specified columns, and returns values in these arrays that match the query. For example, in a schema like FIG. 14D, if the database system receives a query of the form "SELECT min(temperature), max(temperature), count(locations) FROM data WHERE device_id="A" and time >'019-01-0100:00:00.00-05' and time <'2019-01-0100:00:59.999-05' GROUP BY device_id", the query engine determines which rows have time values that fall within that one minute range and a device id equal to "A"; decompresses the row(s) time, temperature, and location columns; determines which time values within this decompressed array(s) of time values are within that one minute range; determines the elements in the decompressed temperature and location arrays that correspond to these determined time values; performs a min and max aggregation on the determined temperature values and count aggregation of the determined location values; and returns these three computed results.

In some embodiments, the database system implements this functionality internally, such that the query engine determines which rows have time values that fall within that one minute range and a device id equal to "A"; determines which time values within the compressed array(s) and creates a data structure marking these values; determines the maximum time and temperature, and the count of locations directly from the compressed arrays and the aforementioned data structure; and returns these three results.

In some embodiments, the database system stores additional metadata alongside data stored in the second representation around the compressed arrays which allows it to avoid decompressing segments/arrays which cannot possibly satisfy a query. This additional metadata may include information about one or more arrays in the row, such as the array's minimum value, maximum values, mean or median value, number of values or non-null values, histogram or statistical distributions of values, list of distinct values, bloom filter of values, correlations between compressed columns, and so forth. The additional metadata may be derived at conversion time or may be calculated after conversion and storage. The particular sorts of metadata may depend on the data types stored, distributions of the underlying data, implicit or explicit orderings, or even the queries that have been processed in the past. Different statistics may be more appropriate for quickly eliminating certain compressed rows from a scan such that they need never be decompressed, saving significant overhead.

In some embodiments, indexes of combinations of elements from multiple columns are stored on the compressed data which allow not only avoiding decompressing certain segments, but also for determining whether a compressed row satisfies a query across multiple columns (e.g., based on its qual set), when the values in each column may otherwise be uncorrelated and many false positives will occur. Indexes may also point into the compressed rows allowing the compression algorithm to only extract certain matching elements from within a compressed row.

In embodiments, the database system provides this functionality in its lower-level system implementation. In other embodiments, it is implemented in a higher-level language or component, such as SQL or PL/pgSQL. One example of such a SQL-based implementation of a query on this second representation is the following:
SELECT*FROM raw_compressed 1, ROWS FROM
(decompress(time), decompress(location),
decompress(temperature), decompress(error_code)
AS m(time, location, temperature, error_code) m;

In other embodiments, the database system implements this functionality using a view. On such example of a view over the second representation is the following:
CREATE VIEW raw_from_compressed AS
SELECT decompress(time) as time, device_id,
decompress(location)::double precision as location,
decompress(temperature)::double precision as temperature,
decompress(error_code)::integer as error_code
FROM raw_compressed;

In other embodiments, the database system builds a logical view over data stored in both the first representation and second representation. In certain embodiments, this view is built over two separate database tables or hypertables, and the query engine performs a union over data returned by these two tables or hypertables when answering a query.

In some embodiments, views may also be created automatically over data in the second representation, or over data across both the first and second representations, without explicit user intervention. This automated view creation may occur as a result of certain types of DDL commands, through the use of a design tool in which a user specifies queries to optimize and actions are taken, or through the automatic analysis (including by machine-learning) of query logs, cached queries, or other data or statistics that may enable a system to infer appropriate views.

Although materialized views, tables, hypertables, and chunks are referred to herein as database tables, this term is not meant to be limiting, and a view, table, or chunk could refer to a number of storage representations, including those belonging to traditional databases (e.g., relational tables, virtual views, materialized views); a set of structured markup language (e.g., XML); a set of serialized structured data (e.g., JSON, Google Protocol Buffers, Apache Avro, Apache Parquet); flat files (e.g., with comma- or tab-separated values); tables or files stored in different storage layouts such as row-major form, column-major form (also known as columnar storage), or other layouts; and other storage representations.

Asynchronous Conversion Between the Data Representations

Figure 12:
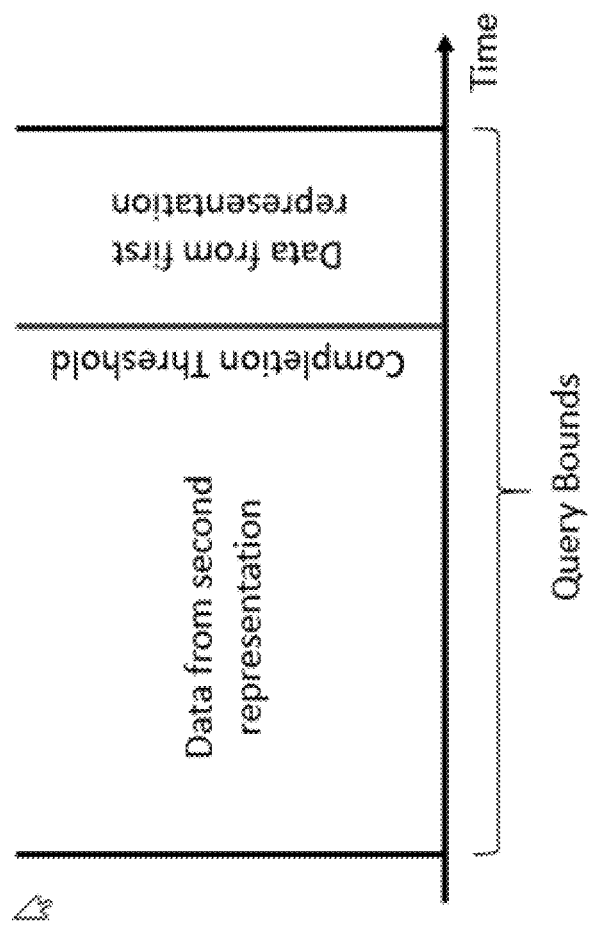
FIG. 12 illustrates processing of a query by combining data stored in the first row-based representation with data stored in the second array-based representation, according to an embodiment.

The database system 110 tracks which regions of data have been converted from the first representation to the second representation, which we refer to as a completion threshold or completion intervals. In certain embodiments, this tracking is done using a completion timestamp threshold, such that all data with a time value that is before the timestamp threshold is compressed and stored using the second representation, while all data with a time value that is after the threshold is stored in its standard form in the first representation, as illustrated in FIG. 12. In other embodiments, this tracking is done using one or more completion time intervals, where each interval has a start and end time, such that all data within the specified intervals are stored in the second representation, while all data outside of the intervals are stored in the first representation; alternatively, the time intervals could signify data in the first representation and data outside the intervals are stored in the second representation; alternatively, time intervals could be kept for all data, with one set of intervals signify data in the first representation, another set could signify data in the second representation, and all data falling within one of the sets of intervals. In other embodiments, this conversion and tracking is done based on non-time attributes, such as integer values, primary keys, uuids, text fields, or other attributes. In other embodiments, this conversion and tracking is based on information other than actual fields or values that comprise the rows of data, such as when the data was first inserted into the database system. In other embodiments, the database system performs this tracking at the partition or chunk level, such that entire chunks of data are either stored in the first or second representations. In other embodiments, the database system stores or associates additional metadata with or in each row to signify if its of the first or second representation, or the database system infers this status based on the row's type, schema, or configuration. In certain embodiments, the database system builds data structures or indexes to efficiently determine which regions of the data are in the first versus second representations. One of ordinary skill would recognize that multiple different ways could exist to track or representation such information as to which regions of data are stored in the first versus second representation.

The database system stores additional information related to a conversion target threshold or target intervals. This conversion target threshold corresponds to a timestamp, integer, primary key value, uuid, text value, insert time, or other value, or a conversion target interval which has both a start and end value corresponding to timestamps, integers, primary key values, uuids, text values, insert times, or other values. In some embodiments, the conversion target includes multiple thresholds or multiple intervals. This conversion target specifies that the database system should convert data from the first representation to the second representation for any data that is "older than" or "less than" the target threshold, or is "within" (similarly "outside of") the conversion interval(s). In some embodiments, the conversion target correlates to chunks of the hypertable that holds data to be converted (e.g., an ordinal number, such as the third newest chunk based on its time intervals, or a time threshold based on the chunk intervals, such as chunks that have a time interval that is less than the threshold and thus all records stored within the chunks are also older than the threshold). In certain embodiments, these conversion target(s) are specified as part of the conversion policy. In some embodiments, the conversion target threshold is missing or set to some value or notation that causes the conversion engine to attempt to convert any data in the database system, as opposed to "lag behind" the most recent data by some interval (as would happen if the conversion target is specified as "1 hour" behind the current time or the latest data record).

In embodiments of this method, the conversion engine 250 operates by converting data from the first representation to the second representation any data that is newer than the completion threshold but older than the conversion target threshold. In certain embodiments, this determination is performed on a row-by-row basis for data in the first representation. In other embodiments, this determination is performed on a segment or region basis, such that if the conversion engine determines that it seeks to convert 1,000 rows of data from the first representation to the second, then it will only perform a conversion when the number of rows between the completion threshold and conversion target threshold is equal to or greater than 1,000. The conversion engine may base its decision on whether to convert the data on a number of other criteria, including as specified above as part of the system's conversion policy. In other embodiments wherein the conversion operates on a partition or chunk basis, then the conversion engine converts data from the first to second representation when all data within the partition or chunk is older than the conversion target threshold. In other embodiments that utilize a completion interval or conversion interval, all of these aforementioned examples can take into account the regions of time or space covered by the intervals, rather than a single threshold.

Certain embodiments support both completion intervals and a conversion target threshold, such that the conversion engine may operate on any unconverted region that is older than or less than the conversion target threshold, but there may be multiple non-contiguous regions of data stored in the first versus second presentation prior to this conversion target threshold. Such scenarios can exist in the database system for a variety of reasons. For example, in some embodiments, the conversion engine executes multiple threads or processes of execution concurrently, such that different regions of the data are processed or complete non-consecutively. In some embodiments, the database system exposes the capability to expressly convert some region, set of rows, or chunk of data from the first to second representation (or vice versa). This capability may be used by a user to expressly cause some portion of data to be compressed or uncompressed. It also may be used by the system to efficiently insert into, modify, or delete data stored in the second representation: for an individual row or a larger region or chunk of data in the second presentation, the conversion engine can convert the data stored in the second representation into the first (i.e., uncompress it); perform inserts, updates, or deletions on the corresponding data in the first representation; and convert the resulting data from the first representation back into the second (i.e., compress it).

In some embodiments, the database system also maintains additional metadata with a region of data in the first or second representation such that the conversion engine will not convert it to the alternative representation. In other words, this metadata specifies that certain rows or chunks of data should not be compressed (converted to the second representation) or once compressed, should not be uncompressed (converted to the first representation). In some embodiments, this metadata can be updated so that a region or chunk of data that was "locked" or "frozen" from being converted can henceforth be converted, or vice versa.

When the conversion engine determines that it should convert some set of rows from the first representation to the second representation, it reads all such rows of data stored in the first representation from a first table; performs any grouping and ordering as specified by the schema or policy of the second representation (e.g., should different device identifiers be stored within the same row or separate rows); builds sets of values for each column of data to be stored in the second representation based on the data from such rows; uses the conversion policy to determine the compression algorithm or settings to use for compressing these sets of values; performs compression on each such column; writes a row with these compressed columns, additional columns (e.g., for time information, grouping information), and additional metadata (e.g., statistics for planning or query optimization) as specified in the second representation to a second table; and finally (optionally) deletes these converted rows from the first representable. These first and second tables can be standard database tables, hypertables, partitioned tables, or other types of storage structures, as described herein. The conversion engine can also use a single table or hypertable for the first and second representations, and not distinct first and second tables or hypertables.

In certain embodiments, the conversion engine stores a log or other types of metadata about which regions are currently being converted, so that only a single conversion process will attempt to operate on a region of data in the first representation at any one time. In other embodiments, the database engine uses a table, chunk, or row-level lock or semaphore to perform this coordination. I In an embodiment, the conversion engine runs in a separate background process, within the database. This separate background process may be launched or execute on a regular schedule, or it may be launched or execute through a user-initiated or administrator-initiated command or as part of the logic of another system component. The execution of the conversion by the conversion engine may be triggered by a timer, some interaction with the change log or change metadata (e.g., once some number of changes or changed range have been made), or other means. In some embodiments, the conversion engine is triggered as a result of certain DML, DQL, or DDL operations. In some embodiments, trigger functions are called after a single or batch of DML operations which cause the conversions to be executed. In other embodiments, the conversion engine is run in conjunction with the query processor, so that when a query (e.g., insert, update, or delete) is first processed, its results will also be converted. In some such embodiments, the conversion happens lazily, after a client first requests a given query. In some embodiments, multiple instances, processes, or threads of the conversion engine are run concurrently.

If any changes (inserts, updates, deletes or the like) are performed against rows stored in the second representation that are "locked" or "frozen", then the database engine returns an error as the result of the operation. In other embodiments, the database engine just quietly ignores any changes that are attempted to be performed against such locked rows or chunks.

In certain embodiments when changes to rows stored in the second representation are allowed, on a change operation to such rows, the database system decompresses any relevant columns, performs the change or changes on the uncompressed data, updates any other relevant data or metadata in the row (e.g., min or max timestamp, statistics, indexing information, etc.), and then recompresses the relevant columns. In other embodiments, the database system delays recompressing the relevant columns. This delay serves to avoid unnecessary compression/uncompression if the data will be soon-after updated again. The database system delays this recompression for some amount of time, which in different embodiments is based on some wall-clock time or idle period, some number of operations or transactions, some cost-based metric, or other metrics.

In other embodiments, the database system stores the changes or change operations alongside the data in the second representation or in a separate change log, without immediately performing these changes. The database system then applies these changes either asynchronously (e.g., based on some scheduled task) or on-demand/synchronously when the data that they would apply to is queried.

Some embodiments combine strategies for handling, allowing, disallowing changes to data in the second representation. For instance, the database system may divide table data into three regions based on time: (i) the most recent data (e.g. more recent than 1 hour), (ii) intermediate data (e.g. up to a day ago), and (iii) older data (e.g. older than 1 day). For the most recent data, the database system may not convert anything and store it in the first representation. For intermediate data, the system can store change information or use change logs and execute these updates asynchronously in a background process. Finally, for older data, changes may be very rare, so that when changes do occur, the database system may re-calculate and update the second representation synchronously with the modifications. In an alternative example, the database system may support yet another range of oldest data (e.g., older than 1 month), so that synchronous updates are carried out for changes between one day and one month, while all updates are blocked for any data other than one month. In some embodiments, different strategies are defined on a per-chunk basis within a hypertable.

Some embodiments may treat data modifications differently for datasets which have unique constraints applied to them than other datasets. Enforcement of unique constraints may require different strategies including storing or enforcing non-overlapping ranges in each compressed row so that only subsets of the data need be checked for collisions, requiring the decompression of larger swathes of data to enforce uniqueness, the use of statistics or metadata to limit the amount of data needed for decompression and uniqueness checking, requirements of certain ordering or grouping keys if there are unique constraints, and so forth.

Distributed Execution of Queries

Figure 3:
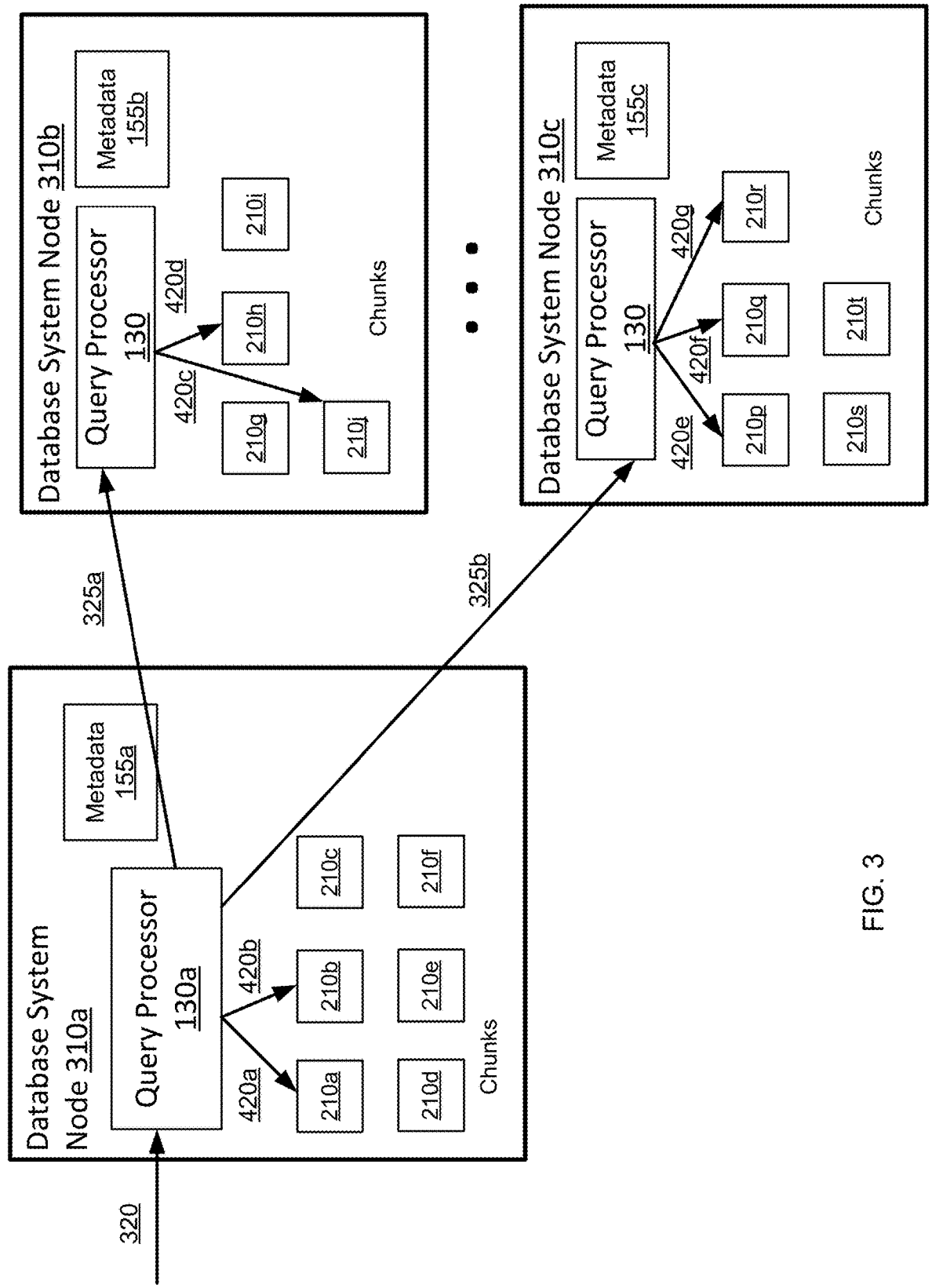
FIG. 3 shows processing of queries in a database system comprising a plurality of database nodes, in accordance with an embodiment.

FIG. 3 shows processing of queries in a database system comprising a plurality of database nodes, in accordance with an embodiment. A database system node 310a receives database queries and may send one or more queries to chunks (that may be implemented as physical tables of the data), which are stored on the coordinator database system node or on other database system nodes. A database system node does not issue a query to a chunk if it determines that the chunk is not needed to satisfy the query. This determination uses additional metadata about the chunk, which may be maintained separate from or along with each chunk's data. Each database system node can also maintain additional metadata to allow it to efficiently determine a chunk's time interval and partitioning field's keyspace. The database system may maintain the metadata separate from or along with a chunk.

As shown in FIG. 3, the database system node 310a receives a first database query 320. The database system node 310a determines that the data required for processing the received database query is on one or more database system nodes 310a, 310b, and 310c. The database system node 310a further sends queries 325a and 325b for processing the first query to the database system nodes 310b and 310c, respectively. All three database system nodes 310a, 310b, and 310c process their respective queries using one or more chunks of data stored on their respective nodes. In the example, illustrated in FIG. 3, if the database system node 310a determines that the data required for processing the first query is stored only on database system nodes 310a and 310b but not on 310c, the database system node 310a sends a query for processing to 310b but not to 310c. In other embodiments of the system, the queries 325a and 325b sent to the other nodes 310b and 310c are the same as the first query 320, and the queries or requests sent to the other nodes can be in a different query language, format, or communication protocol as the first query. In some embodiments of the system, the queries 325a and 325b maybe identical to each other, while in others they are different. Further, in other embodiments, node 310a does not store chunks itself, but only processes the query 320 and issues the corresponding queries 325 to other database nodes.

The database system node 310a that receives the database query may determine that the query to the hypertable does not involve a particular chunk's data—for example, because the query specified a time period different than that associated with the chunk, or if the query specifies a dimension attribute (e.g., an IP address, device ID, or some location name) that is associated with a different chunk. In this situation, the first database system node does not issue a query to this particular chunk (which may be located on itself or on a different node). This determination by both the first database system node and any other database system nodes may be performed by the query processor 130 present on each database system node that processes queries.

Any database system node may receive a query from a requester and the query processor 130 running on this database system node determines how to plan and execute the query across the entire cluster of one or more nodes. This database system node sends a query (a "subquery") to zero or more other nodes in the system. Subsequently, the database system node(s) that receive a subquery from the first database system node include a query processor 130 that determines how to plan and execute the query locally.

In an embodiment, this process is extended to additional levels of subqueries and involved planners. In an embodiment, the database system performs this partitioning in a recursive fashion. For example, the chunk that is being stored on one of the nodes could itself be further partitioned in time and/or by an additional partitioning key (either the same or different than the partitioning key at a higher level), which itself could be distributed among the node (e.g., on different disks) or even to other nodes. In such a scenario, a chunk can act as another hypertable.

In some embodiment, the database system performs the query processing using only the query processor 130 on the first database system node. Accordingly, the complete query plan is generated by the first node and sent to nodes that are determined to store chunks processed by the query. The remaining nodes that receive the query plan (or some portion thereof) simply execute the received query plan without having to generate a portion of the query plan. In other embodiments, the database system implements less homogenous functionality across nodes, such that a first set of one or more nodes receives queries and plans and executes the queries against a second disparate set of one or more nodes that store the chunks.

In some embodiment, when the database system node 310a receives a database query 320 and sends subsequent queries 325a and 325b for processing the first query to the database system nodes 310b and 310c, the decompression performed by the database system to handle queries to data stored in the second representation occurs on the database nodes 310b and 310c which receive these subsequent queries. In such embodiment, the database nodes 310b and 310c decompress data stored in the second representation which may match the queries 325a and 325b (respectively), applies any query predicates that are receives as part of queries 325a and 325b, and returns to the database node 310a any data that matches the query. In various embodiments, this data returned to the database node 310a is sent back in the first representation, formatted according to the second representation albeit still uncompressed, or recompressed by the nodes 310b and 310c (either using the same compression algorithm or settings as used to the store the data in the second representation or an alternative compression algorithm or setting) before being returned.

In other embodiments, the database nodes 310b and 310c return data in the second representation which may match the query, yet may not perform all filtering or apply query predicates themselves in order to avoid needing to decompress the data in order to apply the predicate against the data. In such embodiments, the database node 310a receives the data in the second representation from nodes 310b and 310c and decompresses the data as describe herein, applying any needed query predicates that are present in database query 320, and determines the result to return in response to the database query 320.

In some embodiment, the query planner determines whether to perform the decompression on the database node 310a that receives the first query 320 or to have the decompression performed on the database nodes 310b and 310c that receive the subsequent queries from the node 310a. In various embodiment, this determination is based on cost; network, disk, or server load or capacity; measured performance; the size of data being requested; the requested query or query predicates; the configurating of the cluster, including the number, size, or location of the nodes; or other query planning or optimization decisions.

In some embodiments, when a particular portion of data is replicated between different nodes 310b and 310c, each copy of the data (stored on separate nodes) may have a different layout, for instance one node may have a copy of the data in the first representation while the other node may have a copy in the second representation. Additionally, different nodes may have different strategies for determining the optimal second representation, in which case different nodes may have different versions of the second representation. In cases where the data is replicated, queries for a region of data typically are only sent to one node containing the data and the determination of which to go to will be based on cost, especially if the nodes have different versions of the second representation, each of which might be more optimized for different query types or able to search more quickly with different sets of qualifiers. The query may also be sent to both nodes simultaneously and a "race" kicked off in which the node with the better representation will return data first and the query on the second node will be cancelled. The system may use data from these "races" and query type information to determine better how to spread query load in future.

System Architecture

Figure 4A:
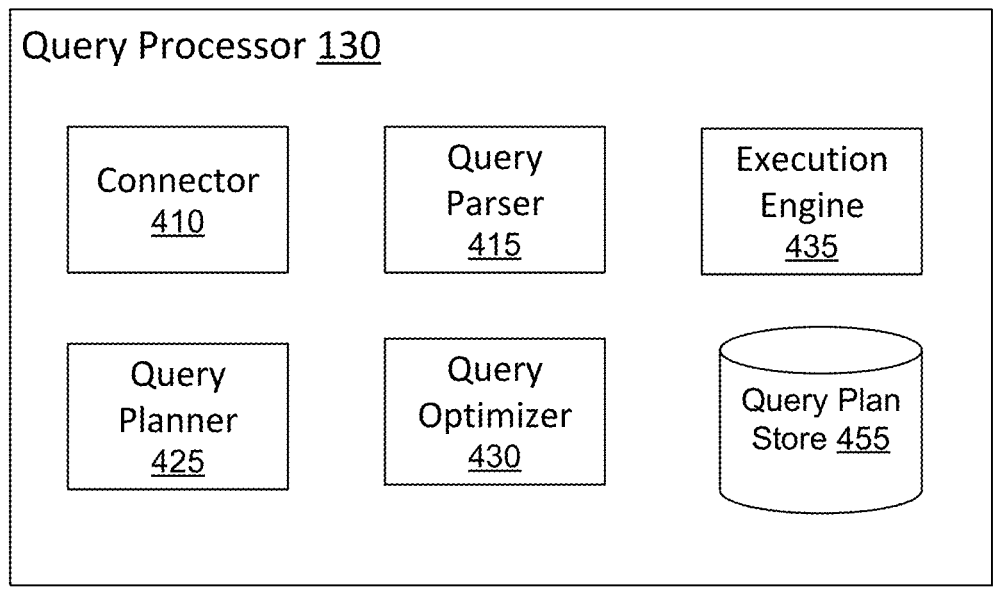
FIG. 4A shows the system architecture of a query processor, in accordance with an embodiment.

FIG. 4A shows the system architecture of a query processor, in accordance with an embodiment. The query processor 130 comprises components including a connector 410, a query parser 415, a query planner 425, a query optimizer 430, an execution engine 435, and a query plan store 455. A query processor 130 receives a query in some query language, such as SQL, which specifies the tables or datasets on which the query will apply (i.e., read or write data). A query or database query may represent a request to read data (e.g., SELECT statements in SQL) or modify data (e.g., INSERT, UPDATE, and DELETE statements in SQL) from the database.

The query parser receives this request and translates it to a query representation that is easier to process. For example, the query parser 415 may generate a data structure representing the query that provides access to the information specified in the query. The query optimizer 430 performs transformation of the query, for example, by rewriting portions of the query to improve the execution of the query. The query planner takes this machine-readable representation of the query, which is typically declarative in nature, and generates a plan specifying how the query should be executed against the stored data, which may be stored in memory (e.g., RAM, PCM) and/or on some type of nonvolatile storage media (e.g., flash SSD, HDD). The query processor 130 stores the generated plan in the query plan store 455. The execution engine 435 executes the query against the stored data, and returns the results to the requester. The connector 410 allows the query processor 130 to connect to remote systems, for example, to access data stored in remote systems.

Figure 4B:
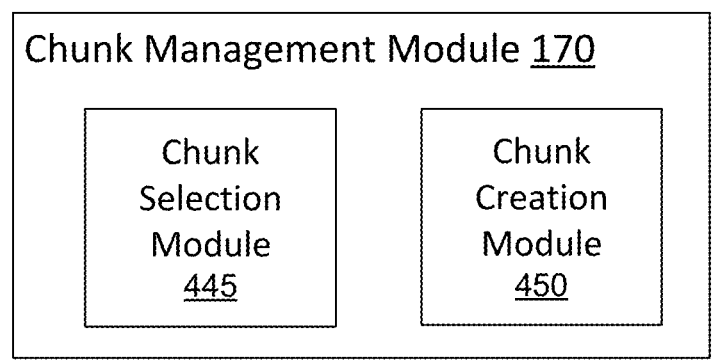
FIG. 4B shows the system architecture of a chunk management module, in accordance with an embodiment.

FIG. 4B shows the system architecture of a chunk management module, in accordance with an embodiment. The chunk management module 170 further comprises a chunk selection module 445, and a chunk creation module 450. The chunk selection module 445 implements a chunk selection function that determines a chunk for storing a given record. The chunk selection module 445 determines whether an existing chunk can be used for storing the record. If the chunk selection module 445 determines that none of the existing chunks can be used for storing the record, the chunk selection module 445 determines that a new chunk needs to be created and invokes the chunk creation module 450 for creating the chunk. If the chunk selection module 445 determines that a new chunk needs to be created, the chunk selection module 445 determines various parameters describing the new chunk. For example, the chunk creation module 450 determines the sets of values corresponding to different dimension attributes of the records that define the chunk boundaries. Accordingly, records stored in the chunk have dimension attribute values such that each dimension attribute has a value that maps to a value in the set of values corresponding to the chunk's dimension. For example, if a chunk has two dimension attributes, based on time and a device id, then each record stored in the chunk has a time attribute that falls within the chunk's time range and a device id from the set of device ids associated with the chunk. The chunk creation module 450 determines a location for creating the chunk and creates the chunk on the location.

The database system 110 stores in the metadata store 140, metadata 155 describing the chunk. The metadata for a chunk includes information associating the chunk with the hypertable. Other type of metadata describing the chunk includes a name of the chunk, the various sets of values of the dimension attributes (for example, time ranges for the time attribute, and so on), information describing constraints and indexes for the chunk, and so on. The database system 110 may store other metadata associated with the chunk, e.g., access statistics and data distribution statistics to aid query planning.

A hypertable may be associated with certain policy configurations, for example, indexes, constraints, storage parameters (e.g., fillfactor settings, parallel worker settings, autovacuum settings, etc.), foreign key relationships, and so on. In an embodiment, each chunk of the hypertable implements the policy configurations of the hypertable containing the chunk. Accordingly, when creating a chunk, the chunk creation module 450 may also create structures such as indexes for the chunk and update metadata to specify constraints, foreign key relationships, and any other policy configurations for the chunk. Examples of constraints defined for a chunk include UNIQUE, NOT NULL, CHECK CONSTRAINT (i.e., timestamp between range), FOREIGN KEY, and EXCLUSION constraints. The chunk management module 170 continues to manage the chunk once it is created, for example, by reindexing old chunks periodically, moving old chunks to slower storage devices over time, adding secondary constraints through dynamic inspection, and so on.

In an embodiment, the chunk management module 170 monitors the sizes of the chunks that were recently created. A recently created chunk (or a recent chunk) refers to a chunk that was created within a threshold time interval of the current time. The size of the threshold time interval may be configurable. The size represents the amount of data that is stored in the chunk, for example, the chunk's size of bytes, its number of rows, and so on. The chunk management module 170 adjusts sets of values of the dimension attributes for new chunks being created based on the size of the recently created chunks. Accordingly, if the chunk management module 170 determines that one or more recently created chunks store data that exceeds certain high threshold values, the chunk management module 170 adjusts the sets of values of one or more dimensions so that they have fewer elements than the corresponding sets of values of the recently created chunks. For example, if the chunk management module 170 determines that the recently created chunks had a range of 12 hours for the time attribute, the chunk management module 170 may decrease the range of time attributes of new chunks being created to be 10 hours. Alternatively, if the chunk management module 170 determines that one or more recently created chunks store data that is below certain low threshold values, the chunk management module 170 adjusts the sets of values of one or more dimensions so that they have more elements than the corresponding sets of values of the recently created chunks that were below the low size thresholds. For example, if the chunk management module 170 determines that the recently created chunks had a range of 12 hours for the time attribute and stored very few records, the chunk management module 170 may increase the range of time attributes of new chunks being created to be 15 hours.

In an embodiment, the chunk management module 170 monitors one or more performance metrics for the chunks that were recently created. The chunk management module 170 adjusts the sets of values of dimension attributes for new chunks being created based on the performance metrics for the chunks that were recently created. For example, the chunk management module 170 may monitor insert rate and query execution time. For example, if the chunk management module 170 determines that for the current sizes of chunks the insert rate of records has fallen significantly (e.g., since the database system has started swapping to disk), then the chunk management module 170 determines the sets of values of dimension attributes of new chunks being created such that the new chunks are smaller.

In an embodiment, chunk management module 170 keeps statistics describing chunks processed by each distinct query, for example, the number of chunks processed by each query. The chunk management module 170 uses this statistical information to determine sets of values for dimension attributes of new chunks being created so as to improve performance. In an embodiment, the chunk management module 170 monitors the dimension attribute boundaries specified in queries. If the chunk management module 170 determines that commonly received queries have certain pattern of boundaries, for example, a pattern of time alignment (e.g., typical queries request data for a day between midnight and midnight), then the chunk management module 170 aligns newly created chunks to match these boundaries. As another example, if the current chunks have one hour time attribute ranges and the chunk management module 170 determines that the queries are typically accessing data at an interval of a size of a full day, the chunk management module 170 increases the chunk sizes to reach a size more aligned with the access patterns, yet one that still retains a high insert rate. For example, the chunk management module 170 may increase the time attribute range to be 12 hours, e.g., if 12 hours gives a higher insert rate compared to a 24-hour range.

In an embodiment, the chunk management module 170 determines the sets of values of the dimension attributes of chunks being created based on ranges of dimension attributes specifies in queries received by the database system. For example, if the chunk management module 170 is creating chunks with time attribute ranges from 11 pm to 11 pm, and the chunk management module 170 determines that the queries received are accessing data from midnight to midnight, the chunk management module 170 shifts the time range of the chunks being created to match the time ranges of the queries. This improves the performance of queries by avoiding the need to unnecessarily scan two chunks rather than one.

In an embodiment, the chunk management module 170 distributes chunks across a plurality of locations based on the properties of the storage media of each location. The chunk management module 170 identifies the storage medium for storing the new chunk and accesses properties of the storage medium, for example, properties describing a rate of access of data stored on the storage medium. The chunk management module 170 determines a number of chunks from the plurality of chunks being assigned to a location based on the properties of the storage medium corresponding to that location. For example, the chunk management module 170 accesses metrics describing the rate at which a storage medium accesses random data. Certain storage mediums, e.g., solid-state drives (SSDs) and random-access memory (RAM), can handle random reads much better than spinning hard disk drives (HDDs). Accordingly, the chunk management module 170 assigns more chunks from the plurality of chunks to a location having a storage medium with faster access time for random accesses.

In an embodiment, the conversion engine works with the chunk management module 170 to determine the compression algorithms or settings used for data stored in the second representation based on the location (or the properties of the location thereof) on which the chunk is stored. In an embodiment, the conversion engine uses this location or location's properties together with its conversion policy to determine the configuration of the second representation, as described herein as part of a dynamic policy.

In one embodiment, the chunk creation module 450 creates a new chunk- and "closes" an existing one—when the existing chunk approaches or exceeds some threshold size (e.g., in bytes on disk or in memory, in its number of rows, etc.). Each chunk is represented by a start and end time (defining its interval). With a purely size-based approach, however, the database system would not know a priori the end time of a newly-created chunk. Thus, when a chunk is first created, the chunk's end time is unset; any row having time greater than (or equal to) the start time is associated with the chunk. However, when a chunk's size approaches or exceeds some threshold, the query planner 425 closes the chunk by specifying its end time, and the chunk creation module 450 creates a new chunk. This new chunk starts at the time the old chunk ends. With this approach, the chunk has an indeterminate end time for a chunk until it is closed. A similar logic is applied to an indeterminate start-time. It is also possible for an initial chunk to have both an indeterminate start and end time. An embodiment of the database system performs this determination and chunk creation asynchronously or in the background, while another performs these actions during the process of inserting a (set of) row(s) from the received batch to the chunk. The creation of the new chunk at insert time can happen in a variety of ways: before inserting the rows (the query planner 425 decides that the existing chunk is too full already, and creates a new chunk to insert into); after inserting the rows into the chunk; or in the middle of inserting the rows (e.g., the query planner 425 decides the chunk only has space for a subset of the rows, so the subset is inserted into the current chunk and the remainder of the set is inserted into a newly created chunk).

In other embodiments, the database system defines a chunk as having a particular time interval (that is, both a start and end time) when the chunk is created. Then the system creates a new chunk when needed, e.g., when new data is to be inserted to a time interval that does not yet exist. In one embodiment, the database system also employs a maximum size even with this approach, so that, for example, a second chunk is created with the same time interval as the first chunk if the size is approached or exceeded on the first chunk, and the query planner 425 writes new data to only one of the chunks. Once a second chunk is created, the database system may rebalance data from the first to second chunk. In another embodiment, rather than overlap the time intervals of the first and second chunk, the first chunk's end time is modified when the second chunk is created so that they remain disjoint and their time intervals can be strictly ordered. In another embodiment, the database system performs such changes asynchronously, so that an over-large chunk is split into a first and second chunk as a "background" task of the system. Further, in another embodiment, this second chunk is created when an insert occurs to a time value that is sufficiently close to the end of a chunk's time range, rather than only when a record's dimension attributes (e.g., time) fall outside the dimensions of any existing chunks. In general, many of the variations of the database system's chunk management may be performed either synchronously at insert time or asynchronously as a background task. Size- and interval-based chunking is further described below.

In an embodiment, the chunk creation module 450 performs collision detection to ensure that the new chunks(s) have sets of dimension attributes that are disjoint from existing chunks. For example, assume that the chunk creation module is creating chunks with a time range spanning 24 hours. If the previous chunk stored data with time attribute values until midnight (exclusive) on a date January 1, the chunk creation module 450 next creates chunks with time attribute values from midnight (inclusive) on January 2 to the following midnight (exclusive). As another example, if the chunk creation module 450 is creating chunks with 18-hour intervals of time attribute, if the previously created chunk covered a time interval from midnight to 3 am, the chunk creation module 450 next creates a new 18-hour chunk spanning a time interval from 3 am to 9 pm for the time attribute. The chunk creation module 450 can create multiple chunks having the same time range but having different sets of values for other dimension attributes.

The chunk creation module 450 may adjust chunk boundaries based on various criteria, some of which may be conflicting. As an example, consider that the database system has one chunk with a time interval that ends at 3 am, and another chunk from noon to the following midnight. The database system may next receive a request to insert a record having a time attribute value of 4 am. Even if the chunk creation module 450 may be creating chunks with a time range spanning 12 hours, in this scenario, the chunk creation module 450 may create a new chunk spanning only a 9 hour time interval from 3 am to noon in order to enforce disjointness. In some embodiments, the chunk management module 170 determines after a chunk is created that the ranges (or set of values) of the chunk are likely to overlap other chunks created. In these embodiments, the chunk management module 170 modifies the existing ranges of the chunk to ensure that the ranges are disjoint from other chunks.

In some embodiments, across different partitions, the database system may align chunk start and end times or maintain them independently. In other words, the system may create and/or close all of a hypertable's chunks at the same time, or different partitions can be managed distinctly from one another. In other embodiments, there may be special overflow chunks where data that cannot be placed in some existing chunks is placed either temporarily or permanently.

The system architecture illustrated in these figures (for example, FIGS. 1-4) are meant to be illustrative; other embodiments may include additional or fewer components, some of these components might not always be present (e.g., a query parser or cache), or these components may be combined or divided in a variety of way (e.g., the query planner, query optimizer, and execution engine). It is understood that such a representation or division would not change the overall structure and function of the database system. For example, one would understand that the methods described herein could be implemented in a system that includes one component performing both query planning and executing, or in a system that includes a separate component for planning, which then passes the plan to an executor engine for execution.

The conversion engine 250 determines which regions of data in the first representation from a first table or hypertable need to be converted, performs the conversion over regions of this data to convert a set of one or more rows in the first representation to a set of one or more rows in the second representation according to a conversion policy, and writes the result in the second representation to a second table or hypertable. These first and second hypertables can also be standard database tables, partitioned tables, or other types of storage structures, as described herein. The conversion engine can also use a single hypertable or table for the first and second representations, and not distinct first and second hypertables or tables. In a preferred embodiment, the conversion engine 250 is run in a background process on a schedule, but in another embodiment can be run manually through a user-initiated or administrator-initiated command or as part of the logic of another system component.

When executing, the conversion engine 250 first figures out what regions of data in the first representation to convert from the first representation to the second representation. For example, if the last conversion has converted all data in the first representation up to 10 minutes ago, then the conversion engine 250 can decide to convert everything for the last 10 minutes, or it can decide to convert data from 10-minutes ago to 5-minutes ago, leaving the last 5-minutes yet in the first representation. The latter approach of leaving the most recent interval in the first representation is often taken for time-series data since such workloads often heavily modify the recent time period. In an embodiment, the conversion engine 250 will also read change information (such as records from a change log or change operations stored alongside data in the second representation) to choose a region to re-convert in order to update the data in the second representation with change operations (including inserts, updates, and deletes) that had taken place to the data since it had been converted to the second representation.

Once the conversion engine 250 decides which regions to convert, it starts to execute the conversion. To do so, in some embodiments, the conversion engine 250 takes locks on the table storing data in the first representation, table storing data in the second representation, and/or metadata (or records similar information), so that other database processes know that a conversion is ongoing. This approach may be used to protect the system from having two conversion processes run at the same time or from having another process modify the table storing data in the first representation, table storing data in the second representation, or metadata.

Once ready to execute (e.g., it holds any necessary locks on the table or tables), the conversion engine 250 reads data stored in first representation from a first table, performs computations needed to generate data in the second representation based on data in the first representation, and write the computed data in the second representation out to a second table. Finally, the conversion engine 250 updates any metadata (e.g., the completion threshold) with information about the state of the converted data.

In some embodiments, different aspects of the conversion process may be automated or automatedly tuned according by evaluating usage and usage patterns. For instance, in embodiments in which conversions are calculated in background jobs, the frequency at which jobs are run may be tuned to achieve an ideal balance between resource utilization and conversion lag. As another example, the conversion lag interval may be tuned based on the query and insert workload characteristics.

Details of processes and steps related to invalidation are further described herein.

Inserting Data in a Hypertable

Figure 5:
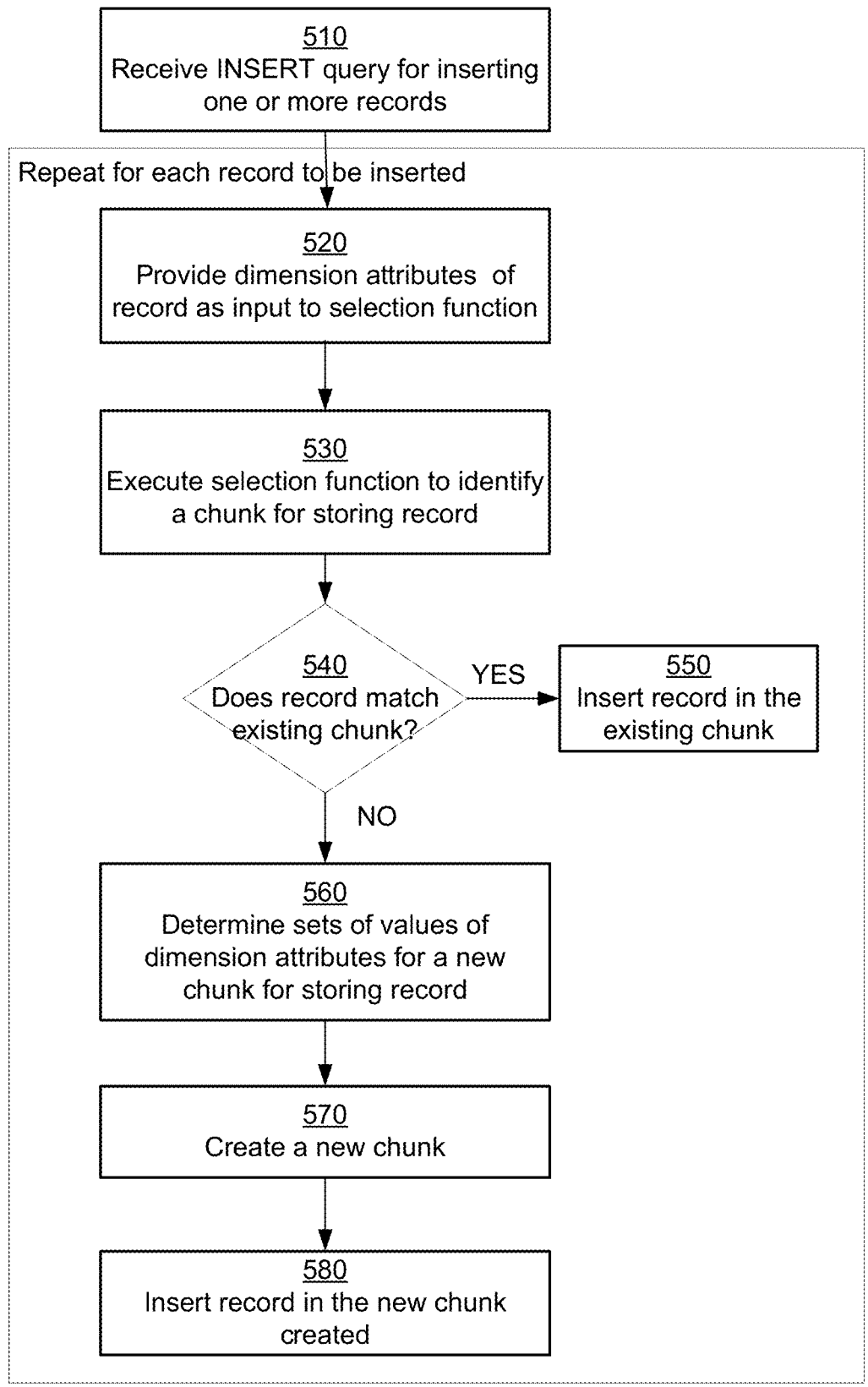
FIG. 5 illustrates the process of inserting records into a hypertable stored across a plurality of database system nodes, in accordance with an embodiment.

FIG. 5 illustrates the process of inserting records into a hypertable stored across a plurality of database system nodes, in accordance with an embodiment. The database system 110 receives 510 an insert query (which we also call an insert request). The insert query identifies a database table, for example, a hypertable, chunk, or a standard non-partitioned database table and specifies one or more records to be inserted into the database table. The database system 110 may store records as a hypertable comprising a plurality of chunks, each chunk stored in a distinct location.

Upon receiving 510 the insert query, the query parser 415 parses the insert query. The query planner 425 processes the query, and determines if the query specifies a hypertable, chunk, or a standard non-partitioned database table. If the insert query specifies a standard database table or a chunk, the query planner 425 executes the insert on the specified chunk or the standard database table in conjunction with the execution engine 435 and returns the result(s).

If the query specifies a hypertable, the query processor 130 performs the following steps for each record specified in the insert request. The query processor 130 identifies the values of the dimension attributes in the input record. The query processor 130 determines whether the input record should be stored in an existing chunk or in a new chunk that needs to be created. In an embodiment, the query processor 130 determines whether the one or more dimension values of the input record map to values from the set of dimension attribute values of existing chunks storing data of the hypertable; this determination is made to decide whether the record can be stored in an existing chunk.

In an embodiment, the query processor 130 provides 520 the dimension attributes as input to a selection function of the chunk selection module 445 that determines whether the record should be stored in an existing chunk or whether a new chunk needs to be created for storing the record. If the selection function finds an existing chunk that matches the record, the selection function outputs information identifying the existing chunk. If the selection function determines that none of the existing chunks can be used to store the record, the selection function outputs a value (for example, a negative number) indicating that a new chunk needs to be created. The chunk creation module 450 determines 540 based on the output of the selection function, if the record matches an existing chunk. If the chunk creation module 450 determines 540 that the record matches an existing chunk, the chunk selection module 445 also identifies the location of the existing chunk, for example, whether the existing chunk is local (i.e., on the current database system node) or remote (i.e., on another database system node). This location can specify a location explicitly or implicitly, including specifying a name of a local database table, the name of a remote database table, the name or network address or a remote server, and so on. Accordingly, the query processor 130 inserts 550 the record in the existing chunk.

If the chunk creation module 450 determines 540 based on the output of the selection function that a new chunk needs to be created for storing the record, the chunk creation module 450 determines 560 a configuration of the new chunk comprising sets of values corresponding to different dimension attributes for the new chunk. The chunk creation module 450 may further identify a location for creating the new chunk (including identifying a specific storage device or instead identifying a specific database system node, wherein the identified node in turn identifies a specific storage device attached to it). The chunk creation module 450 creates a new chunk based on the configuration of the new chunk and the identified location. The query processor 130 inserts 580 the record in the new chunk that is created.

The chunk selection module 445 may determine that a record cannot be inserted in an existing chunk based on various criteria. A record cannot be inserted in any existing chunk if the dimension attributes of the record do not match the configurations of any existing chunks. In some embodiments, even if the dimension attributes of the record match the configuration of an existing chunk, the chunk selection module 445 may determine that the record cannot be inserted into the chunk based on certain policy considerations. For example, the chunk selection module 445 may determine that the existing chunk is storing more than a threshold amount of data and no new records should be added to the chunk. Accordingly, the chunk selection module 445 determines that the record cannot be added to the existing chunk and the database system cannot insert the record in any existing chunk.

To create a chunk locally or to insert the record in a chunk stored locally, i.e., on the current database system node executing the above steps, the database system may perform a function call. To create a chunk remotely or to insert the record in a chunk stored remotely, i.e., on a database system node different from the current database system node, the database system may perform a remote call, for example, a remote procedure call (RPC) or a remote SQL query execution. The instructions executed for creating a chunk or inserting a record into a chunk may also depend on the location of the chunk, for example, the type of storage medium used for storing the chunk.

Although FIG. 5 describes the steps in terms of a selection function, other embodiments can use different functions to compute different values, for example, a first function to determine whether the record should be stored in an existing chunk and a second function to describe a new chunk if the first function determines that the record cannot be stored in any existing chunk.

If multiple chunks reside on the same location, rather than using a separate message for each insert query, the query processor 130 may send multiple queries in a single message, or it may also send the multiple records to be inserted in a single query in a single message. If the chunks involved in an insert query reside on multiple nodes, in some embodiment the database system node contacts a query or transaction coordinator for additional information that is used and/or transmitted when subsequently communicating with other database nodes as part of the insert process.

In some embodiments, the query processor 130 handles a lack of a timely response or an error in a variety of ways. If a chunk is replicated between multiple nodes, or the record-to-chunk determination process results in more than one chunk, the query processor 130 issues an insert request to one or more of these chunks, discussed further. Finally, the query planner 425 collects any result(s) or status information from the insert queries, and returns some result(s) or status information to the requester.

In some embodiments, the database system 110 performs several steps to determine the chunk to which a record belongs, many of which involve using metadata. First, the query planner 425 determines the set of one of more partitions that belong to the hypertable at the time specified by the record (i.e., the value of the record's time attribute). If this partitioning is static, the query planner 425 uses metadata about the hypertable itself to determine this partitioning.

If this partitioning changes over time, the query planner 425 uses the record's time attribute to determine the set of partitions. In one embodiment, this determination involves first using the row's time attribute value to determine a particular epoch (time interval), then using this epoch to determine the set of partitions. This partitioning may change in the context of system reconfiguration (or elasticity) as described below. Second, the query planner 425 determines the partition (from amongst this set of one or more partitions) to which the record belongs, using the value(s) of the record's dimension attribute(s). For each of the dimension attributes used for partitioning in the hypertable, this step may involve applying some function to its value to generate a second value. A variety of functions may be employed for this purpose, including hash functions (e.g., Murmur hashing, Pearson hashing, SHA, MD5, locality-sensitive hashing), the identity function (i.e., simply return the input), a lookup in some range-based data structure, or some other prefixing or calculation on the input. Third, using this second value (the function's output), the query planner 425 determines to which partition the second value belongs. For example, this step could involve a range lookup (e.g., find the partition [x, y] such that the second value is between x and y, inclusive and/or exclusive), a longest-prefix match on the partition (determine the partition that, when represented by some binary string, has the greatest number of most significant bits that are identical to those of the second value), taking the second value "mod" the number of nodes to determine the matching partition number, or the use of consistent hashing, among other matching algorithms. If the hypertable is partitioned using more than one key, then a function could be applied to more than one input (or functions could be separately applied to multiple inputs), leading to one or more second values (outputs) that would be used to determine the partition to which a record belongs. Finally, each partition for each dimension is associated to a set of chunks (i.e., those chunks which store this partition yet may differ in their time ranges); the query planner 425 then determines a chunk from this set based on the record's time attribute.

Other embodiments implement the step of determining the chunk to which a record belongs in alternate ways. For example, the database system skips the process of first determining a record's chunk based on its epoch, and instead first determines a set of chunks associated with the record's time. The query planner 425 computes a function on the record's partition key(s) to determine the second value(s), and compares this second value against the partition information associated with each chunk in order to select one. These processes can be implemented via a variety of data structures, including hash tables, linked lists, range trees, arrays, trees, tries, etc.

There are a variety of other optimized ways to implement the process by which the query planner 425 inserts a batch's data into chunks, without changing its basic functionality. For example, rather than performing all these steps for every record, the query planner 425 can cache information it determines during its per-record analysis, such as the hypertable's chunks for a given time or time period.

Other embodiments perform the steps for processing a batch in different ways. For example, after determining the first record's chunk, the query planner 425 scans through the rest of the batch, finding all other records associated with the same chunk (if any exist). The query planner 425 then inserts these records into the selected chunk, and deletes them from the batch. The query planner 425 then repeats this process: selecting a record in the (now smaller) batch, scanning the rest of the batch to find records with a similar chunk association, sending that set of one or more records to the second chunk, and then repeating this process until the batch is empty.

In an embodiment, when inserting data into a chunk, the query planner 425 determines whether a record to be inserted into an identified chunk is to a region of a chunk stored in the first representation (e.g., because its newer than the completion threshold or because of other associated metadata), and then writes the record to the chunk according to the first representation. If the record to be inserted into an identified chunk is to a region of a chunk stored in the second representation, then the query planner 425 either returns an error, fails silently, causes the region to be decompressed and the new record subsequently added to the decompressed data, or the record to be inserted to a change log or other metadata or data structure associated with the chunk, according to various embodiments. In some embodiment in which the data stored in the second representation is decompressed in order to synchronously insert the new record, the data is maintained in the columnar form associated with the second representation (but now uncompressed) when inserting the new record(s). In other embodiment, the data is converted to the first representation before inserting the new record(s). In some embodiment, after inserting an individual record or records belonging to a batch, the database system immediately recompresses the region or reconverts the data from the first representation back to the second representation; in other embodiment, this recompression or reconverting happens at some later time.

The insertion process above describes a record as being associated with a single chunk. Alternatively, a record could map to multiple chunks. For example, the chunking process might create more than one chunk during a particular interval (e.g., if the size of inserted data exceeds some threshold), as described herein, in which case the selection function chooses one, e.g., randomly, round robin, or based on their sizes. As another example, the database chooses to insert the record into multiple chunks to replicate data for reliability or high availability. Such replication can be performed by the query planner 425 as part of the same steps described above, or the query planner 425 first inserts each of the records into a primary chunk, and then the database system 110 replicates the inserted record to the chunk's replica(s).

In an embodiment, the database system 110 replicates the chunks such that different chunks of the same hypertable may be stored with a different number of replicas. Furthermore, the database system may determine the number of replicas for a chunk based on the age of the chunk. For example, recent chunks may be replicated a greater number of times than older chunks. Furthermore, older chunks that have more than a threshold age may not be replicated. The database system 110 may determine the age of a chunk based on the values of the time attribute of the chunk. For example, a chunk that stores records having time attribute within a range [t1, t2] may be determined to be older than a chunk that stores records having time attribute within a range [t3, t4] if the time range [t1, t2] is older than the time range [t3, t4], for example, t2<t3. Alternatively, the age of the chunk may be determined based on the time of creation of the chunk. For example, a chunk created a week ago has an age value that is greater than a chunk created today.

In an embodiment, the database system replicates different chunks to locations having different characteristics. The database system selects a location having particular characteristics based on the configuration of the chunk. For example, the database system stores and/or replicates recent chunks which are regularly being accessed (for inserts or selects) on fast storage media (e.g., SSDs), while the database system stores and/or replicates old chunks on slower storage media (e.g., HDDs).

In an embodiment, the database system reuses replication techniques that apply to the database's underlying tables, namely, physical replication of the entire database and cold/hot standbys, logical replication of individual tables, as well as backups. It also uses the database's write-ahead log (WAL) for consistent checkpointing. In other words, even though replication or backup policies are defined (or commands issued) on the hypertable, the system performs these actions by replicating or checkpointing the hypertable's constituent chunks. In another embodiment, replication and high availability is implemented directly by the database system by replicating writes to multiple chunk replicas (e.g., via a two-phase commit protocol), rather than by using the database's underlying log-based techniques.

In an embodiment, the database system allows different policies to be defined based on chunk boundaries, e.g., a higher replication level for recent chunks, or a lower replication level on older chunks in order to save disk space.

In an embodiment, the database system also moves chunks between locations when they age (e.g., from being stored on faster SSDs to slower HDDs, or from faster or larger servers to slower or smaller servers). The database system associates each hypertable with a threshold age value. The database system further associates locations with types. For example, different types of locations may have different access time, different storage capacity, different cost, and so on. If the database system identifies a chunk of the hypertable having an age value greater than the threshold age value of the hypertable, the database system moves the identified chunk from a location having a particular type to another location having a different type. As a result the database system may store different chunks of the same hypertable in different types of location. Furthermore, the database system automatically changes the mapping of the chunks of the hypertable to locations over time as newer chunks are received and existing chunks get older. In another embodiment, this movement only happens when requested by a command (e.g., from an external process or database user), which specifies the age associated with the hypertable and the locations between which to move any selected chunks.

In an embodiment, the database system defines its conversion policy on the locations that the data or chunks are stored. For example, certain locations may store data in the first representation, while other locations may store data in the second representation. In some embodiment, the database system may also tie the conversion policy against policies related to moving data between locations, so that in conjunction with identifying a chunk of the hypertable having an age value greater than the threshold age value of the hypertable, the conversion engine also converts data in a chunk from the first representation to the second representation as it is moved from a first location to a second location. In an embodiment, the database system associates locations with conversion policies, such that any data that is written or moved to the location is converted according to the given policy.

In an embodiment, the conversion policy also associates different compression algorithms or settings based on a different thresholds or ranges of the data. This allows the database engine to employ, for example, increasingly aggressive compression algorithms or settings as the data ages; such algorithms or settings are more expensive to compute but yield greater space savings. For instance, the database system may divide table data into three regions based on time: (i) the most recent data (e.g. more recent than 30 minutes), (ii) intermediate data (e.g. up to a day ago), and (iii) older data (e.g. older than 1 day). For the most recent data, the database system may not convert anything and store it in the first representation. For intermediate data, the system can employ weaker compression that is relatively cheap to compute. Finally, for older data, the database system can employ stronger compression. In such scenarios, when converting data from the first (recent) region to the second (intermediate) region, the conversion engine operates to convert the data from the first representation to the second representation as described. When converting data from the second (intermediate) region to the third (older) region, the conversion engine does not need to rewrite the form of the data—it's already stored in the second representation—but instead uncompresses the columns of data according to the compression algorithms or settings employed with data in the second region, then recompresses the columns of data according to the compression algorithms or settings employed with data in the third region. In some embodiments, different strategies are defined on a per-chunk basis within a hypertable or differently across different locations.

Processing Queries Reading Data

Figure 6:
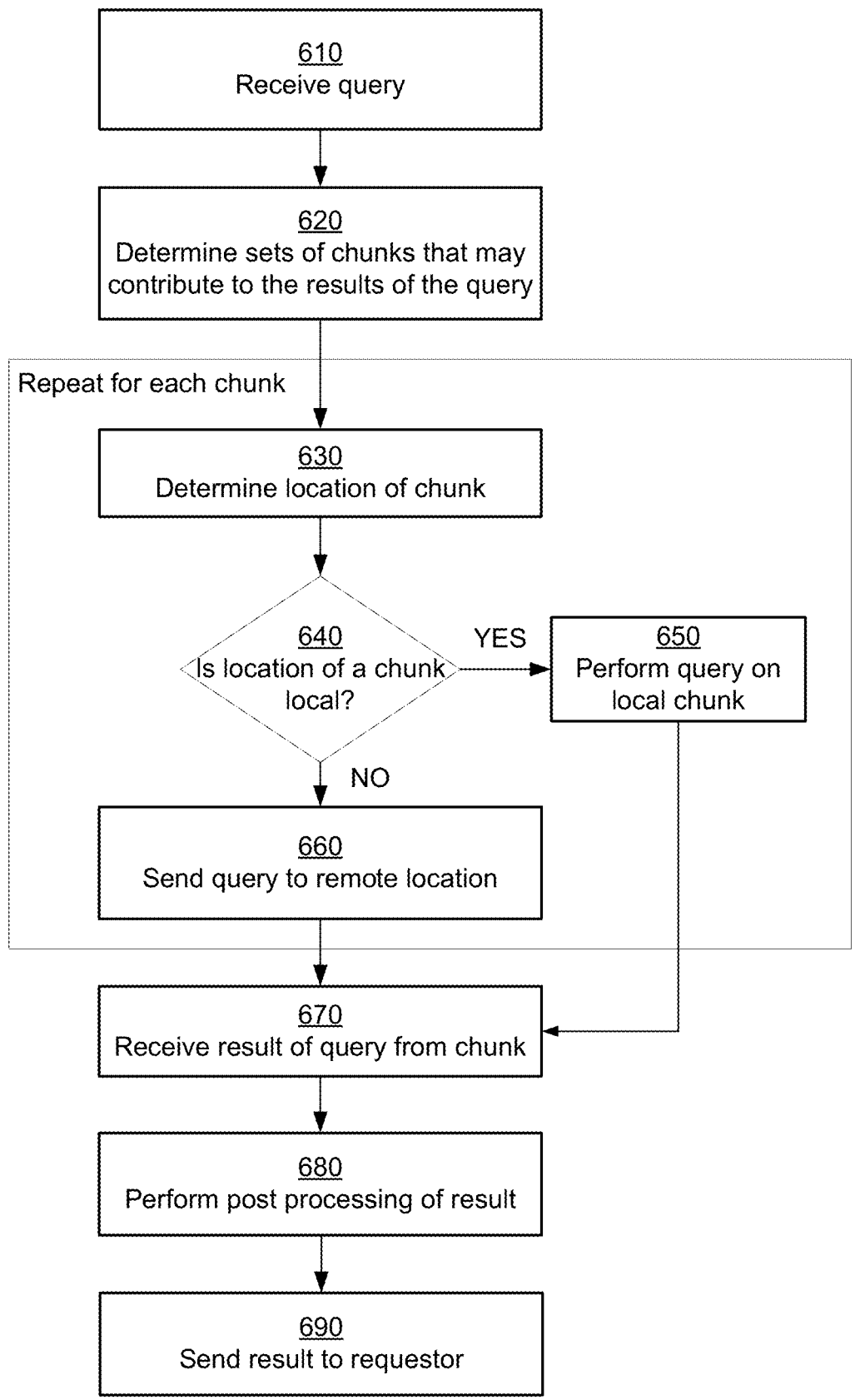
FIG. 6 is a flowchart of the process of executing a query for processing records stored in a hypertable, in accordance with an embodiment.

FIG. 6 is a flowchart of the process of executing a query for processing records stored in a hypertable, in accordance with an embodiment. The database system receives 610 a query for reading data (e.g., via a SELECT statement in SQL). Upon receiving a query, the query parser 415 parses the query (optionally using a cache of parsed queries). The query planner 425 processes the query and determines if any table specified in the query corresponds to a hypertable, chunk, or a standard non-partitioned database table. The database system performs the following steps in these different scenarios, each resulting in some result being returned to the requester (or some form of error if any problems occur).

For every hypertable specified in the first query, the query planner, in conjunction with the execution engine 435, performs the following steps. First, the query planner 425 analyzes the query to determine 620 the set of chunks that may contribute results to the query's answer. This analysis typically involves the constraints specified by the query's predicates as well as metadata that the database system 110 maintains about chunks. For example, these constraints may be based on the value of a particular field (e.g., selected rows must have a device identifier that equals either 100 or 450), or they may include some type of time range (e.g., selected rows must specify that their time value is within the past hour, or between July 2016 and August 2016). Metadata stored about each chunk may specify, among other things, the range of time and any other partitioning key(s) associated with a particular chunk. For example, a chunk might be storing the last day of data for device identifiers between 0 and 200. These examples are simply illustrative and a variety of techniques that the system may employ are described herein. The query planner 425 uses the metadata to determine the appropriate chunks, e.g., a device identifier of 100 will be associated with the chunk storing device identifiers between 0 and 200.

The following steps 630, 640, 650, and 660 are repeated for each chunk determined. The query planner 425 uses metadata to determine the location(s)—e.g., storage devices such as local or network-attached disk(s), or other database system node(s)—at which these chunk(s) are being stored. These chunks may be stored on a location local or remote to the query planner 435. The query planner 425 determines 640 whether the chunk is stored locally or on a remote server. If the query planner 425 determines that the chunk is stored in a local location, the query planner 425 queries the local chunk (e.g., via direct function calls) or else the query planner 425 sends 660 a query to the remote location storing the chunk (e.g., by issuing SQL queries such as via foreign data wrappers, by sending remote procedure calls (RPCs), etc.). Furthermore, the query planner 425 may change the query execution or plan depending on the properties of the location that stores them (e.g., type of disk or node). When multiple chunks share the same location, the query planner 425 can generate a single query for the location's set of chunks or a separate query per chunk, and these separate queries can be sent in a single message to the location or as a separate message per query.

The query planner 425 issues queries to these locations and waits for their results. If some locations are not responding after some time or return errors, the query planner 425 can take several different options, including retrying a query to the same location, retrying a query to a different location that replicates the chunk, waiting indefinitely, returning a partial result to the client, or returning an error. The query planner 425 receives 670 or collects the results of these queries and merges the results. Depending on the query, the results, metadata, and additional information, the query planner 425 optionally may determine that it needs to query additional chunks to resolve the first query (e.g., when "walking back in time" from the latest time interval to older intervals in order to find some number of values matching a particular predicate).

If the query planner 425 attempts to read rows of data stored in the second representation, the query planner 425 will determine which columns of the rows are needed to satisfy the query, decompress at least those columns from the appropriate rows, and determine which data or elements from within the rows should be computed on, aggregated, or returned as a result of executing the query. In some embodiment, this decompression is performed in-place in memory or storage; in other embodiment, the database system decompresses the data to a separate portion of memory or disk. In certain embodiments, the query planner uses additional metadata or statistical data stored about the compressed rows to determine whether the rows contain data or elements which will match the query prior to decompressing the columns, and thus avoid this decompression if no matches will be found. In other embodiments, certain queries can be resolved using this metadata or statistical data directly and thus no decompression is needed to answer such queries.

If the query specifies ranges of data that correspond to data stored in both the first and second representation (e.g., the query specifies data from a time range, and different records stored in the first and second representations both include timestamps falling within this range), then the query planner 425 will access and process data stored in both the first and second representations to satisfy this query, as is the case for the query illustrated in FIG. 12. In such scenarios, any rows of data stored in the second representation will be decompressed and evaluated in order to satisfy this query as described herein.

An example of the query plan in such a scenario is illustrated with the following example, where two of the chunks of a hypertable contain data stored in the first representation, while one chunk contains data stored in the second representation:

EXPLAIN (costs off) SELECT*FROM raw_compressed;
QUERY PLAN
Append
→Seq Scan on_hyper_2_6_chunk
→Seq Scan on_hyper_2_7_chunk
→Custom Scan (DecompressChunk) on_hyper_2_8_chunk
→Seq Scan on_hyper_2_8_chunk
(5 rows)

Depending on the query, the query planner 425 may perform 680 post-processing of the results. Such post-processing includes taking a union over the returned results, performing an aggregation like a SUM or COUNT over the results, sorting the merged results by a specific field, taking a LIMIT that causes the system to only return some number of results, and so on. It may also involve more complex operations in merging the chunks' results, e.g., when computing top-k calculations across the partial results from each chunk. Finally, the system returns the result(s) of this first query. The result of the query may comprise one or more tuples or an error code if the processing of the query resulted in an error.

In some embodiment, a query across multiple database nodes may also involve the use of a query or transaction coordinator, such that the coordination is contacted for additional information that is used and/or transmitted when subsequently communicating with other database nodes as part of the query process.

A node may also receive a query to a chunk or chunks, e.g., because it is the recipient of a query generated by the processing of the first query to a hypertable. For every chunk specified in the query, the query planner 425 performs the following steps. The query planner 425 plans and executes the query on the local chunk. This uses query planning techniques including choosing and optimizing the use of indexes, performing heap scans, and so forth. The query planner 425 receives the results of the query. Third, depending on the query, the query planner 425 may also post-process the results (e.g., sorting the data, performing an aggregation, taking the LIMIT, etc. as described above). It then returns the query's result(s).

A database system node may receive a query to a traditional database table, which involves processing the query in a standard way: planning and executing the query on the specified table, receiving the results, post-processing the results optionally, and returning the result(s).

The query may also specify multiple tables or joins between tables. The database system's processing depends on the types of tables specified (e.g., hypertables, chunks, standard non-partitioned tables) and is related to the steps above, although individual steps may differ or additional steps may be required based on the actual query.

Alternative Embodiments for Processing Queries Based on Hypertables

Ideally database users should be able to interact with time-series data as if it were in a simple continuous database table. However, for reasons discussed above, using a single table does not scale. Yet requiring users to manually partition their data exposes a host of complexities, e.g., forcing users to constantly specify which partitions to query, how to compute JOINs between them, or how to properly size these tables as workloads change.

To avoid this management complexity while still scaling and supporting efficient queries, the database system hides its automated data partitioning and query optimizations behind its hypertable abstraction. Creating a hypertable and its corresponding schema is performed using simple SQL commands, and this hypertable is accessed as if it were a single table using standard SQL commands. Further, just like a normal database table, this schema can be altered via standard SQL commands; transparently to the user, the database system atomically modifies the schemas of all the underlying chunks that comprise a hypertable.

In an embodiment, the database system provides this functionality by hooking into the query planner of a relational database like PostgreSQL, so that it receives the native SQL parse tree. It uses this tree to determine which servers and hypertable chunks (native database tables) to access, how to perform distributed and parallel optimizations, etc.

Many of these same optimizations even apply to single-node deployments, where automatically splitting hypertables into chunks and related query optimizations still provides a number of performance benefits. This is especially true if the chunks are distributed across the various locations of a node (e.g., across multiple local or network-attached disks). In an embodiment, the placement of chunks on database nodes is specified by commands or policies given by database administrators or users.

In an embodiment, the database system partitions its hypertable in only a single dimension—by time—rather than two or more dimensions (for example, time and space dimensions). For example, partitioning based on a single time dimension may be used for deployments of the database system on a single node rather than a cluster of nodes.

Additionally, hypertables can be defined recursively. In particular, a hypertable's chunk can be further partitioned (by the same or different partitioning key, and with the same or different time intervals) and thus act like another hypertable.

Chunks are dynamically created by the runtime and sized to optimize performance in both cluster and single-node environments. Partitioning a hypertable along additional dimension attributes (in addition to time) parallelizes inserts to recent time intervals. Similarly, query patterns often slice across time or space, so also result in performance improvements through chunk placements disclosed herein.

The placement of these chunks can also vary based on deployment, workload, or query needs. For example, chunks can be randomly or purposefully spread across locations to provide load balancing. Alternatively, chunks belonging to the same region of the partitioning field's keyspace (for example, a range of values or hashed values, or a set of consecutive values of the key), yet varying by time intervals, could be collocated on the same servers. This avoids queries touching all servers when performing queries for a single object in space (e.g., a particular device), which could help reduce tail latency under higher query loads and enable efficient joins.

The database system determines where a chunk should be placed when it is created; this determination is based on a variety of one or more metrics, including performed randomly or via a round-robin distribution strategy, based on server load (e.g., request rate, CPU utilization, etc.), based on existing usage (e.g., size of existing chunks in bytes or number of rows), based on capacity (e.g., total memory or storage capacity, free memory, available storage, number of disks, etc.), based on configured policy or specified by an administrator, and so forth. The database system or administrator may also choose to relocate (move) or replicate chunks between servers.

Even in single-node settings, chunking still improves performance over the vanilla use of a single database table for both read and write queries. Right-sized chunks ensure that most or all of a table's indexes (e.g., B-trees) can reside in memory during inserts to avoid thrashing while modifying arbitrary locations in those indexes. Further, by avoiding overly large chunks, the database system avoids expensive "vacuuming" operations when removing data, as the system can perform such operations by simply dropping chunks (internal tables and/or files), rather than deleting individual rows. For example, this removal may be the result of data deletions (e.g., based on automated data retention policies and procedures), or it may be the result of a large batch insert that fails or is interrupted (which the non-committed rows needing to subsequently be removed). At the same time, avoiding too-small chunks improves query performance by not needing to read additional tables and indexes from disk, or to perform query planning over a larger number of chunks.

The database system considers a few factors for determining a chunk's size. First, the database system maintains metadata that specify the number of partitions into which an additional partitioning field splits a particular time interval. For example, 10 machines each with 2 disks might use 20 partitions (or multiple partitions per server and/or disk). This implies that the keyspace of a particular field (e.g., a device ID, IP address, or location name) is divided into 20 ranges or sets. The database system then determines to which range (or partition) a particular value is associated by performing a lookup or comparison process. In one embodiment, the field is a string or binary value, and the database system splits the keyspace by prefix of the values of the field, then maps a value to one of these partitions based on the partition that shares the longest common prefix. Alternatively, the database system uses certain forms of hashing, such that the hash output's space is divided again into a particular number of ranges or sets (e.g., contiguous ranges, sets defined by splitting the entire hash output space, sets defined by taking the hash output space "mod" the number of nodes, sets defined by consistent hashing, etc.). The database system applies a hash function to the input value to yield an output value; the database system determines the range or set that includes the output value, which then corresponds to the partition to which the input value belongs. The database system may use a variety of functions in such a context, including hash functions (e.g., Murmur hashing, Pearson hashing, SHA, MD5, locality-sensitive hashing), the identity function (i.e., simply return the input), or some other prefixing or calculation on the input.

Second, once the number of partitions based on partitioning keys is determined and in fact, this number can change over time due to elasticity, discussed below-then the time-duration of the chunk also determines its size. For a constant input rate and some given number of partitions, a chunk with a hour-long time interval will typically be much smaller than one with a day-long interval.

In one embodiment, the database system makes the time intervals static or manually configurable. Such an approach is appropriate if the data volumes to the system are relatively stable (and known), and this provides the database administrator or user with control over the database system's operation. But, such fixed time intervals may not work as well as data volumes change—e.g., a time interval appropriate for a service pulling data from 100 devices is not appropriate when that system scales to 100,000 devices—or require care that the administrator or user change interval sizes over time (either to apply to future intervals or to split existing intervals into multiple chunks).

In one embodiment, the database system determines chunks' time intervals dynamically based on chunk sizes, rather than based on a fixed time interval. In particular, during insert time, the database system determines if a chunk is approaching or has exceeded some threshold size, at which time it "closes" the current chunk and creates a new chunk (e.g., by using the current time as the ending time of the current chunk and as the starting time of the new chunk).

This threshold size is given a default in software configuration, this default can be configured by the database system administrator, and this size can be changed by the administrator or the database system's logic during runtime (so that chunks in the same database system can have different threshold sizes). In an embodiment, the database system choses the size as a function of the system's resources, e.g., based on the memory capacity of the server(s), which may also take into account the table schema to determine the amount of indexing that would be needed and its size requirements. This tuning takes into account realized or potential changes in the schema over time. For example, if indexes are added to many fields (columns), the amount of memory needed to store these fields changes, which leads the database system to use smaller chunks; if many fields are not indexed, the database system may account for these differently than a schema without any unindexed fields (as indexes may later be added to these fields to enable more efficient queries). Alternatively, recognizing that the database ultimately stores tables in files in the underlying file system that have a maximum size (e.g., 1 GB), the system ensures that the chunk size is smaller than this maximum size. In an embodiment, the size is chosen as a measured or estimated result of read/write performance on the chunk size.

In some embodiments, the database system creates a new chunk even when the current chunk size is less than some threshold (i.e., it is "approaching" the threshold, and has not yet exceeded or equaled it), in order to leave some "free space" for the possibility of out-of-time-order data that the database system must backfill into an older chunk. When writing to an older or "closed" chunk, different embodiments of the database system allow the chunk to grow arbitrarily large, create a new overlapping chunk just for the newly written excess data, or split the existing chunk into two, among other approaches. If overlapping chunks are created, the database system follows its policies for writing and reading to overlapping chunks.

In another embodiment, the database system determines a chunks' time intervals dynamically based on historical intervals and their sizes. In this case, new chunks are created with an end time, but that end time is automatically set by the database system based on the resulting size of earlier chunks that had a certain interval duration. For example, if the database system (or user or administrator) desires chunks of size approximation 1 GB, and the previous 12 hour chunk resulted in a chunk of size 1.5 GB, then the database might create a subsequent chunk of size 6 hours. The database system can continue to adapt the intervals of chunks during its operation, e.g., to account for changing data volumes per interval, to account for different target sizes, etc.

In some embodiments, the database determines chunks based on a hybrid of time intervals and threshold sizes. For example, the database system (or administrator) specifies that a chunk have a pre-determined time interval—so that, as described above, the start and end time of a chunk are specified at creation time—but also that a chunk also have a maximum size in case the insert rate for that interval exceeds some amount. This approach avoids a problem with chunking based purely on fixed time-intervals in scenarios where system load per interval changes over time. If the chunk's size approaches or exceeds its maximum permitted threshold during the middle of the current time interval, the database system creates a new chunk that overlaps the same interval, or the database system switches to the use of a different time interval. For the former, both chunks represent the same interval, so inserts could choose to write to one of them (while reads query both of them). For the latter, the database system may change a chunk's time interval to something smaller, and create a new non-overlapping chunk to succeed it in time. As described earlier, such chunk management may be performed synchronously or asynchronously, e.g., a background task splits an over-large chunk into two chunks.

Such chunking may also limit the pre-determined time intervals to regular boundaries (e.g., 1 hour, 6 hours, 12 hours, 24 hours, 7 days, 14 days), rather than arbitrary ones (e.g., 11 minutes, 57 minutes). This embodiment causes chunk intervals to align well with periods of time on which data might be queried or deletions might be made, e.g., according to a data retention policy such as "delete data more than 12 hours old". That way, the database system implements such policies by dropping entire chunks once their records are all at least 12 hours old, rather than partially deleting individual rows within chunks: dropping entire chunks (database tables) is much more efficient than deleting an equivalent number of rows within a table.

The database system selects these boundaries in a manner that the boundaries compose well, e.g., they are multiples of one another or are aligned in some other ways. The switching between various interval sizes is performed automatically by the database runtime (e.g., in response to changing data rates) or through configuration by a user or administrator. Similarly, rather than always closing a chunk and creating a new one based on an automated policy, an administrator may signal the database system to create a new chunk or chunk interval via a configuration command.

In one embodiment, the database system also applies such adaptation of the chunk's configuration to non-time dimension attributes that are used to define a chunk's ranges. For example, if a hypertable's partitioning is also performed on a field representing a device id, the database system can increase the number of partitions (sets of values) defined on this field from 10 to 20. Such a change, which may be performed automatically by the database system or through configuration by a user or administrator, can be used to increase hypertable performance. For example, if queries typically specify a single device id from which to SELECT data, the query's latency can be improved if the chunks that contain the specified device include information about a fewer other devices, which can be made to occur by increase the number of partitions over the device id field.

In another embodiment, the database system can employ different time intervals across different partitions. For example, if a hypertable's partitioning is also performed on a field representing a customer id (e.g., where each distinct customer id is a separate partition), then the database system may independently maintain different time intervals (when partitioning on the time attribute) for different customer ids. Such an approach can be beneficial if different customers have very different insert and select query patterns, as well as different data retention needs.

In general, the database system employs a variety of methods for chunk management, given that there are multiple different goals and engineering trade-offs between approaches. These goals include optimizing sizes, aligning time intervals for dropping chunks while retaining data integrity, minimizing locking or other performance penalties due to mutability, avoiding arbitrary-sized intervals, creating chunk boundaries that are most advantageous for constraint exclusion, increasing system parallelism, improving query performance, and simplifying code, operation, and management complexity, among others. Different deployments of the database system may choose to use different approaches based on their setting and needs.

Adjusting Partitioning Policies in View of System Reconfiguration

The amount of data stored in a database systems 110 increases over time. For example, large amount of time series data may be received by a database system 110 and stored in database tables. Database systems 110 often reconfigure the system to increase the storage capacity, for example, by adding storage devices. Conventional systems adapt to the change in the system configuration by moving data. For example, a system may get reconfigured as a result of addition of new servers and may move some chunks of data from existing servers to the new servers, in order to ensure that the new servers are bringing additional capacity to the system. As a result, a large amount of data is moved, thereby making the system reconfiguration an expensive and time-consuming process. This new configuration of participating servers is also referred to as a "view" which represents the set of servers and their configuration, such as the servers' capacity or number of disks. The ability of a system to adapt to changes in computing resources so as to be able to effectively use all available resources if referred to as elasticity.

Embodiments of the database system 110 adapt to reconfiguration of the system without performing such data movement. In particular, the database system 110 provides elasticity by creating a new set of chunks and partitioning when the database system is reconfigured for increasing the storage capacity. The database system may use a different partitioning policy for the new set of chunks that are created after the system is reconfigured. For example, if the previous partitioning policy created 20 partitions for 10 servers, the new partitioning policy might create 30 partitions to take into account 5 new servers that are added to the database system. In another example, the previous partitioning policy may create 20 partitions to place 5 partitions on each of 4 servers, but when an additional 1 server is added, the new partitioning policy may then place 4 partitions on each of the 5 servers. In some embodiments, the database system distributes a plurality of chunks created such that new servers are assigned more chunks from the plurality of chunks than existing servers. This allows better balancing of load across the servers. In another embodiment, new servers are assigned larger chunks compared to chunks assigned to existing servers. Larger chunks have configuration that allows them to potentially store more data than smaller chunks. Data can still be read or written to previously created chunks or the newly created chunks. Because writes to time-series datasets are typically made to the latest time interval, and many query workloads also process recent data, load balancing across the new set of servers is still maintained, even without moving the existing data.

FIGS. 7(A-B) illustrate partitioning of data of a database table to adapt to the addition of locations to the database system according to an embodiment of the invention.

Figure 7A:
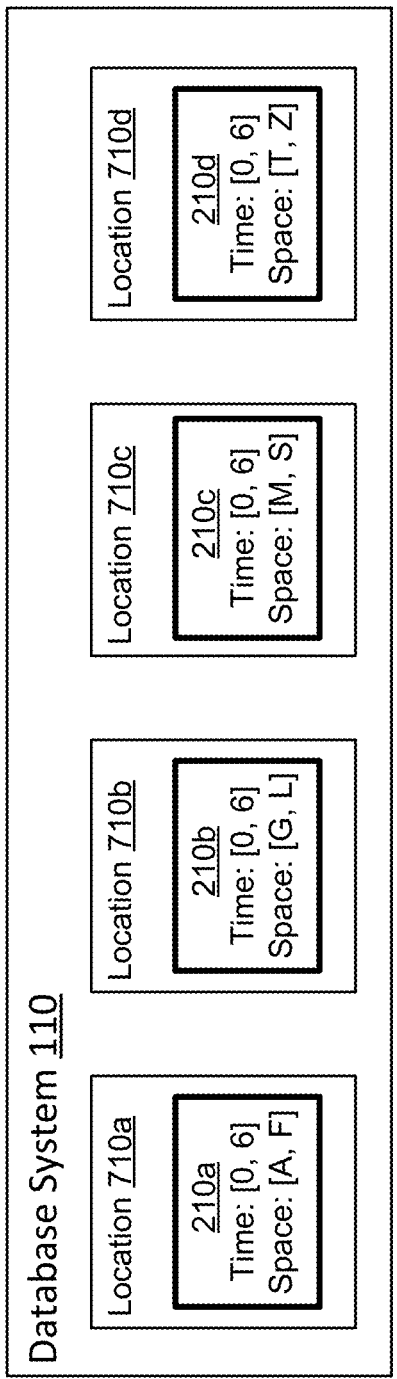
FIGS. 7(A-C) illustrate partitioning of data of a database table to adapt to addition of locations to the database system according to an embodiment of the invention.

As illustrated in FIG. 7(A), the database system 110 can have a plurality of storage locations 710a, 710b, 710c, and 710d. FIG. 7 illustrates the distribution of data of a database table with attributes comprising a time attribute and a space attribute (recall that we use the term "space" partitioning to signify any partitioning over a non-time attribute). In response to requests to insert records in the database table, the database system 110 distributes data of the database table according to a partitioning policy that assigns chunks 210 to locations 710. In the example, configuration shown in FIG. 7(A), the database system 110 creates a plurality of chunks including 210a, 210b, 210c, and 210d and assigns one chunk to each location. The chunks are distributed across the locations of the database system 110 along the time and space attributes. Accordingly, each chunk is associated with a time range and a space range and stores records that have time and space attributes that lie within the time and space ranges of the chunk. In the example configuration shown in FIG. 7, each of the chunks 210a, 210b, 210c, and 210d is associated with the same range of time attribute, i.e., [0, 6] but has a different range of the space attribute. For example, chunk 210a has space range [A, F], the chunk 210b has space range [G, L], the chunk 210c has space range [M, S], and the chunk 210d has space range [T, Z].

Figure 7B:
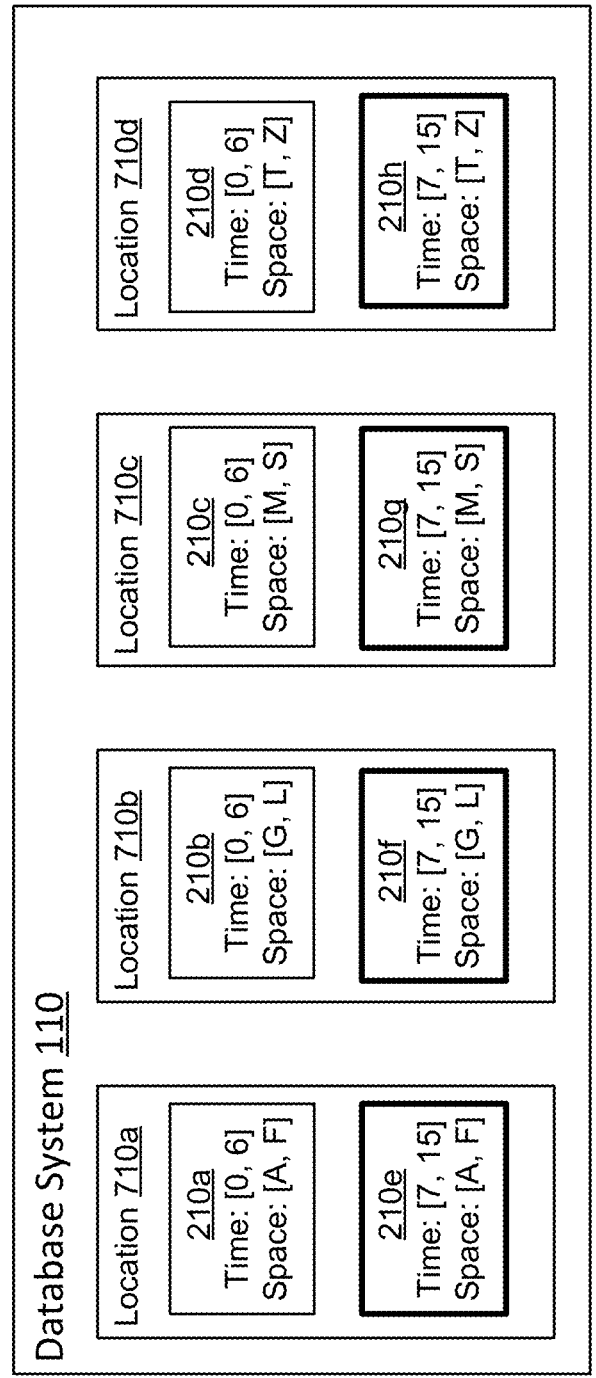

FIG. 7(B) shows the partitioning of the chunks of the database table after some time has passed, such that the database system has received requests to insert records with a time attribute later than 6. In response to receiving requests to insert records with a time attribute of 7, for example, the database system creates a new plurality of chunks, 201e, 210f, 210g, and 210h. The new plurality of chunks are distributed across the locations according to the same partitioning policy as above. According to this partitioning policy, each chunk from the new plurality of chunks is associated with a new time range [7, 15]. In this illustration, the chunks stored in the same location have the same space range. For example, both chunks 210a and 210e assigned to location 710a have the space range [A, F], both chunks 210b and 210f assigned to location 710b have the space range [G, L], and so on. The database system could also assign chunks with different time intervals but the same space range to different locations.

Figure 7C:
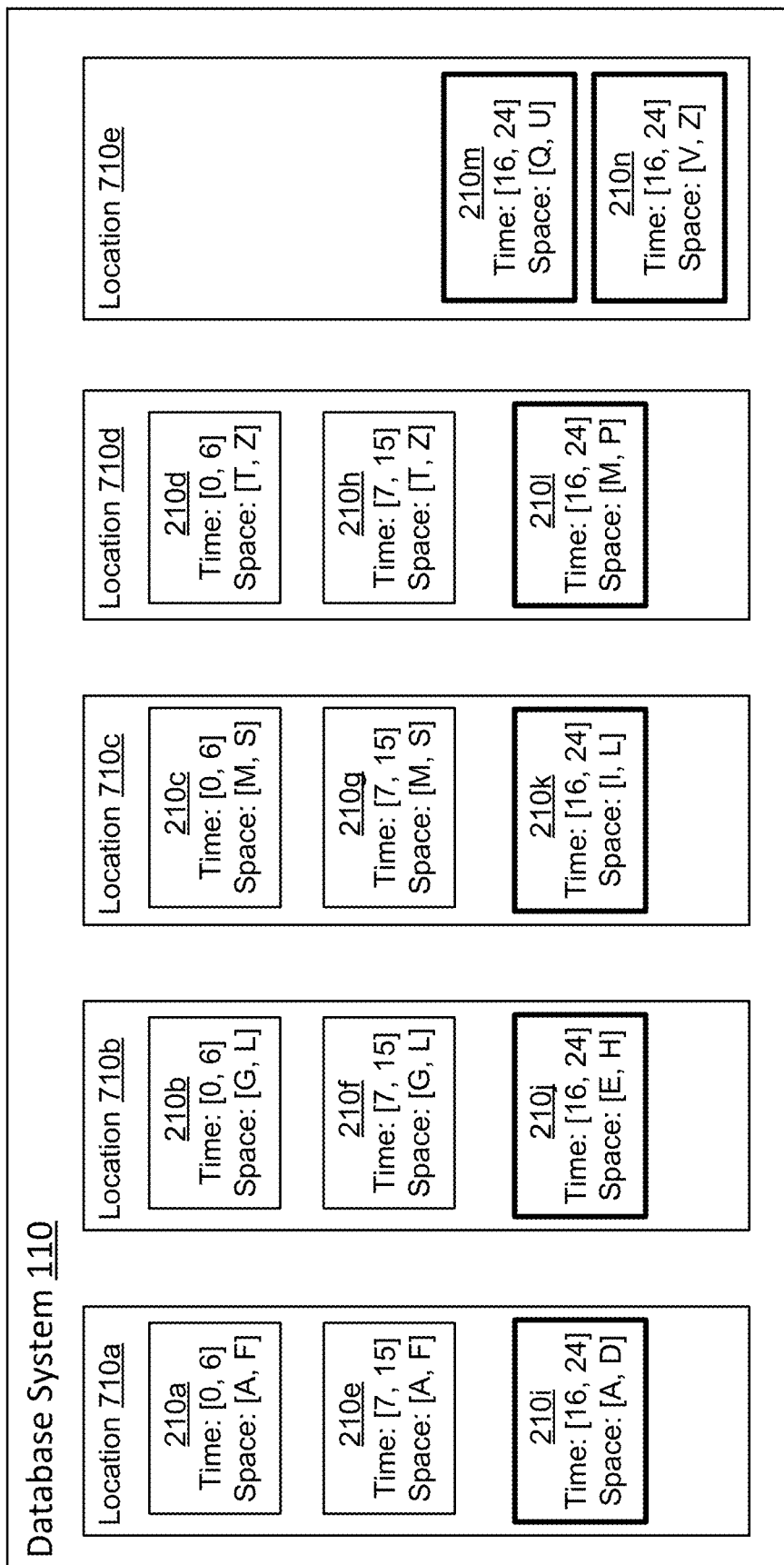

FIG. 7(C) shows the partitioning of the chunks of the database table after a new location 710e is added to the database system 110. As a result, the database system 110 has a plurality of locations that include locations 710a, 710b, 710c, 710d, and 710e. Although FIG. 7 shows a single location being added to the database system, more than one locations may be added to increase the storage capacity of the database system 110. In response to addition of the new location, the database system 110 uses a new partitioning policy to distribute records across the locations. Accordingly, in response to receiving subsequent insert requests, e.g., with values for dimension attributes that do not map to any of the existing chunks, the database system 110 creates a plurality of chunks including 210i, 210j, 210k, 210l, 210m, and 210n. The chunks 210i, 210j, 210k, 210l are mapped to the locations 710a, 710b, 710c, 710d, and chunks 210m and 210n are both mapped to the new location 710e. In other embodiments, the database system may assign more or fewer chunks to the new locations that are added. Accordingly, subsequent records received are distributed according to the new partitioning policy. In the embodiment illustrated in FIG. 7, the database system 110 does not move any data that was stored in the chunks that were created before the new locations were added. However, the chunks that are created responsive to the addition of the new locations are distributed according to a new partitioning policy that balances storage of data across all available locations. In the example, shown in FIG. 7(C), more chunks are assigned to the new location(s) since the storage and computing resources of the new locations are likely to be underutilized compared to the existing locations that have previously stored data. However, over time, as additional data gets stored on the new locations, the utilization gap between the new locations and existing locations reduces without having to move any data from the existing locations to the new locations.

As illustrated in FIG. 7(C), the new partitioning policy creates a plurality of chunks that has more chunks after new locations are added. Accordingly, each space range is smaller in the new partitioning policy compared to the space ranges of the portioning policy used before addition of the new locations.

In another embodiment, the database system assigns a larger fraction of new data to the new locations not by assigning a larger number of chunks to those locations, as shown in FIG. 7(C), but by assigning chunks with dimension ranges that have a larger set of values. For example, rather than having chunk 210m with the space range [Q, U] and chunk 210n with the space range [V, Z], the database system could create a single chunk assigned to location 710e with a space range [Q, Z].

In some embodiments, when the database system 110 detects that new locations are being added to the database system, the database system 110 dynamically changes the partitioning based on the new storage configuration. In other embodiments, the partitioning policy is configured by a user, for example, a database system administrator.

A partitioning policy determines how new chunks are created and assigned to locations for storing them. For example, if a partitioning policy is being enforced and new chunks need to be created (for example, to insert records than cannot be inserted in existing chunks), a plurality of chunks may be created and distributed according to the partitioning policy. The partitioning policy may specify various aspects of creation of new chunks including the number of chunks being created, the configurations of individual chunks being created (the configuration comprising the sets of values of different dimension attributes for each chunk), and the mapping of the chunks to locations.

The partitioning policy may store information specifying various aspects of the chunk creation/distribution as metadata, for example, the mapping from chunks to locations may be stored using a mapping table that explicitly stores locations for each chunk being created. Alternatively, the partitioning policy may specify various aspects of chunk creation/distribution using instructions, for example, the partitioning policy may specify mapping from chunks to locations using a function (or a set of instructions) that determines a location for a chunk given the chunk configuration and potentially other system information as input. Different partitioning policies may specify different mapping functions (or sets of instructions). Alternatively, different partitioning policies may use the same mapping function (or sets of instructions) but pass different parameter values as input. Such mapping functions (or sets of instructions) may include random selection, round-robin selection, hash-based selection, selection based on the number, size, or age of chunks being stored, selection based on the age of when the location was added to the database system, load balancing strategies based on server resources (including insert or query rates, CPU capacity, CPU utilization, memory capacity, free memory, etc.), load balancing strategies based on disk resources (including total disk capacity, unused disk space disk, disk IOPS capacity, disk IOPS use, etc.), and other criteria or algorithmic approaches, as well as some combination thereof. A partitioning policy may use a combination of the above techniques.

In an embodiment, a partitioning policy specifies the size of the plurality of chunks being created. The size of the plurality of chunks may represent the number of chunks in the plurality of chunks being created. Alternatively, the size of the plurality of chunks may represent the aggregate size of chunks in the plurality of chunks being created, where the size of each chunk represents a measure of the amount of data that can potentially be stored in the chunk. The size of a chunk is determined based on the configuration of the chunk comprising the sets of values of the different dimension attributes for records stored in the chunk. For example, the database system may create larger or smaller chunks by specifying larger/smaller ranges (or sets of values) for dimension attributes respectively.

In some embodiments, the database system 110 moves existing data under certain scenarios. For example, the database system may enforce a policy that aligns chunks to specific time intervals. Accordingly, the creation of new chunks at a time based on the time that new locations are added may result in violation of such policy. For example, the database system may enforce a standard that chunks have a time range of 12 hours. However, if the addition of new locations to the database system occurs at 3 hours into a 12-hour time interval, the database system would either not be able to incorporate the new locations for another 9 hours, or would have to maintain some chunks with 3 hours intervals. Thus, in certain scenarios, for example, if the amount of data stored in each chunk that is currently being populated is below a threshold amount, the database system moves or reallocates existing chunks rather than create new ones responsive to addition of new location. Accordingly, the database system moves data of the set of chunks being currently populated with records across a new set of chunks distributed across the new plurality of locations and continues adding records to the new set of chunks.

In another embodiment, the database system delays enforcement of the new partitioning policy based on the new locations added until the time matches well with chunk alignments. This delayed action can be used both when adding new servers, removing servers in a planned manner, or even on server crashes (if the system already replicates chunks between multiple servers for high availability). For example, if the system already has chunks with time ranges that extend until midnight, and the reconfiguration time is at 11 pm, the database system may not create chunks based on the new partitioning policy for 1 hour (e.g., until a record is inserted with a time attribute after midnight), but the reconfiguration will have an effect when a new set of chunks is created. In such a scenario, the existing chunks are not reconfigured and only the new chunks are allocated over the new set of servers. However, the time range of the chunks is the same before and after the addition of the new locations.

Figure 8:
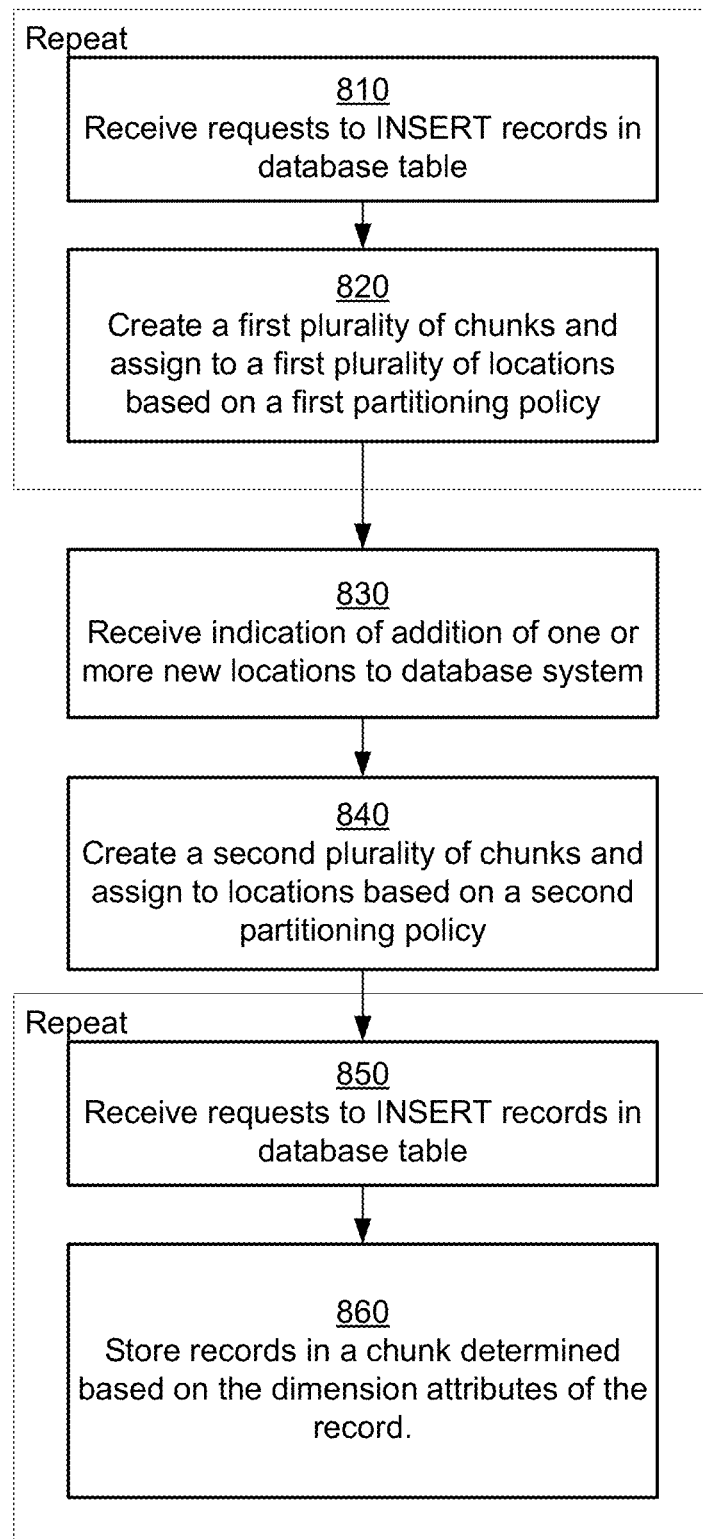
FIG. 8 shows a flowchart illustrating the process of modifying a data partitioning policy of a database system in response to addition of new locations to the database system, in accordance with an embodiment.

FIG. 8 shows a flowchart illustrating the process of modifying a data partitioning policy of a database system in response to the addition of new locations to the database system, in accordance with an embodiment. The database system 110 includes a plurality of locations, referred to as the first plurality of locations. The database system 110 receives 810 requests to insert records in a hypertable. The database system distributes the chunks in accordance with a first partitioning policy P1. Accordingly, the database system 110 creates 820 a plurality of chunks and distributes them across the first plurality of locations. For example, if the database system has 5 locations, the database system 110 may create 20 chunks and store 4 chunks in each location. The database system 110 distributes the chunks based on dimension attributes of the records including at least a time attribute. The partitioning policy specifies various aspects of chunk/creation and distribution including the number of chunks that may be created, the configuration of the chunks, and the mapping of the chunks to locations. The database system may repeat the steps 810 and 820 multiple times, for example, until the database system 110 is reconfigured to change the number of locations.

The database system 110 receives an indication of the addition of one or more new locations. For example, a new location may be a storage device that is added by a system administrator to an existing server of the database system. Alternatively, a new location may be a new server comprising one or more storage devices that is added to the database system for storing as well as processing data. As another example, a location may be storage device of a remote system on which the database system 110 is allowed to store data, for example, a cloud-based storage device. The indication of the addition of one or more new locations that the database system receives may identify a specific storage device that is added to the database system or may identify a server that is added to the database system.

In an embodiment, the database system 110 receives the indication of addition of a location by performing a check of all peripheral devices and servers that can be reached by one or more database system nodes 310. In other embodiments, the database system 110 receives the indication by receiving a message from a new location, by a command executed by a database user or administrator. The addition of the locations to the database system causes the database system 110 to have a second plurality of locations that is more than the number of locations in the first plurality of locations. The indication of addition of the one or more locations is associated with a reconfiguration time, for example, the time that the indication is received or the time when the addition of the one or more new locations was completed.

Subsequent to receiving the indication of the addition of one or more new locations, the database system receives insert requests. The database system 110 creates 840 a second plurality of chunks, for example, if the records in the insert requests received cannot be inserted in existing chunks. The database system 110 creates the second plurality of chunks and assigns them to locations based on a second partitioning policy P2. The second partitioning policy P2 maps the second plurality of chunks to the second plurality of locations, for example, as illustrated in FIG. 7(C). The chunks may be uniformly distributed across the second plurality of locations. Alternatively, the number or partition ranges of chunks assigned to the new locations may be greater than the number or partition ranges of chunks assigned to the existing locations. For example, more chunks from the second plurality of chunks may be assigned to the new locations compared to the existing locations. Alternatively, chunks configured to store more data may be assigned to new locations compared to the existing locations. A chunk C1 may be configured to store more data compared to a chunk C2 by specifying for chunk C1, a set of values for a dimension attribute that has more elements compared to the set of values for the same dimension attribute for chunk C2. For example, the time attribute for chunk C1 may be specified to have a larger time range compared to the time attribute for chunk C2.

The database system 110 subsequently receives 850 requests to insert data in the database table. The database system 110 stores 860 the received records into chunks based on the dimension attributes of the records. The records may be inserted in chunks created either based on the first partitioning policy or the second partitioning policy as further described herein in connection with FIGS. 9-12. The database system 110 identifies a reconfiguration time T associated with the addition of the new locations to the database system.

In an embodiment, the database system inserts records into chunks based on a time attribute of the record. Accordingly, even though a new partitioning policy is defined, the database system may receive insert requests and create chunks based on a previous partitioning policy. For example, the database system may receive some records very late (i.e., the time they are received may be significantly after the values of the records' time attribute), for example, due to delay caused by network or other resources. The database system may create chunks based on an older partitioning policy for storing these records. Accordingly, the database system may enforce multiple partitioning policies at the same time, depending on the data of the records that are received and need to be inserted in a hypertable.

Figure 9:
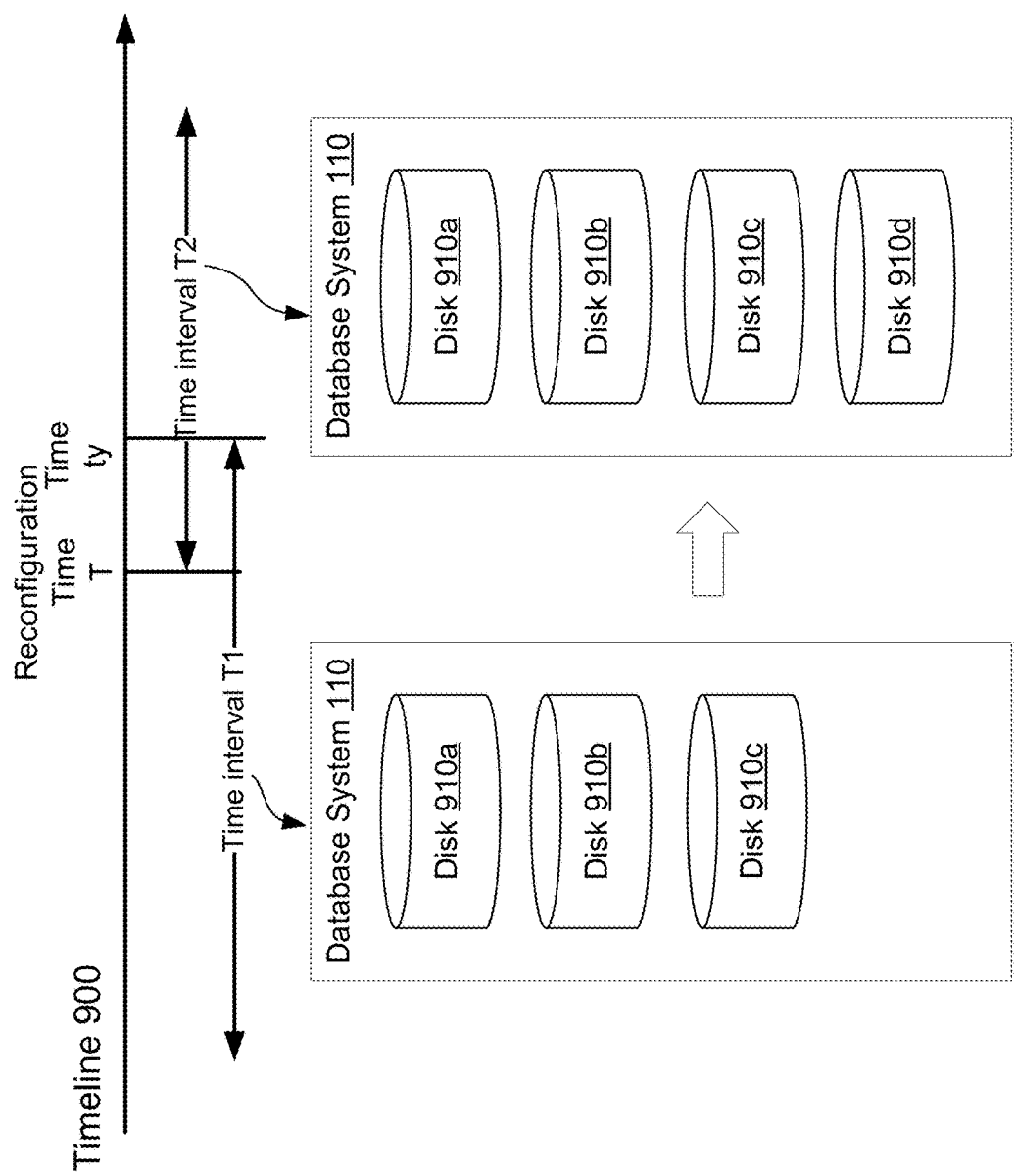
FIG. 9 illustrates selection of partitioning policy for creating chunks based on time attribute of the record, according to an embodiment.

FIG. 9 illustrates selection of partitioning policy for creating chunks based on time attribute of the record, according to an embodiment. Accordingly, independent of the time that the insert request is received, if insert requests are received with records having a time attribute value that is before the reconfiguration time T, any new chunks created for storing the records are created based on the first partitioning policy. FIG. 9 shows a timeline 900 and various events along the time line. For example, the database system initially has three locations (disks) 910*a*, 910*b*, and 910*c* and creates chunks according to partitioning policy P1. At reconfiguration time T, a new location 910*d* is added to the database system 110. However, if insert requests received after reconfiguration time T have time attribute values that are before reconfiguration time T, the database system creates chunks for storing the records (if none of the existing chunks can store the records) according to the first partitioning policy P1. Furthermore, if insert requests received after reconfiguration time T have time attribute values that are after the reconfiguration time T, the database system creates chunks for storing the records (if none of the existing chunks can store the records) according to the second partitioning policy P2. Accordingly, the time interval T1 during which chunks are created according to the first partitioning policy P1 can extend after the reconfiguration time T. Time interval T2 indicates the time during which chunks are created according to the second partitioning policy P2.

Figure 10:
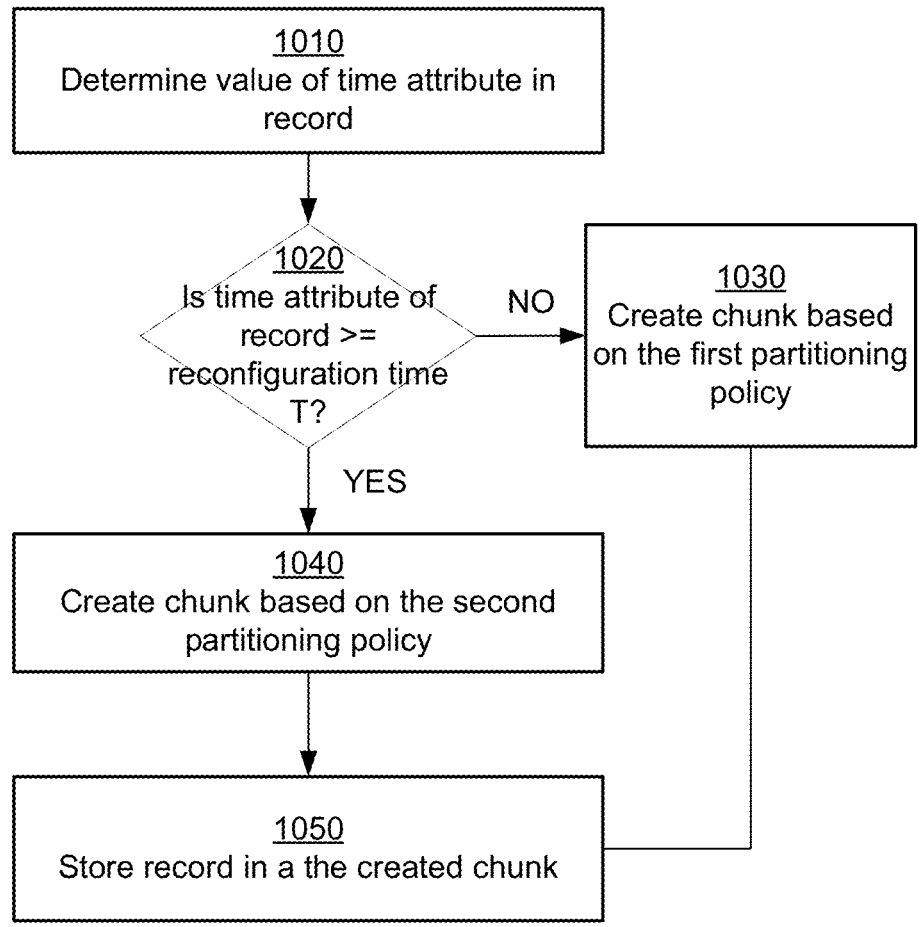
FIG. 10 shows a flowchart of the process for selection of partitioning policy for creating chunks based on time attribute of the record, according to an embodiment.

FIG. 10 shows a flowchart of the process for selection of partitioning policy for creating chunks based on time attribute of the record, according to an embodiment. The database system invokes the procedure shown in FIG. 10 if the database system determines for a record being inserted that the record cannot be stored in any existing chunk and a new chunk needs to be created. The database system 110 determines 1010 the value of the time attribute of a record received for inserting in the database table. The database system 110 compares 1020 the value of the time attribute of the record with the reconfiguration time T. If the database system 110 determines that the time attribute of the record is less than the reconfiguration time T, the database system 110 creates a chunk 1030 based on the first partitioning policy P1. If the database system 110 determines that the time attribute of the record is greater than (or equal to) the reconfiguration time T, the database system 110 creates 1040 a chunk based on the second partitioning policy P2. The record is stored 1050 in the chunk that is created.

Figure 11:
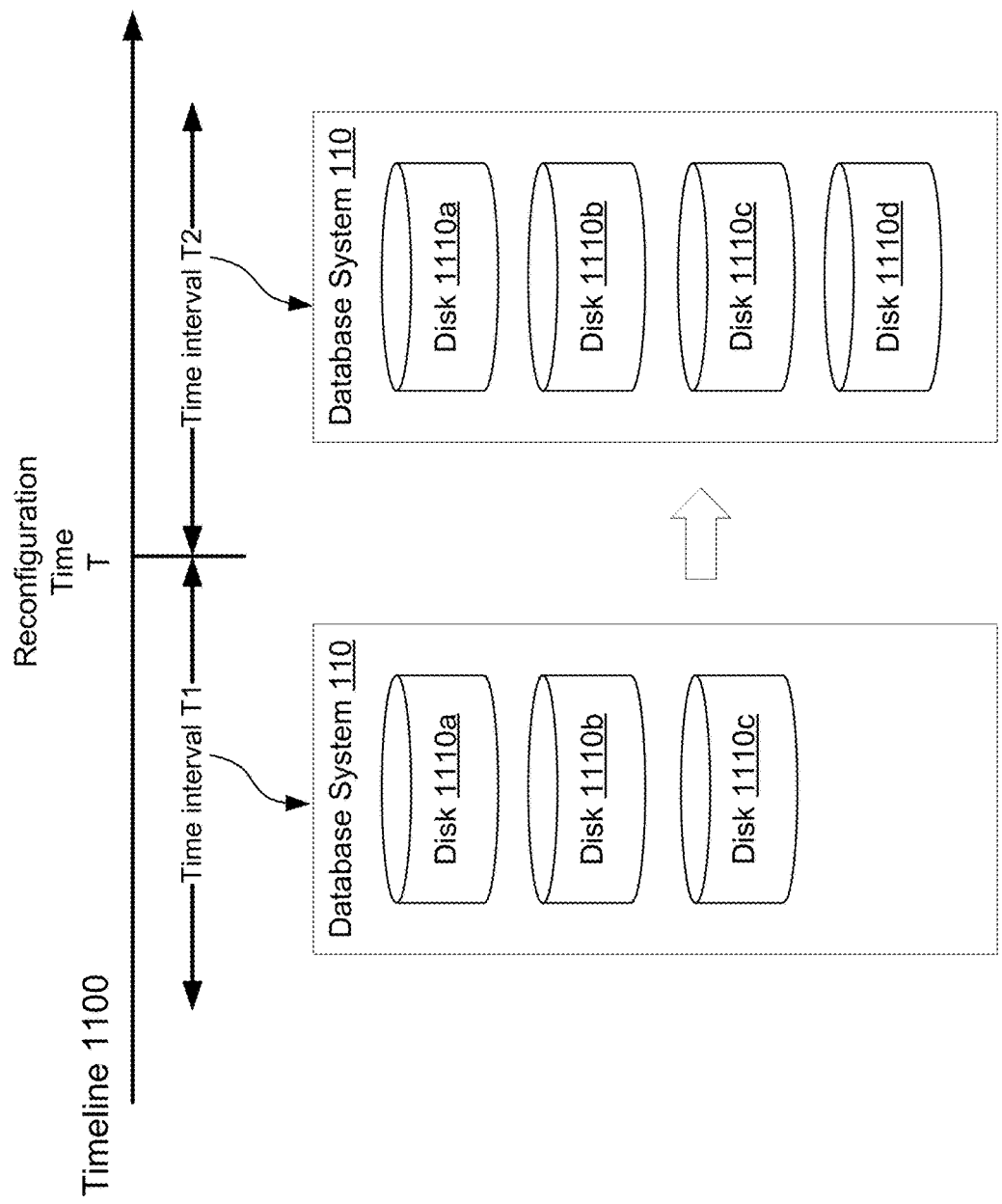
FIG. 11 illustrates selection of partitioning policy for creating chunks based on time of receipt of a record by the database system, according to an embodiment.

FIG. 11 illustrates selection of partitioning policy for creating chunks based on time of receipt of a record by the database system, according to an embodiment. FIG. 11 shows a timeline 1100 and various events along the time line. For example, the database system initially has three locations (disks) 1110*a*, 1110*b*, and 1110*c* and creates chunks according to partitioning policy P1. At reconfiguration time T, a new location 1110*d* is added to the database system 110. The database system selects the partitioning policy for creating chunks based on the time of arrival of the insert request (assuming no existing chunks can be used for storing records that are received for inserting in the hypertable). Accordingly, after reconfiguration time T (i.e., during time interval T2), chunks are created according to the second partitioning policy P2 whereas before reconfiguration time T (i.e., during time interval T1), chunks are created according to the first partitioning policy P1. Accordingly, the partitioning policy selected for creating chunks is selected independently of the value of the time attribute of the records being inserted. For example, if for any reason records having time attribute values that correspond to time occurring before reconfiguration time T arrive late, i.e., after reconfiguration time T, the database system creates chunks according to the second partitioning policy P2 for storing the records. Accordingly, records with time attribute value less than reconfiguration time T can be stored in chunks created according to either partitioning policy P1 or P2.

In some embodiments, the database system continues to insert records into a chunk that was created before reconfiguration time T even if the insert request arrives after reconfiguration time T so long as the time attribute of the record corresponds to the time range for the chunk. In other embodiments, the database system modifies an existing chunk that was created according to the first partitioning policy P1 so as to reduce the time range (if necessary) to correspond to the latest record inserted into the chunk. For example, if the insert request's arrival time is 5:30 am and the chunk's current time range is until noon, the database system identifies the record with the highest value for its time attribute in that chunk. Assuming that the record with the highest time value in that chunk has a time of 5:45 am, the database system modifies the end of the chunk's time range to a time greater than or equal to 5:45 am, for example, 6 am. Subsequently, if the database system receives a record at time greater than 6 am, the database system creates a new chunk according to the new partitioning policy P2 starting at 6 am.

In some embodiments, the database system may create overlapping chunks as a result of reconfiguration of the system. The database system enforces a policy that after reconfiguration of the system, the database system does not insert records in chunks created based on the first partitioning policy P1. As a result, after reconfiguration of the system, the database system creates a new chunk for storing a record based on partitioning policy P2, even if there is an existing chunk created based on policy P1 that maps to the dimension attributes of the record. As a result, a record having a particular dimension attribute could potentially be stored in a chunk C1 created based on the first partitioning policy P1 or in a chunk C2 created based on the second partitioning policy P2. As a result, chunks C1 and C2 are overlapping such that a record could map to both chunks C1 and C2, If the database system subsequently receives queries that process a particular record R, the database system 110 determines whether the record R was stored in a chunk created based on the first partitioning policy P1 or the second partitioning policy P2. Accordingly, the database system 110 may have to check two possible chunks to determine where the record R is stored.

In some embodiments, the database system 110 creates the new chunks that overlap old chunks in terms of the time range used for partitioning the records. As a result, even after creation of a new set of chunks responsive to the addition of new locations, the database system may insert records into old chunks that were created before the addition of the locations. While this may involve the old chunks (from the old view) continuing to see some fraction of new inserts—although this can be mitigated based on the insert policy for overlapping chunks, e.g., one such policy prefers inserting new records to the smaller-sized chunk—this overlap will not continue into future intervals. For example, continuing with the above example, when the database system creates the new chunks 9 hours into the existing chunks' interval, it sets the start and end times for the new chunks to be the same as the existing chunks (i.e., 9 hours ago and 3 hours hence). But, because the database system can employ a policy to write to smaller-sized chunks, for example, inserts will be made to the new chunks rather than the existing ones, even though the two sets have overlapping time periods.

In embodiments of the database system that use a purely size-based approach to determining when to close a chunk, these time interval issues do not arise, and the database system then simply closes the existing chunks (even when their size at the time of system reconfiguration may be smaller than the standard threshold size) and creates new ones using the new partitioning policy.

Because the new view may maintain a different set of partitions, the database system may maintain additional metadata that associates each of these reconfigurations into an "epoch." In particular, each epoch may be associated with various information, including a time period, the set of partitions, and a system view. Then, as described above, in order to determine a hypertable's partitions at a particular time, the database system might need to first determine the epoch associated with the time, then determine the partitions associated with this epoch. This process is described above in the context of an insert method that the database system employs.

Choosing the Region to Convert

The conversion engine needs to choose which regions of the data in the first representation to convert to the second representation. Commonly, this consists of any new regions that have never been previously converted, as well as any regions that need to be re-computed due to changes to those regions.

In many embodiments, the user is able to configure how far behind the conversion engine should operate (e.g., no more or at least one hour behind the latest record or the current time), which we sometimes refer to as the conversion target threshold. This conversion target threshold may be a hard limit of some sort, or it may be a soft target in terms of time or amount of change. The conversion engine interacts with these configurations to determine how often it should compute conversions, how big each conversion job should be (e.g., the range of records that one job processes), and so forth.

In some embodiments, the conversion engine reads information in the change log or in change metadata in order to know which regions of data to re-computer in its current run. For embodiments that store a single conversion completion threshold, the conversion engine recomputes its conversion on data between the completion threshold and the current time (or conversion target threshold if present), although in some embodiments conversion may start at a region before or near the completion threshold for certain types of computations. For embodiments that store a range for changes, the conversion engine recomputes data between (or near) the range specified by the change information.

In embodiments that have multiple ranges of data in the first representation, the materialization engine can operate in several different manners. It can compute individual ranges separately, or as a larger operation or transaction. It can combine consecutive ranges into larger ranges, which it can subsequently process. It can also split overly large ranges into smaller ranges for separate processing.

The conversion engine may choose to operate in such manner in order to optimize for load balancing; cost reasons; disk, CPU, or memory utilization; state or resource management; latency or throughput optimizations; or other reasons.

The Conversion Engine

In some embodiments, the conversion engine runs in the same process or database system as the data on which it operates is stored. In other embodiments, the conversion engine runs in a process or database system separate from the database process where the data on which it operates is stored. Such processes connect to the database to perform necessary tasks, such as its calculations and the DML operations affecting the converted output. In some similar embodiments the conversion engine consumes changes to the table storing data in the first representation using a replication protocol exposed by the database, then proceeds to connect to the database to write its converted data in the second representation and remove corresponding data stored in the first representation (on a timer or after some amount of data has been consumed, for instance). This is performed in continuous streaming fashion or in batches.

In other embodiments, the conversion engine runs on a local machine and only converts data to the same node, whereas in others the conversion engine may convert data by acting through the normal data modification path exposed by the cluster (some combination of these two strategies may also be used in clustered environments).

When the conversion policy specifies that multiple different compression algorithms or settings should be employed for different regions of the data, the same conversion engine may process the different regions of the data on which different algorithms or settings are employed, or the database system may launch separate instances of the conversion engine or other type of job to process each region.

In some embodiments, the conversion engine is comprised of several subcomponents that perform specific functions, such as a range selection components, a data conversion component (to aggregate many rows of data stored in the first representation to the columnar form of the second representation), an analytics component (that maintains statistics or metadata about the compressed data to help with planner, indexing, aggregate queries, or other information), a compression component, and a transactional control component (which properly controls interaction with the rest of the database and particularly to ensure that operations are done properly during the period where conversions are being performed), or some combination or subset thereof.

Replica Management

In some embodiments, the database system is distributed across multiple physical machines (which we also refer to as nodes). In such cases, the data stored in the first and second representations can be distributed in multiple ways among different nodes and disks. The query processor can communicate with different nodes in the system to read data stored in different representations (or replicas thereof).

In an embodiment where a table is partitioned across multiple nodes (e.g., as in a hypertable), each partition of the table storing data in the second representation can be colocated with the table partition on which it is converted from the first representation, or it can be on a different node. A non-partitioned table for data in the first representation can also be used with a partitioned table for data in the second representation, or vice versa. One of ordinary skill will recognize that there are multiple ways to lay out a table or tables for data in the first and second representations across the nodes belonging to the database system, when the tables are either partitioned or not.

In some embodiments, the conversion of data from the first representation to the second representation is computed once at some node in the system and then replicated to other nodes. This replication can be performed by replicating the entire database running on that node to other nodes (e.g., via streaming replication), or it can be performed by replicating only converted rows, segments, chunks, or tables to other nodes (e.g., via logical table replication or operation-level replication). Data in the second representation may be replicated a different number of times than data stored in the first representation and to different nodes.

In some embodiments, the data once converted to the second representation is not re-replicated at all though explicit replication protocols, but computed locally on the nodes that have the data in the first representation (which may be multiple given that data in the first representation may be replicated when initially inserted into the database system). In this case, the data in the second representation can be stored on the same node as the data in the first representation it was converted from, or it may be shipped to another node after conversion. In an embodiment, each node may independently determine when to schedule conversions and other potentially costly operations. In such an embodiment, if one node faces high load, it can avoid writing until later; correspondingly, if it is low on available storage capacity, it might perform this conversion sooner (and even employ different compression algorithms or settings based on its needs). It is also possible for the node performing the conversion to be different than the one storing the data in the first and/or second representations.

In some embodiments, one database node can also coordinate the conversion of data from the first to second representations on one or more other database nodes. For example, in an embodiment, this node act to schedule when the conversion engine will convert data on a different node in the database system. In another embodiment, the database node can ensure that nearby regions of data stored on different nodes are converted at similar times. For example, in a configuration of a database system where a hypertable stores a different space partitions corresponding to similar time intervals on different nodes, then such coordination can ensure that rows having nearby timestamps are converted from the first representation to the second representation across multiple nodes at a similar time.

If a table is replicated, whether storing data in the first and/or second representation, each replica may have different properties or characteristics, such as different types or numbers of indexes, different orderings of data on disk (e.g., by a clustered index), different compression algorithms used, different grouping or ordering columns used when converting from the first to the second representation, different compression parameters, different table structures, different structure conversions used, different settings/parameters used when converting from the first to the second representation, different storage formats, storage layouts, types of disks, types of compression, and so forth. The query processor can use these differences to derive more optimal execution plans when selecting being replicas to execute the query.

In embodiments in which data is uncompressed to perform data modifications, in some embodiments the modifications are performed first on one replica and, for instance, tested for any modifications which may violate unique constraints or other properties, and then the modifications are performed on other replicas. In some embodiments, certain nodes store representations which are more amenable to modifications than others and the query processor chooses how to execute modifications to efficiently take advantage of different representations' strengths when doing data modification (e.g., first attempt to perform modifications on replicas storing data in the first representation, so that modifications are only performed on replicas storing data in the second representation if the first succeeds).

Architecture of Computer for a Database System

Figure 13:
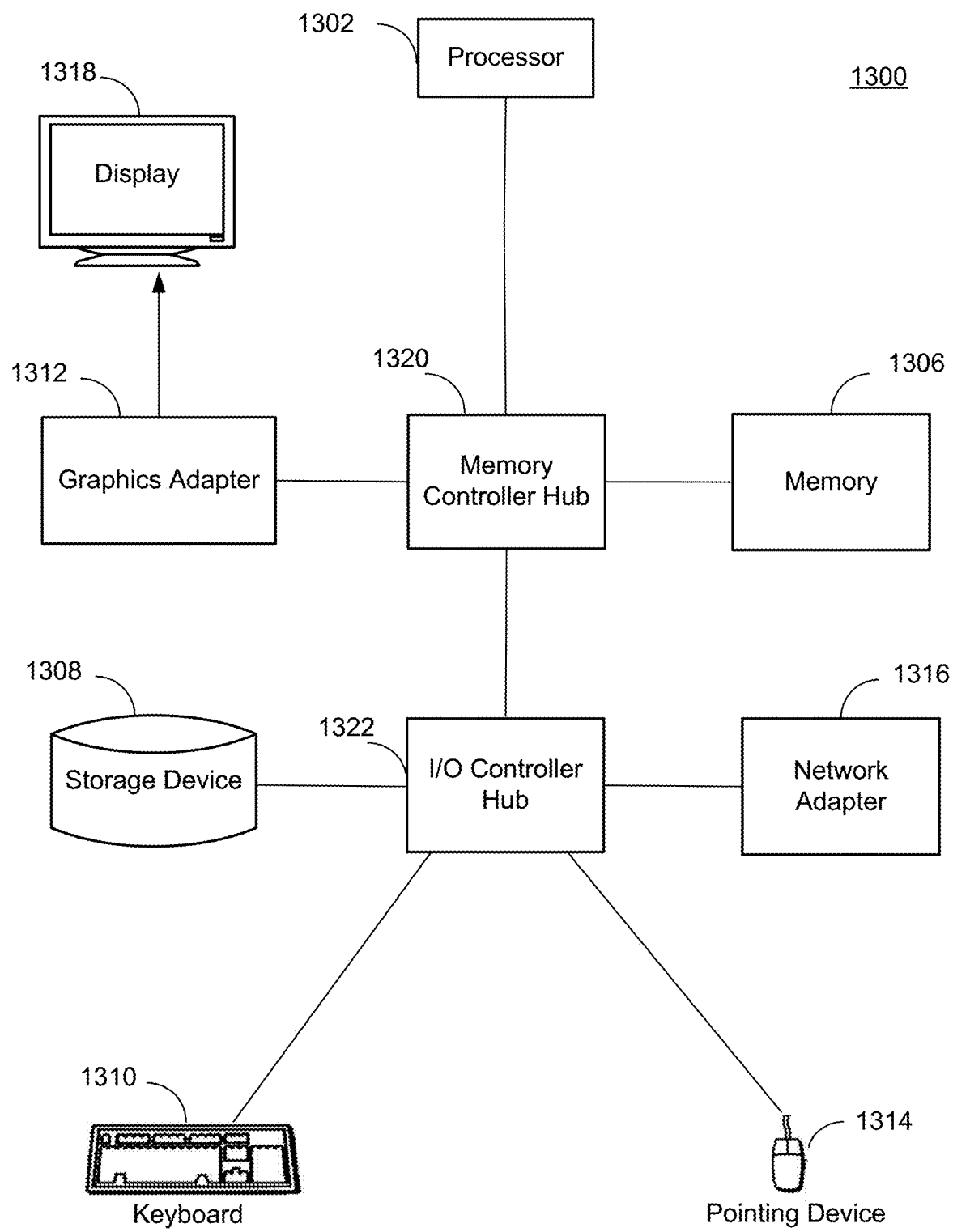
FIG. 13 shows an architecture of a computer that may be used for implementing a database system node, in accordance with an embodiment.

FIG. 13 is a high-level block diagram illustrating an example of a computer 1300 for use as one or more of the entities illustrated in FIG. 1, according to one embodiment. Illustrated are at least one processor 1302 coupled to a memory controller hub 1320, which is also coupled to an input/output (I/O) controller hub 1322. A memory 1306 and a graphics adapter 1312 are coupled to the memory controller hub 1322, and a display device 1318 is coupled to the graphics adapter 1312. A storage device 1308, keyboard 1310, pointing device 1314, and network adapter 1316 are coupled to the I/O controller hub. The storage device may represent a network-attached disk, local and remote RAID, or a SAN (storage area network). A storage device 1308, keyboard 1310, pointing device 1314, and network adapter 1316 are coupled to the I/O controller hub 1322. Other embodiments of the computer 1300 have different architectures. For example, the memory is directly coupled to the processor in some embodiments, and there are multiple different levels of memory coupled to different components in other embodiments. Some embodiments also include multiple processors that are coupled to each other or via a memory controller hub.

The storage device 1308 includes one or more non-transitory computer-readable storage media such as one or more hard drives, compact disk read-only memory (CD-ROM), DVD, or one or more solid-state memory devices. The memory holds instructions and data used by the processor 1302. The pointing device 1314 is used in combination with the keyboard to input data into the computer 1300. The graphics adapter 1312 displays images and other information on the display device 1318. In some embodiments, the display device includes a touch screen capability for receiving user input and selections. One or more network adapters 1316 couple the computer 1300 to a network. Some embodiments of the computer have different and/or other components than those shown in FIG. 13. For example, the database system can be comprised of one or more servers that lack a display device, keyboard, pointing device, and other components, while a client device acting as a requester can be a server, a workstation, a notebook or desktop computer, a tablet computer, an embedded device, or a handheld device or mobile phone, or another type of computing device. The requester to the database system also can be another process or program on the same computer on which the database system operates.

The computer 1300 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device, loaded into the memory, and executed by the processor.

ADDITIONAL CONSIDERATIONS

In time-series workloads, writes are typically made to recent time intervals, rather than distributed across many old ones. This allows the database system 110 to efficiently write batch inserts to a small number of tables as opposed to performing many small writes across one giant table. Further, the database systems' clustered architecture also takes advantage of time-series workloads to recent time intervals, in order to parallelize writes across many servers and/or disks to further support high data ingest rates. These approaches improve performance when employed on various storage technologies, including in-memory storage, hard drives (HDDs), or solid-state drives (SSDs).

Because chunks are right-sized to servers, and thus the database system does not build massive single tables, the database system avoids or reduces swapping its indexes to disks for recent time intervals (where most writes typically occur). This occurs because the database system maintains indexes local to each chunk; when inserting new records into a chunk, only that chunks' (smaller) indexes need to be updated, rather than a giant index built across all the hypertable's data. Thus, for chunks associated with recent time intervals that are regularly accessed, particularly if the chunks are sized purposefully, the chunks' indexes can be maintained in memory. Yet the database system can still efficiently support many different types of indexes on different types of columns (e.g., based on what is supported by each node's database engine, such as PostgreSQL), including B-tree, B+-tree, GIN, GiST, SP-GiST, BRIN, Hash, LSM Tree, fractal trees, and other types of indexes.

The database system combines the transparent partitioning of its hypertable abstraction with a number of query optimizations. These optimizations include those which serve to minimize the number and set of chunks that must be contacted to satisfy a query, to reduce the amount of records that are transferred back from a query that touches a chunk, to specify whether raw records or aggregates results are transferred back from a chunk, and so forth.

Common queries to time-series data include (i) slicing across time for a given object (e.g., device id), slicing across many objects for a given time interval, or (iii) querying the last reported data records across (a subset of) all objects or some other distinct object label. While users perform these queries as if interacting with a single hypertable, the database system leverages internally-managed metadata to only query those chunks that may possibly satisfy the query predicate. By aggressively pruning many chunks and servers to contact in its query plan—or during execution, when the system may have additional information—the database system improves both query latency and throughput.

Similarly, for items like unique devices, users, or locations, the database system may receive queries like "select the last K readings for every device." While this query can be natively expressed in SQL using a "SELECT DISTINCT" query (for finding the first or last single value per distinct item) or via windowing functions (for finding K such values), such a query can turn into a full table scan in many relational databases. In fact, this full table scan could continue back to the beginning of time to capture "for every device", or otherwise either sacrifice completeness with some arbitrarily-specified time range or involve a large WHERE clause or JOIN against some set of devices of interest (which may be maintained in a manual or automated fashion).

In some embodiments, the database system maintains additional metadata about a hypertable's fields in order to optimize such queries. For example, the database system records information about every distinct (different) value for that field in the database (e.g., the latest row, chunk, or time interval to which it belongs). The database system uses this metadata along with its other optimizations, so that such queries for distinct items avoid touching unnecessary chunks, and perform efficiently-indexed queries on each individual chunk. The decision to maintain such metadata might be made manually or via automated means for a variety of reasons, including based on a field's type, the cardinality of the field's distinct items, query and workload patterns, and so forth.

The database system may perform other query optimizations that benefit both single-node and clustered deployments. When joining data from multiple tables (either locally or across the network, e.g., via foreign data wrappers), traditional databases may first select all data matching the query predicate, optionally ORDER the data, then perform the requested LIMIT. Instead, the database system 110 first performs the query and post-processing (e.g., ORDER and LIMIT) on each chunk, and only then merges the resulting set from each chunk (after which it performs a final ordering and limit).

The database system 110 uses LIMIT pushdown for non-aggregate queries to minimize copying data across the network or reading unnecessary data from tables. The database system also pushes down aggregations for many common functions (e.g., SUM, AVG, MIN, MAX, COUNT) to the servers on which the chunks reside. Primarily a benefit for clustered deployments, this distributed query optimization greatly minimizes network transfers by performing large rollups or GROUP_BYs in situ on the chunks' servers, so that only the computed results need to be joined towards the end of the query, rather than raw data from each chunk. In particular, each node in the database system performs its own partial aggregation, and then only return that result to the requesting node.

For example, if the query to the database system requests some MAX (maximum value), then the first node processing the hypertable query sends MAX queries to other nodes; each receiving node performs the MAX on its own local chunks before sending the result back to the first node. This first node computes the MAX of these local maximum values, and returns this result. Similarly, if the hypertable query asks for the AVG (average), then the first node sends queries to other servers that ask for the sum and count of some set of rows. These nodes can return their sums and counts to the first node, which then computes the total average from these values (by dividing the sum of sums by the sum of counts).

The database system computes joins between hypertables and standard relational tables. These standard tables can be stored either directly in the database system or accessed from external databases, e.g., via foreign data wrappers. These joins can be between one or more tables in the first or second representations, or involve tables with a combination of both representations.

The database system 110 performs joins between two hypertables, including in a number of ways involving distributed optimizations, e.g., distributed joins. Such optimizations include those using hash-based partitioning, as well as those that carefully minimize data copying by only sending data from one hypertable's chunks to the servers with the other's chunks according to the join being performed, optionally leveraging the metadata associated with the chunk. Such optimizations also include placing the chunks of hypertables that will be regularly joined on servers in a way that like keys or key ranges are commonly collocated on the same server, to minimize sending data over the network during joins.

The database system allows for easily defining data retention policies based on time. For example, administrators or users can use explicit commands or configure the system to cleanup/erase data more than X weeks old. The system's chunking also helps make such retention policies more efficient, as the database system then just drops entire chunks (internal data tables) that are expired, as opposed to needing to delete individual rows and aggressively vacuum the resulting tables, although the database system does support such row-based deletions. These retention policies can be used to delete data or chunks stored in the first or second representation.

For efficiency, the database system enforces such data retention policies lazily. That is, individual records that are older than the expiry period might not be immediately deleted, depending upon policy or configuration. Rather, when all data in a chunk becomes expired, then the entire chunk is dropped. Alternatively, the database system uses a hybrid of dropping chunks and deleting individual rows when performing data deletions or adhering to data retention policies.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention.

We claim:

1. A computer-implemented method comprising:
   creating, by a database system, a first table, wherein the first table stores a set of records, wherein each record has values of a first plurality of attributes, the first plurality of attributes including a first attribute and a second attribute, wherein the database system implements a plurality of compression policies;
   creating, by the database system, a second table associated with the first table, wherein the second table stores a set of records, wherein each record has values of a second plurality of attributes; and
   for each iteration from one or more iterations:
      selecting a first set of records from the first table, each record having values of the first plurality of attributes;
      selecting a first set of values comprising the value of the first attribute from each record of the first set of records, and selecting a second set of values comprising the value of the second attribute from each record of the first set of records;

selecting a first compression policy from the plurality of compression policies to apply to the first set of values, and selecting a second compression policy from the plurality of compression policies to apply to the second set of values;

computing a first derived value by compressing the first set of values according to the first compression policy, and computing a second derived value by compressing the second set of values according to the second compression policy;

computing a derived record having values of the second plurality of attributes, the values including the first derived value and the second derived value;

updating the second table by storing the derived record in the second table; and updating the first table by removing the first set of records from the first table.

2. The computer-implemented method of claim 1, wherein the first table and second table are both child tables of a parent table in the database system.

3. The computer-implemented method of claim 2, wherein the parent table is a hypertable and the first table and second table are both chunks of the hypertable, the first and second plurality of attributes including a time attribute, such that, for each record stored in a chunk of the hypertable, the value of the time attribute of the record maps to a value from the set of values for that time attribute as specified by the chunk.

4. The computer-implemented method of claim 1, wherein the first table or second table are hypertables in the database system, and each record in the hypertables having a plurality of attributes including a set of dimension attributes, the set of dimension attributes including the first time attribute, wherein the hypertable is partitioned into a plurality of chunks along the set of dimension attributes, each chunk associated with a set of values corresponding to each dimension attribute, such that, for each record stored in the chunk, and for each dimension attribute of the record, the value of the dimension attribute of the record maps to the set of values for that dimension attribute as specified by the chunk.

5. The computer-implemented method of claim 1, further comprising executing a plurality of iterations concurrently or in parallel.

6. The computer-implemented method of claim 1, wherein both the first table and the second table are stored in row-based form in the database system.

7. The computer-implemented method of claim 1, wherein the compression policies specify a compression scheme to apply to the set of values, wherein the plurality of compression policies correspond to a plurality of compression schemes.

8. The computer-implemented method of claim 7, wherein the plurality of compression schemes comprises one or more of LZ, DEFLATE, LZW, PPM, Huffman, Sequitur, Burrows-Wheeler, gzip, bzip, Snappy, Simple-8b, Gorilla, FastPFOR, run-length encoding, delta run-length encoding, or delta of deltas encoding, or a combination of the aforementioned.

9. The computer-implemented method of claim 1, wherein the compression policies include the settings of a particular compression scheme to apply to the set of values.

10. The computer-implemented method of claim 1, wherein selecting the first or second compression policy from the plurality of compression policies is at least partially based on factors comprising one or more of: (1) the set of values to be compressed, (2) the data type of the values of the set of values, (3) the attribute of the set of values, (4) the derived value computed from the set of values, (5) the data type of the derived value, or (6) the attribute of the derived value.

11. The computer-implement method of claim 10, wherein the data type of the values of the set of values is a timestamp, date, integer, float, double, bigint, numeric, string, text, binary, boolean, geo-spatial, xml, blob, json, or binary json data.

12. A computer-implemented method comprising:

creating, by a database system, a first table, wherein the first table stores a set of records, wherein each record has values of a first plurality of attributes, the first plurality of attributes including a first attribute, wherein the database system implements a plurality of compression policies;

creating, by the database system, a second table associated with the first table, wherein the second table stores a set of records, wherein each record has values of a second plurality of attributes; and for each iteration from one or more iterations:

selecting a first set of records from the first table, each record having values of the first plurality of attributes;

selecting a first set of values comprising the value from each record of the first set of records having the first attribute;

selecting a first compression policy from the plurality of compression policies to apply to the first set of values at least partially based on the first set of values or the first attribute;

computing a first derived value by compressing the first set of values according to the first compression policy;

computing a derived record having values of the second plurality of attributes, the values including the first derived value;

updating the second table by storing the derived record in the second table; and updating the first table by removing the first set of records from the first table.

13. The computer-implemented method of claim 12, wherein the first table or second table are hypertables in the database system, and each record in the hypertables having a plurality of attributes including a set of dimension attributes, the set of dimension attributes including the first time attribute, wherein the hypertable is partitioned into a plurality of chunks along the set of dimension attributes, each chunk associated with a set of values corresponding to each dimension attribute, such that, for each record stored in the chunk, and for each dimension attribute of the record, the value of the dimension attribute of the record maps to the set of values for that dimension attribute as specified by the chunk.

14. The computer-implemented method of claim 12, wherein both the first table and the second table are stored in row-based form in the database system.

15. The computer-implemented method of claim 12, wherein the compression policies specify a compression scheme to apply to the set of values, wherein the plurality of compression policies correspond to a plurality of compression schemes.

16. The computer-implemented method of claim 12, wherein selecting the first compression policy from the plurality of the compression schemes is at least partially based on factors comprising one or more of: (1) the set of values to be compressed, (2) the data type of the values of the set of values, (3) the attribute of the set of values, (4) the derived value computed from the set of values, (5) the data type of the derived value, or (6) the attribute of the derived value.

17. A non-transitory computer readable storage medium storing instructions that when executed by a computer processor, cause the computer processor to perform steps comprising:
creating, by a database system, a first table, wherein the first table stores a set of records, wherein each record has values of a first plurality of attributes, the first plurality of attributes including a first attribute and a second attribute, wherein the database system implements a plurality of compression policies;
creating, by the database system, a second table associated with the first table, wherein the second table stores a set of records, wherein each record has values of a second plurality of attributes; and
for each iteration from one or more iterations:
selecting a first set of records from the first table, each record having values of the first plurality of attributes;
selecting a first set of values comprising the value of the first attribute from each record of the first set of records, and selecting a second set of values comprising the value of the second attribute from each record of the first set of records;
selecting a first compression policy from the plurality of compression policies to apply to the first set of values, and selecting a second compression policy from the plurality of compression policies to apply to the second set of values;
computing a first derived value by compressing the first set of values according to the first compression policy, and computing a second derived value by compressing the second set of values according to the second compression policy;
computing a derived record having values of the second plurality of attributes, the values including the first derived value and the second derived value;
updating the second table by storing the derived record in the second table; and
updating the first table by removing the first set of records from the first table.

18. The non-transitory computer readable storage medium of claim 17, wherein the first table or second table are hypertables in the database system, and each record in the hypertables having a plurality of attributes including a set of dimension attributes, the set of dimension attributes including the first time attribute, wherein the hypertable is partitioned into a plurality of chunks along the set of dimension attributes, each chunk associated with a set of values corresponding to each dimension attribute, such that, for each record stored in the chunk, and for each dimension attribute of the record, the value of the dimension attribute of the record maps to the set of values for that dimension attribute as specified by the chunk.

19. The non-transitory computer readable storage medium of claim 17, wherein both the first table and the second table are stored in row-based form in the database system.

20. The non-transitory computer readable storage medium of claim 17, wherein the compression policies specify a compression scheme to apply to the set of values, wherein the plurality of compression policies correspond to a plurality of compression schemes.

21. The non-transitory computer readable storage medium of claim 20, wherein the plurality of compression schemes comprises one or more of LZ, DEFLATE, LZW, PPM, Huffman, Sequitur, Burrows-Wheeler, gzip, bzip, Snappy, Simple-8b, Gorilla, FastPFOR, run-length encoding, delta run-length encoding, or delta of deltas encoding, or a combination of the aforementioned.

22. The non-transitory computer readable storage medium of claim 17, wherein selecting the first or second compression policy from the plurality of compression policies is at least partially based on factors comprising one or more of: (1) the set of values to be compressed, (2) the data type of the values of the set of values, (3) the attribute of the set of values, (4) the derived value computed from the set of values, (5) the data type of the derived value, or (6) the attribute of the derived value.

23. The computer-implement method of claim 22, wherein the data type of the values of the set of values is a timestamp, date, integer, float, double, bigint, numeric, string, text, binary, boolean, geo-spatial, xml, blob, json, or binary json data.

24. A computer system comprising:
a computer processor; and
a non-transitory computer readable storage medium storing instructions that when executed by the computer processor, cause the computer processor to perform steps comprising:
creating, by a database system, a first table, wherein the first table stores a set of records, wherein each record has values of a first plurality of attributes, the first plurality of attributes including a first attribute and a second attribute, wherein the database system implements a plurality of compression policies;
creating, by the database system, a second table associated with the first table, wherein the second table stores a set of records, wherein each record has values of a second plurality of attributes; and
for each iteration from one or more iterations:
selecting a first set of records from the first table, each record having values of the first plurality of attributes;
selecting a first set of values comprising the value of the first attribute from each record of the first set of records, and selecting a second set of values comprising the value of the second attribute from each record of the first set of records;
selecting a first compression policy from the plurality of compression policies to apply to the first set of values, and selecting a second compression policy from the plurality of compression policies to apply to the second set of values;
computing a first derived value by compressing the first set of values according to the first compression policy, and computing a second derived value by compressing the second set of values according to the second compression policy;
computing a derived record having values of the second plurality of attributes, the values including the first derived value and the second derived value;
updating the second table by storing the derived record in the second table; and
updating the first table by removing the first set of records from the first table.

25. The computer system of claim 24, wherein the first table or second table are hypertables in the database system, and each record in the hypertables having a plurality of attributes including a set of dimension attributes, the set of dimension attributes including the first time attribute, wherein the hypertable is partitioned into a plurality of chunks along the set of dimension attributes, each chunk associated with a set of values corresponding to each dimension attribute, such that, for each record stored in the chunk, and for each dimension attribute of the record, the value of the dimension attribute of the record maps to the set of values for that dimension attribute as specified by the chunk.

26. The computer system of claim 24, wherein both the first table and the second table are stored in row-based form in the database system.

27. The computer system of claim 24, wherein the compression policies specify a compression scheme to apply to the set of values, wherein the plurality of compression policies correspond to a plurality of compression schemes.

28. The computer system of claim 27, wherein the plurality of compression schemes comprises one or more of LZ, DEFLATE, LZW, PPM, Huffman, Sequitur, Burrows-Wheeler, gzip, bzip, Snappy, Simple-8b, Gorilla, FastPFOR, run-length encoding, delta run-length encoding, or delta of deltas encoding, or a combination of the aforementioned.

29. The computer system of claim 24, wherein selecting the first or second compression policy from the plurality of compression policies is at least partially based on factors comprising one or more of: (1) the set of values to be compressed, (2) the data type of the values of the set of values, (3) the attribute of the set of values, (4) the derived value computed from the set of values, (5) the data type of the derived value, or (6) the attribute of the derived value.

30. The computer system of claim 29, wherein the data type of the values of the set of values is a timestamp, date, integer, float, double, bigint, numeric, string, text, binary, boolean, geo-spatial, xml, blob, json, or binary json data.

* * * * *